United States Patent
Williams et al.

(10) Patent No.: US 8,030,731 B2
(45) Date of Patent: Oct. 4, 2011

(54) ISOLATED RECTIFIER DIODE

(75) Inventors: Richard K. Williams, Cupertino, CA (US); Donald Ray Disney, Cupertino, CA (US); Wai Tien Chan, Hong Kong (CN)

(73) Assignees: Advanced Analogic Technologies, Inc., Santa Clara, CA (US); Advanced Analogic Technologies (Hong Kong) Limited, Hong Kong (CN)

(*) Notice: Subject to any disclaimer, the term of this patent is extended or adjusted under 35 U.S.C. 154(b) by 718 days.

(21) Appl. No.: 12/002,344

(22) Filed: Dec. 17, 2007

(65) Prior Publication Data

US 2008/0237782 A1    Oct. 2, 2008

Related U.S. Application Data

(60) Provisional application No. 60/920,488, filed on Mar. 28, 2007.

(51) Int. Cl.
*H01L 21/76* (2006.01)

(52) U.S. Cl. ........ 257/510; 257/501; 257/504; 257/506; 257/508; 257/509; 257/499; 257/511; 257/513; 257/555; 257/558; 257/E21.54; 257/E21.544; 257/E21.545; 257/E21.558; 257/E21.564; 257/E21.628; 257/E27.019; 257/E27.023; 257/E29.02; 257/E29.175

(58) Field of Classification Search ........... 257/504, 257/510, E27.019, E27.023, E29.02, E29.175
See application file for complete search history.

(56) References Cited

U.S. PATENT DOCUMENTS

| | | | |
|---|---|---|---|
| 4,269,636 A | 5/1981 | Rivoli et al. | 438/359 |
| 4,454,647 A | 6/1984 | Joy et al. | 29/576 |
| 4,478,655 A | 10/1984 | Nagakubo et al. | 148/175 |
| 4,642,883 A | 2/1987 | Sakurai et al. | 438/362 |
| 4,655,875 A | 4/1987 | Wada et al. | 438/514 |
| 4,819,052 A | 4/1989 | Hutter | 257/378 |
| 4,980,747 A | 12/1990 | Hutter et al. | 357/50 |
| 5,324,973 A | 6/1994 | Sivan | 257/330 |
| 5,374,569 A | 12/1994 | Yilmaz et al. | 437/34 |
| 5,386,136 A | 1/1995 | Williams et al. | 257/409 |
| 5,410,175 A | 4/1995 | Kyomasu et al. | 257/458 |
| 5,420,061 A | 5/1995 | Manning | 438/218 |
| 5,485,027 A | 1/1996 | Williams et al. | 257/343 |
| 5,506,431 A | 4/1996 | Thomas | 365/185.15 |
| 5,525,824 A | 6/1996 | Himi et al. | 257/370 |
| 5,557,135 A | 9/1996 | Hashimoto | 257/308 |
| 5,668,397 A | 9/1997 | Davis et al. | 257/520 |
| 5,684,305 A | 11/1997 | Pearce | 257/48 |
| 5,807,783 A | 9/1998 | Gaul et al. | 438/406 |
| 5,883,413 A | 3/1999 | Ludikhuize | 257/343 |

(Continued)

FOREIGN PATENT DOCUMENTS

EP        0 589 675 A2    3/1994

(Continued)

*Primary Examiner* — Minh-Loan T Tran
*Assistant Examiner* — Fei Fei Yeung Lopez
(74) *Attorney, Agent, or Firm* — Patentability Associates

(57) ABSTRACT

An isolated diode comprises a floor isolation region, a dielectric-filled trench and a sidewall region extending from a bottom of the trench at least to the floor isolation region. The floor isolation region, dielectric-filled trench and a sidewall region are comprised in one terminal (anode or cathode) of the diode and together form an isolated pocket in which the other terminal of the diode is formed. In one embodiment the terminals of the diode are separated by a second dielectric-filled trench and sidewall region.

23 Claims, 41 Drawing Sheets

U.S. PATENT DOCUMENTS

| | | | | |
|---|---|---|---|---|
| 5,892,264 | A | 4/1999 | Davis et al. | 257/511 |
| 5,914,523 | A | 6/1999 | Bashir et al. | 257/520 |
| 5,986,863 | A | 11/1999 | Oh | 361/56 |
| 6,013,936 | A | 1/2000 | Colt | 257/506 |
| 6,130,458 | A | 10/2000 | Takagi et al. | 257/351 |
| 6,144,086 | A | 11/2000 | Brown et al. | 257/510 |
| 6,163,052 | A | 12/2000 | Liu et al. | 257/334 |
| 6,225,181 | B1 * | 5/2001 | Gregory | 438/355 |
| 6,316,336 | B1 | 11/2001 | Blanchard | 438/478 |
| 6,331,456 | B1 | 12/2001 | Wu | 438/154 |
| 6,383,892 | B1 | 5/2002 | Colt | 438/457 |
| 6,399,990 | B1 * | 6/2002 | Brennan et al. | 257/355 |
| 6,559,505 | B1 | 5/2003 | Fallica | 257/350 |
| 6,657,262 | B2 | 12/2003 | Patti | 257/370 |
| 6,740,958 | B2 | 5/2004 | Nakazato et al. | 257/550 |
| 6,855,985 | B2 | 2/2005 | Williams et al. | 257/338 |
| 6,900,091 | B2 | 5/2005 | Williams et al. | 438/228 |
| 6,943,426 | B2 | 9/2005 | Williams et al. | 257/500 |
| 7,009,271 | B1 | 3/2006 | Thurgate et al. | 257/510 |
| 7,049,663 | B2 | 5/2006 | Wang | 257/355 |
| 7,176,548 | B2 | 2/2007 | Williams et al. | 257/500 |
| 7,183,610 | B2 | 2/2007 | Pattanayak et al. | 257/333 |
| 7,268,045 | B2 | 9/2007 | Hower et al. | 438/282 |
| 2001/0000288 | A1 | 4/2001 | Oh | 57/409 |
| 2001/0013636 | A1 | 8/2001 | Dunn et al. | 257/565 |
| 2001/0015459 | A1 | 8/2001 | Watanabe et al. | 257/341 |
| 2002/0008299 | A1 | 1/2002 | Leonardi | 257/520 |
| 2002/0079555 | A1 | 6/2002 | Okawa et al. | 257/565 |
| 2002/0084506 | A1 | 7/2002 | Voldman et al. | 257/511 |
| 2003/0057498 | A1 | 3/2003 | Yamashita | 257/369 |
| 2003/0107103 | A1 | 6/2003 | Iwata et al. | 257/506 |
| 2003/0168712 | A1 | 9/2003 | Shin et al. | 257/510 |
| 2004/0026746 | A1 | 2/2004 | Nakazawa et al. | 257/374 |
| 2004/0032005 | A1 | 2/2004 | Williams et al. | 257/510 |
| 2004/0033666 | A1 | 2/2004 | Williams et al. | 438/297 |
| 2004/0071030 | A1 | 4/2004 | Goda et al. | 365/222 |
| 2005/0014324 | A1 | 1/2005 | Williams et al. | 438/200 |
| 2005/0014329 | A1 | 1/2005 | Williams et al. | 438/318 |
| 2005/0087805 | A1 | 4/2005 | Ning | 257/350 |
| 2005/0142724 | A1 | 6/2005 | Williams et al. | 438/199 |
| 2005/0142791 | A1 | 6/2005 | Williams et al. | 438/369 |
| 2005/0142792 | A1 | 6/2005 | Williams et al. | 438/369 |
| 2005/0158939 | A1 | 7/2005 | Williams et al. | 438/199 |
| 2005/0179093 | A1 | 8/2005 | Morris | 257/371 |
| 2005/0179111 | A1 | 8/2005 | Chao | 257/510 |
| 2005/0189606 | A1 | 9/2005 | Nakagawa | 257/500 |
| 2005/0272207 | A1 | 12/2005 | Williams et al. | 438/261 |
| 2005/0272230 | A1 | 12/2005 | Williams et al. | 438/510 |
| 2005/0287765 | A1 | 12/2005 | Onai et al. | 438/438 |
| 2006/0076629 | A1 | 4/2006 | Yilmaz | 257/378 |
| 2006/0175635 | A1 | 8/2006 | Arai et al. | 257/197 |
| 2006/0223257 | A1 | 10/2006 | Williams et al. | 438/202 |
| 2007/0013021 | A1 | 1/2007 | Zhang | 257/500 |
| 2007/0132056 | A1 | 6/2007 | Williams et al. | 257/510 |
| 2007/0158779 | A1 | 7/2007 | Cannon et al. | 257/500 |
| 2007/0241421 | A1 | 10/2007 | Liu et al. | 257/510 |
| 2007/0278568 | A1 | 12/2007 | Williams et al. | 257/335 |
| 2007/0278612 | A1 | 12/2007 | Williams et al. | 257/338 |
| 2008/0042232 | A1 | 2/2008 | Williams et al. | 257/338 |
| 2008/0044978 | A1 | 2/2008 | Williams et al. | 257/338 |
| 2008/0048287 | A1 | 2/2008 | Williams et al. | 257/338 |
| 2008/0191277 | A1 | 8/2008 | Disney et al. | 257/327 |
| 2008/0197408 | A1 | 8/2008 | Disney et al. | 257/335 |
| 2008/0197445 | A1 | 8/2008 | Disney et al. | 257/272 |
| 2008/0197446 | A1 | 8/2008 | Disney et al. | 257/499 |
| 2008/0210980 | A1 | 9/2008 | Disney et al. | 257/204 |
| 2008/0213972 | A1 | 9/2008 | Disney et al. | 438/430 |
| 2008/0217699 | A1 | 9/2008 | Disney et al. | 257/378 |
| 2008/0230812 | A1 | 9/2008 | Disney et al. | 257/272 |
| 2008/0237656 | A1 | 10/2008 | Williams et al. | 257/262 |
| 2008/0237704 | A1 | 10/2008 | Williams et al. | 257/374 |
| 2008/0237706 | A1 | 10/2008 | Williams et al. | 257/343 |
| 2008/0237783 | A1 | 10/2008 | Williams et al. | 257/513 |
| 2008/0290449 | A1 | 11/2008 | Williams et al. | 257/513 |
| 2008/0290450 | A1 | 11/2008 | Williams et al. | 257/513 |
| 2008/0290451 | A1 | 11/2008 | Williams et al. | 257/513 |
| 2009/0020811 | A1 | 1/2009 | Voldman | 257/337 |
| 2009/0101937 | A1 | 4/2009 | Lee et al. | 257/137 |
| 2009/0236683 | A1 | 9/2009 | Williams et al. | 257/499 |

FOREIGN PATENT DOCUMENTS

| | | |
|---|---|---|
| EP | 1357598 A1 | 10/2003 |
| GB | 2 362 508 | 11/2001 |
| KR | 10-0456691 | 11/2008 |

* cited by examiner

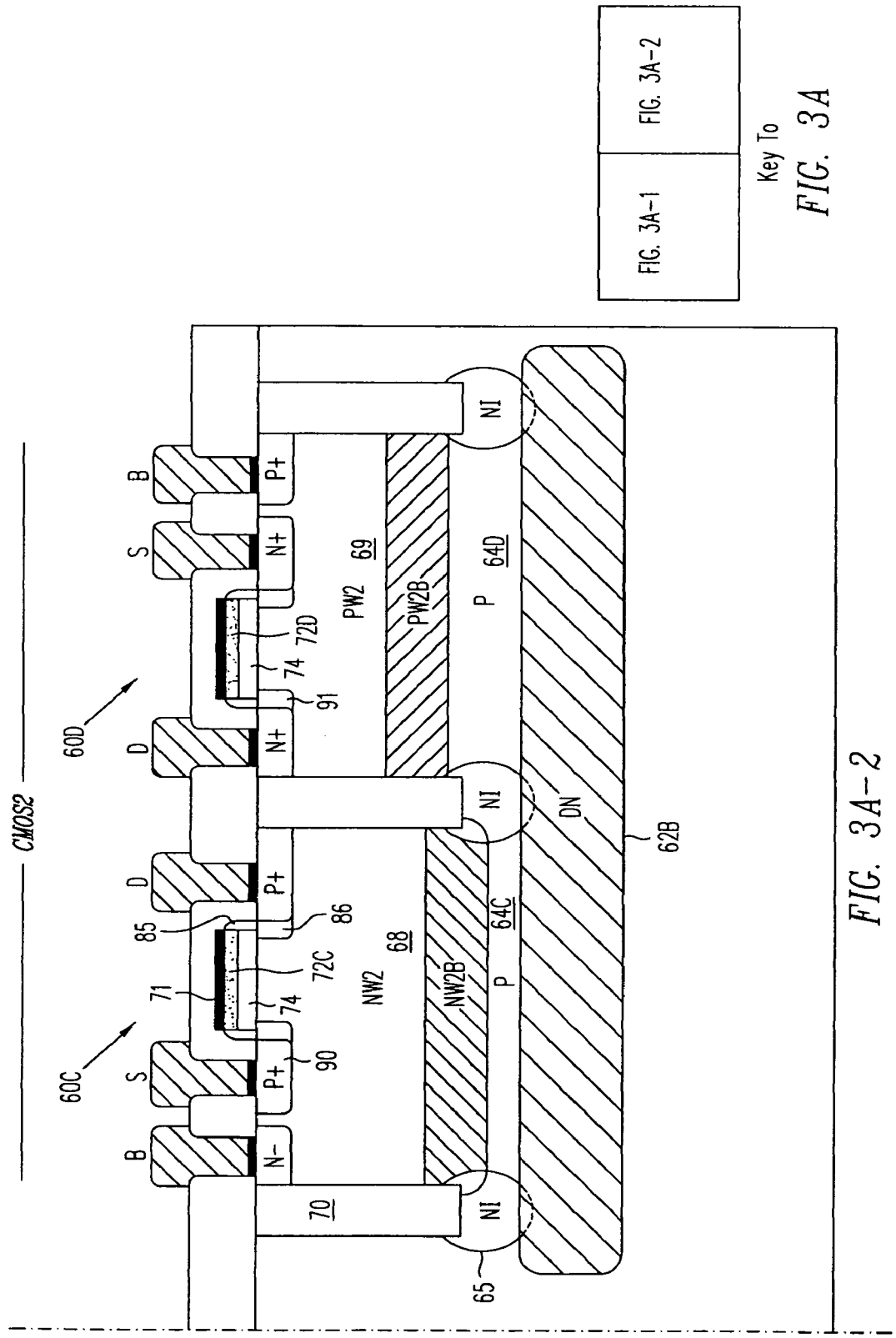

ISOLATED RECTIFIER DIODE

CROSS-REFERENCE TO RELATED APPLICATIONS

This application claims the priority of Provisional Application No. 60/920,488, filed Mar. 28, 2007, which is incorporated herein by reference in its entirety.

This application is related to application Ser. No. 11/444,102, titled "Isolation Structures For Semiconductor Integrated Circuit Substrates And Methods Of Forming The Same," filed on May 31, 2006, which is incorporated herein by reference in its entirety.

BACKGROUND OF THE INVENTION

In the fabrication of semiconductor integrated circuit (IC) chips, it is frequently necessary to electrically isolate devices that are formed on the surface of the chip. There are various ways of doing this. One way is by using the well-known LOCOS (Local Oxidation Of Silicon) process, wherein the surface of the chip is masked with a relatively hard material such as silicon nitride and a thick oxide layer is grown thermally in an opening in the mask. Another way is to etch a trench in the silicon and then fill the trench with a dielectric material such as silicon oxide, also known as trench isolation. While both LOCOS and trench isolation can prevent unwanted surface conduction between devices, they do not facilitate complete electrical isolation.

Complete electrical isolation is necessary to integrate certain types of transistors including bipolar junction transistors and various metal-oxide-semiconductor (MOS) transistors including power DMOS transistors. Complete isolation is also needed to allow CMOS control circuitry to float to potentials well above the substrate potential during operation. Complete isolation is especially important in the fabrication of analog, power, and mixed signal integrated circuits.

Although conventional CMOS wafer fabrication offers high density transistor integration, it does not facilitate complete electrical isolation of its fabricated devices. In particular, the NMOS transistor contained in conventional-CMOS fabricated in a P-type substrate has its P-well "body" or "back-gate" shorted to the substrate and therefore cannot float above the substrate potential. This restriction is substantial, preventing the use of an NMOS transistor as a high-side switch, an analog pass transistor, or as a bidirectional switch. It also makes current sensing more difficult and often precludes the use of integral source-body shorts needed to make NMOS devices more avalanche rugged.

Moreover since the P-type substrate in conventional CMOS is biased to the most negative on-chip potential (defined as "ground"), every NMOS device is necessarily subjected to unwanted substrate noise.

The need for complete electrical isolation is described in detail in related application Ser. No. 11/298,075, entitled "Isolation Structures For Semiconductor Integrated Circuit Substrates And Methods Of Forming The Same," filed Dec. 9, 2005, by R. K. Williams et al., which is incorporated herein by reference in its entirety.

Conventional Isolated Process Technologies

Complete electrical isolation of integrated devices is typically achieved using triple diffusions, epitaxial junction, or dielectric isolation. The most common form of complete electrical isolation is junction isolation. While not as ideal as dielectric isolation where oxide surrounds each device or circuit, junction isolation has historically offered the best compromise between manufacturing cost and isolation performance.

With junction isolation, electrically isolating CMOS requires a complex structure requiring the growth of an N-type epitaxial layer atop a P-type substrate surrounded by an annular ring of deep P-type isolation electrically connecting to the P-type substrate to completely isolate an N-type epitaxial island by P-type material below and on all sides. Growth of epitaxial layers is slow and time consuming, representing the single most expensive step in semiconductor wafer fabrication. The isolation diffusion is also expensive, formed using high temperature diffusion for extended durations (up to 18 hours). To be able to suppress parasitic devices, a heavily doped N-type buried layer NBL must also be masked and selectively introduced prior to epitaxial growth.

To minimize up-diffusion during epitaxial growth and isolation diffusion, a slow-diffusing dopant such as arsenic (As) or antimony (Sb) is chosen to form the N-type buried layer (NBL). Prior to epitaxial growth however, this NBL layer must be diffused sufficiently deep to reduce its surface concentration, or otherwise the concentration control of the epitaxial growth will be adversely impacted. Because the NBL is comprised of a slow diffuser, this pre-epitaxy diffusion process can take more than ten hours.

Only after isolation is complete can conventional CMOS fabrication commence, adding considerable time and complexity to the manufacturing of junction-isolated processes compared to conventional CMOS.

Since junction isolation fabrication methods rely on high-temperature processing to form deep-diffused junctions and to grow epitaxial layers, these high-temperature processes are expensive and difficult to manufacture, and are incompatible with large diameter wafer manufacturing, exhibiting substantial variation in device electrical performance and preventing high transistor integration densities. Another disadvantage of junction isolation is the area wasted by the isolation structures and otherwise not available for fabricating active transistors or circuitry. As a further complication, with junction isolation, the design rules (and the wasted area) depend on the maximum voltage of the isolated devices. Obviously, conventional epitaxial junction isolation, despite its electrical benefits, is too area-wasteful to remain a viable technology option for mixed signal and power integrated circuits.

The limitations of conventional junction isolation are described in greater detail in the aforementioned application Ser. No. 11/298,075.

An Epi-less Fully-Isolated BCD Process with Contouring Implants

As disclosed in U.S. Pat. Nos. 6,855,985, 6,900,091 and 6,943,426 by Richard K. Williams, et. al., each of which is incorporated herein by reference, a fully-isolated process integrating CMOS, bipolar and DMOS transistors can be achieved without the need for high temperature diffusions or epitaxy. The principle of this modular BCD process relies on high-energy (MeV) ion implantation through contoured oxides to produce self-forming isolation structures with virtually no high-temperature processing required. The principle of conformal ion implantation through contoured oxides is the concept that by implanting through a thicker oxide layer dopant atoms will be located closer to the silicon surface and by implanting through a thinner oxide layer, the implanted atoms will be located deeper in the silicon, away from the surface. This low-thermal budget process benefits from "as-implanted" dopant profiles that undergo little or no dopant redistribution since no high-temperature processes are employed.

Dopants, implanted through LOCOS field oxide, form conformal isolation structures that in turn are used to enclose and isolate multi-voltage CMOS, bipolar transistors and other devices from the common P-type substrate. The same process is able to integrated bipolar transistors, and a variety of double-junction DMOS power devices, all tailored using conformal and chained-ion implantations of differing dose and energy.

While this epi-less low thermal budget technique has many advantages over non-isolated and epitaxial junction isolated processes, its reliance on LOCOS imposes certain limitations on its ability to scale to smaller dimensions and higher transistor densities.

To improve CMOS transistor integration density, the well-known bird's beak taper that appears at the edges of LOCOS structures must be reduced into a more vertical structure so that the devices can placed more closely for higher packing densities. A narrow LOCOS bird's beak, however, causes the width of the isolation sidewall to become unacceptably narrowed and isolation quality to be sacrificed. At dimensions much larger than photolithographic limitations, other practical limitations of LOCOS become manifest. Such limitations include distorted field oxide shapes, excessive oxide thinning, high stress, high surface state charge, poor quality gate dielectrics and more.

What is needed is new strategy for implementing a fully-isolated, low-thermal-budget, epi-less integrated circuit process, that eliminates the aforementioned limitations of LOCOS.

BRIEF SUMMARY OF THE INVENTION

An isolation structure of this invention includes a submerged floor isolation region, a dielectric-filled trench located above the floor isolation region, and a sidewall isolation region extending from the bottom of the trench to the floor isolation region, all of which together enclose an isolated pocket of the substrate. The floor isolation region is formed by implanting dopant into the substrate and the sidewall isolation region is likewise formed by implanting dopant through the bottom of the trench before the trench is filled with a dielectric material. The sidewall isolation region may be formed by a series of implants at different implant energies. These processes are carried out in a low-temperature environment so that the implanted regions remain essentially the same size and shape as they were when implanted. No epitaxial or other high-temperature process is used. The processes are modular in the sense that the steps may be carried out in any order, although it is preferable to etch the trench before implanting the sidewall isolation region.

The invention includes the fabrication of a variety of devices in the isolated pocket, including MOSFETs, JFETs, bipolar transistors, and diodes. Non-monotonic wells including one or more deep portions that are more heavily doped than one or more shallow portions may be used to optimize device performance. For example, an N-channel MOSFET may be formed in a P-type well of this type, or a P-channel MOSFET may be formed in an N-type well of this type. The collector or base region of a bipolar transistor may comprise a well of this type and may be fabricated in the same process step that is used to fabricate the well for a MOSFET.

In one alternative embodiment of the invention, the trench is lined with a dielectric layer and contains a conductive material instead of being filled with a dielectric material. This allows electrical contact to the sidewall and floor isolation regions via the trench.

The invention also includes an isolated diode that comprises a floor isolation region, a dielectric-filled trench and a sidewall region extending from a bottom of the trench at least to the floor isolation region. The floor isolation region, dielectric-filled trench and a sidewall region are comprised in one terminal (anode or cathode) of the diode and together form an isolated pocket in which the other terminal of the diode is formed. In one embodiment the terminals of the diode are separated by a second dielectric-filled trench and sidewall region.

DETAILED DESCRIPTION OF THE INVENTION

To eliminate the aforementioned limitations associated with prior art processes, the devices described herein are isolated using shallow, medium, or deep trench isolated regions (so called STI or DTI) instead of LOCOS. These dielectric-filled trenches are combined with high-energy and chained ion implantations to form floor isolation and to enhance sidewall isolation voltage capability.

The novel combination of STI or DTI for sidewall isolation and high energy implanted floor isolation represent in various forms, both method and apparatus inventive matter for integrating and isolating devices at high densities, without the need for long high-temperature diffusion or expensive epitaxial deposition. The isolation structures produced in this manner can be divided into three categories or "types", which are herein defined as follows:

Type-I isolation: a combination of deep high-energy ion implanted floor isolation and a dielectric-filled trench sidewall isolation, with the option for shallow trenches not associated with the sidewall isolation Type-II isolation: a combination of deep high-energy ion implanted floor isolation and dielectric-filled trench sidewall isolation with additional isolation implants made into the bottom of the trench.

Type-III isolation: a combination of deep high-energy ion implanted floor isolation, and chained implant formed junction sidewall isolation with dielectric-filled trenches not necessarily associated with the sidewall isolation The inventive methods described herein detail the fabrication and construction of bipolar, CMOS and DMOS devices in a fully-isolated BCD process incorporating Type-II isolation structures.

Application Ser. No. 11/444,102, entitled "Isolation Structure For Integrated Circuits And Modular Methods Of Forming The Same", incorporated herein by reference, describes the detailed fabrication of the type I, II and III trench isolation structures.

Type-II Epi-less Isolation

Figure 1A:
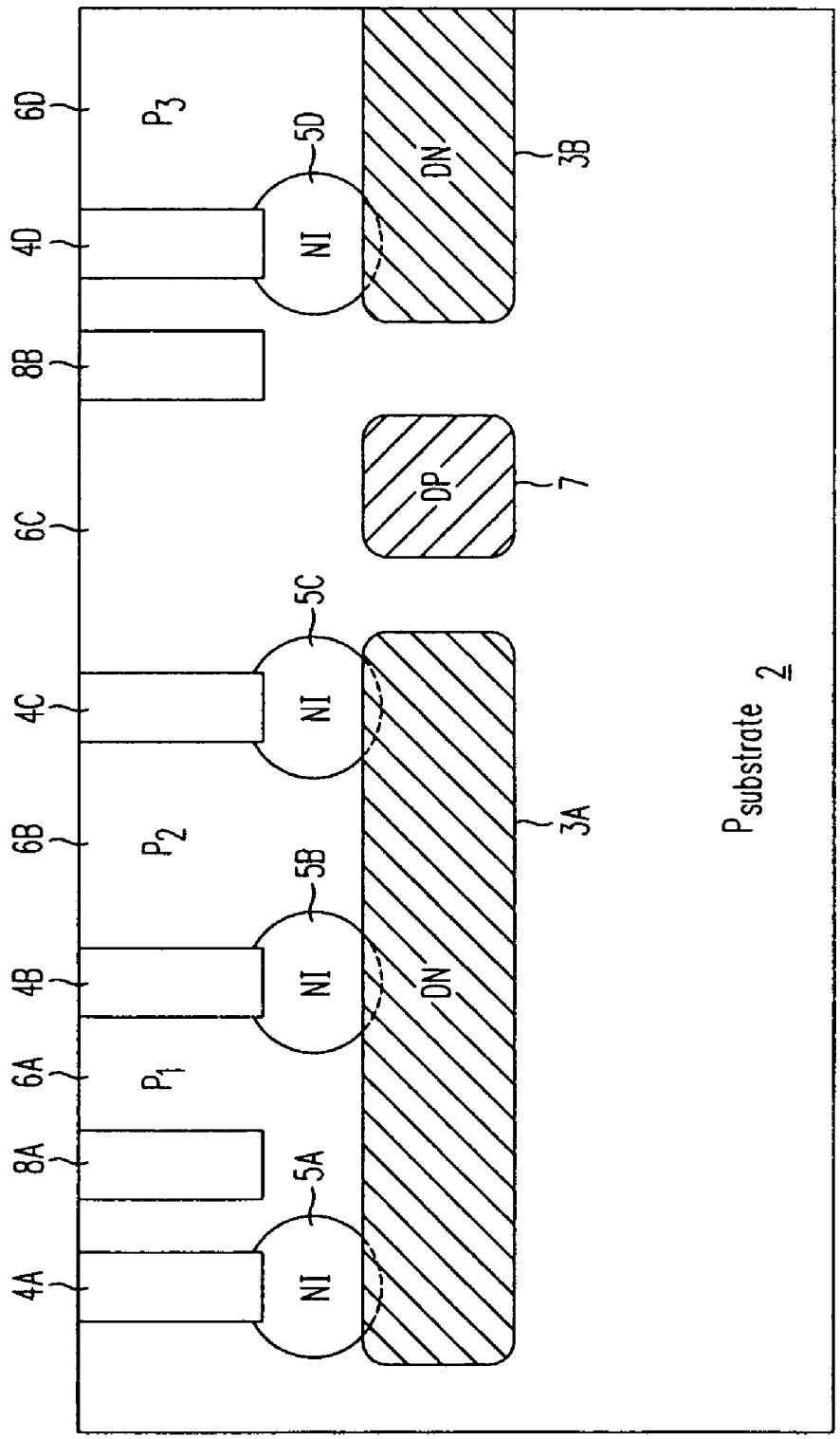
FIG. 1A is a cross-sectional view of a Type-II epi-less isolation structure without shallow trenches.

The structure of Type-II epi-less isolation, shown in device isolation structure 1 of FIG. 1A, comprises N-type floor isolation regions 3A and 3B formed in a P-type substrate 2 with dielectric-filled trenches 4A through 4D and sidewall N-type doped isolation (NI) regions 5A through 5D formed at the bottom of trenches 4A-4D. An optional P-type region 7 is formed in substrate 2 at a depth shallower than, deeper than, or equal to floor isolation regions 3A and 3B. The result is the formation of P-type pockets 6A, 6B, and 6D, which are electrically isolated from P-type substrate 2 by a combination of junction isolation at the bottom of each pocket and dielectric filled trenches circumscribing the sidewalls of each pocket.

In a preferred embodiment of this invention, floor isolation regions 3A and 3B are formed by implanting phosphorus at high-energies with minimal high-temperature processing after implantation. Such deep N-type layers are referred to herein as "DN", an acronym for deep N-type region.

Since substrate 2 has no epitaxial layer grown atop it, DN floor isolation regions 3A and 3B are not the same as buried layers formed using high-temperature processing in conventional epitaxial processes, despite their similar appearance. The peak concentration and total vertical dimension of a conventional buried layer is affected by substantial diffusion unavoidably occurring in high-temperature fabrication before, during, and after epitaxial growth. The problem of variability in diffused and epitaxial processes occurs because slight changes in temperature can cause large deviations in dopant profiles, a consequence of the exponential dependence of diffusivity on temperature.

The implanted DN regions of the present invention, in contrast, are affected only by the implant energy (or energies in the case of multiple implants). The resulting profile is "as-implanted", and not subject to the variability associated with thermal processing. In a relative sense, DN region formation may preferably comprise the highest energy implantation in the process, in the range of 1 MeV (one million-electron-volts) to over 3 MeV. Practically speaking, energies of 1.5 MeV to 3.0 MeV allow deep implants to be achieved in reasonable times using singly- and doubly-ionized dopants. Triply-ionized dopant species having a high charge state can be implanted to a greater depth, but at correspondingly lower beam currents. The result is slower; more variable implantations. Phosphorus implant doses for the DN region may range from 7E11 cm$^{-2}$ to 1E14 cm$^{-2}$ but typically comprise doses in the 5E12 cm$^{-2}$ to 5E13 cm$^{-2}$ range.

Deep P-type region 7, having the acronym "DP", may in a preferred embodiment be formed using the high-energy implantation of boron, at any depth, but generally at a depth equal to or shallower than the DN region. The implantation of boron to any given depth requires a lower energy than phosphorus, e.g. from 0.8 MeV to 1.5 MeV, since boron is a smaller less massive atom than phosphorus. Boron implant doses for the DP region may also range from 7E11 cm$^{-2}$ to 1E14 cm$^{-2}$ but may typically comprise doses in the 1E12 cm$^{-2}$ to 7E12 cm$^{-2}$ range.

The formation of the sidewall NI regions 5A through 5D is accomplished using medium- to high-energy ion implantation into the bottom of trenches 4A through 4D before the trench is filled with any dielectric material. These NI regions overlap onto the DN regions, completing the sidewall isolation in the region beneath the trenches and above the DN regions and allowing a shallower trench to be used to perform sidewall isolation. Shallower trenches are easier to manufacture, i.e. to etch, and to fill.

In device isolation structure 1, three isolated pockets, 6A, 6B, and 6D, are formed using two DN floor isolation regions 3A and 3B. Pocket 6C is isolated from pockets 6A, 6B, and 6D, but is electrically connected to substrate 2. While the DN floor isolation regions 3A and 3B could be electrically floating or connected to the same potential as substrate 2, they are preferably biased to a potential more positive than the substrate 2, and therefore form reverse biased P-N junctions with the substrate and isolated pocket. The reverse bias present on each DN region may be the same or different, and may be a fixed potential or vary with time. For example, pockets 6A and 6B, isolated from the substrate by floor isolation region 3A and trenches 4A and 4C; and from one another by trench 4B, may contain 5V circuitry. Pocket 6D, isolated from the substrate by floor isolation region 3B and trench 4D may contain 12V circuitry, operating without regard to the 5V circuitry sharing the same P-type substrate 2.

Inside an isolation region, each isolated P-type pocket may contain devices biased at any potential equal to or more negative than the bias potential of the DN floor isolation region underlying that pocket. For example if DN floor isolation region is biased at 5V, devices inside the isolated pocket may operate up to 5V and as negative as junction breakdowns of an isolated device may allow, potentially even more negative than the potential of P-type substrate 2 itself. The isolated pockets may likewise include additional P-type or N-type doped regions introduced before and/or after the isolation formation.

In Type-II isolation, each and every trench used to form sidewall isolation contains an implanted sidewall NI region at the bottom of the trench. To form conventional STI among devices within individual P-type pockets and/or in the substrate, some of the trenches may be masked during implantation of the NI regions. For example, in FIG. 1A STI trenches 8A and 8B may be etched, filled, and planarized using the same process steps as those used for the sidewall isolation trenches, thus minimizing process complexity.

Alternatively, shallower trenches may be etched using masking and etching steps separate from those used to form the sidewall isolation trenches. These shallower trenches may be filled and planarized using the same process steps used to fill and planarize the sidewall isolation trenches, thus reducing process complexity. Since the shallower trenches are easier to etch and refill, they have a smaller mask dimension than the sidewall isolation trenches, thereby improving transistor packing density of the process.

Figure 1B:
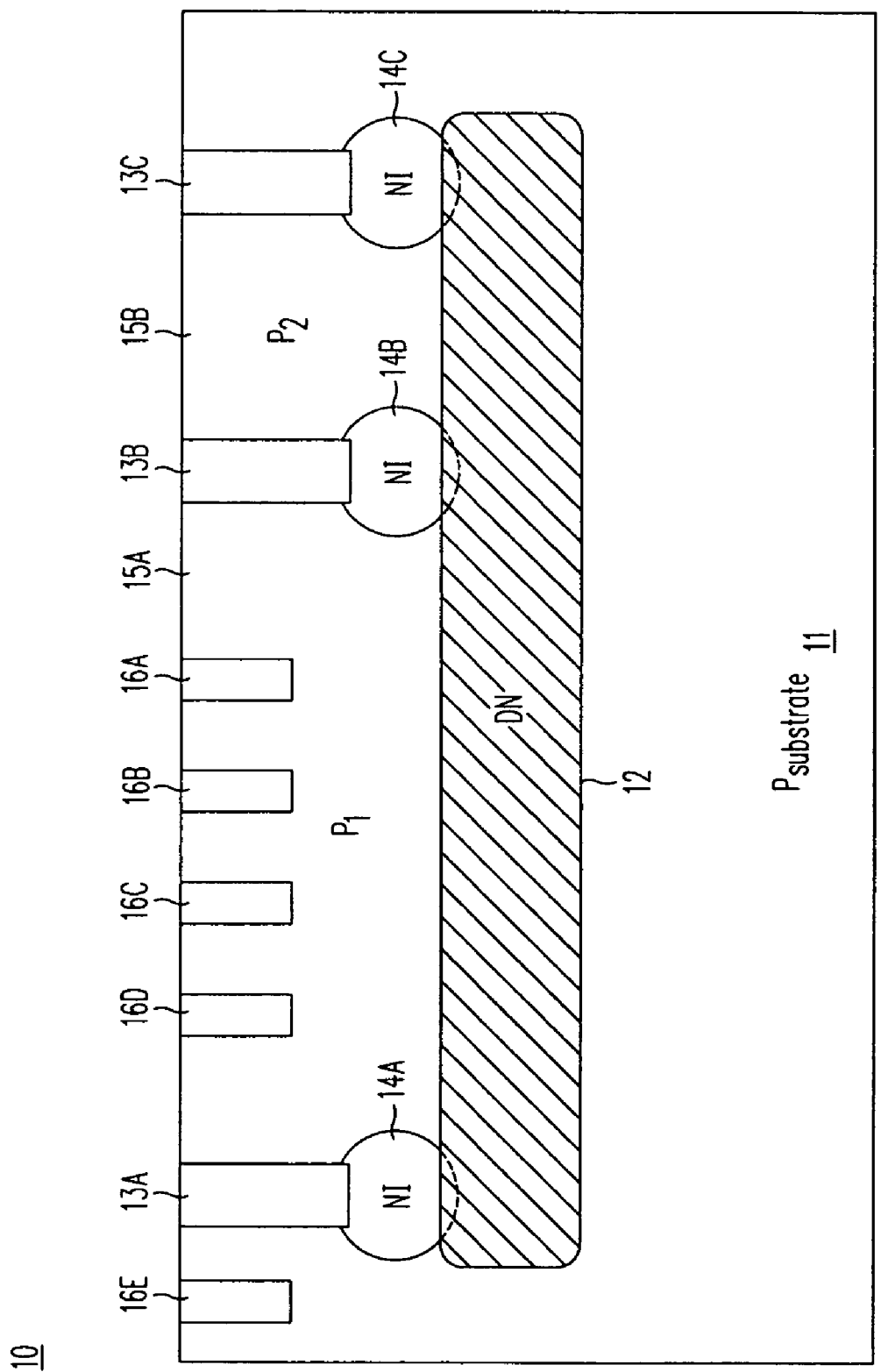
FIG. 1B is a cross-sectional view of a Type-II epi-less isolation structure with shallow trenches.

The combination of deeper sidewall isolation trenches and shallower trenches is shown in cross section 10 of FIG. 1B, where deep dielectric-filled trenches 13A, 13B, and 13C, combined with sidewall NI regions 14A, 14B and 14C and DN floor isolation region 12 are used to isolate P-type pockets 15A and 15B from P-type substrate 11. Shallow dielectric-filled trenches 16A through 16E are included inside isolated pockets 15A and/or in substrate 11 to facilitate partial isolation (as in conventional STI) among CMOS and other devices. Unlike the deep trenches 13A through 13C, these shallow trenches 16A-16E do not contain any implant at the trench bottom.

BCD Process with Epi-less Isolation

Figure 2A:
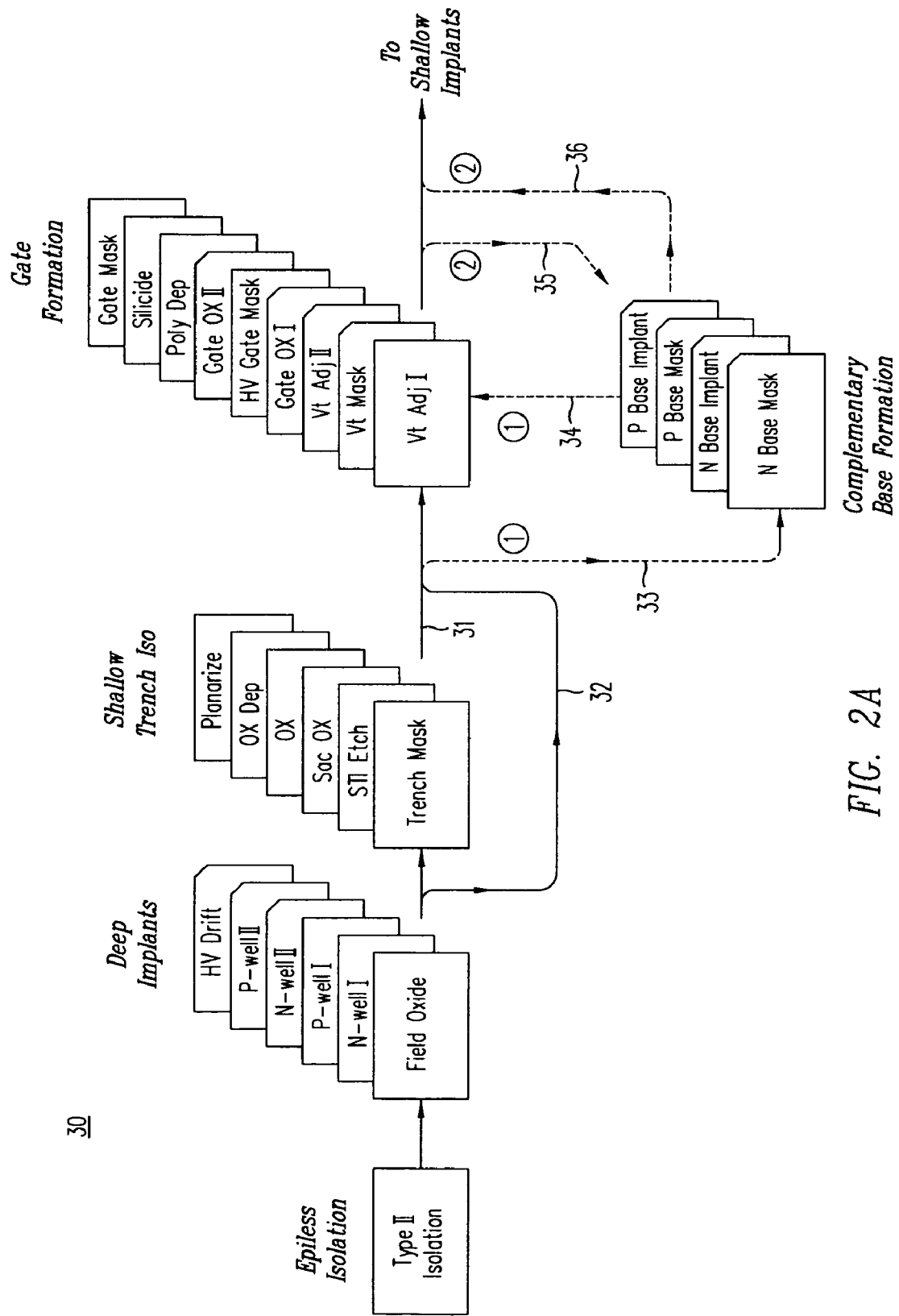
FIG. 2A is a chart of the process flow for the fabrication of an epi-less isolated bipolar-CMOS-DMOS (BCD) arrangement through the formation of the gate.
Figure 2B:
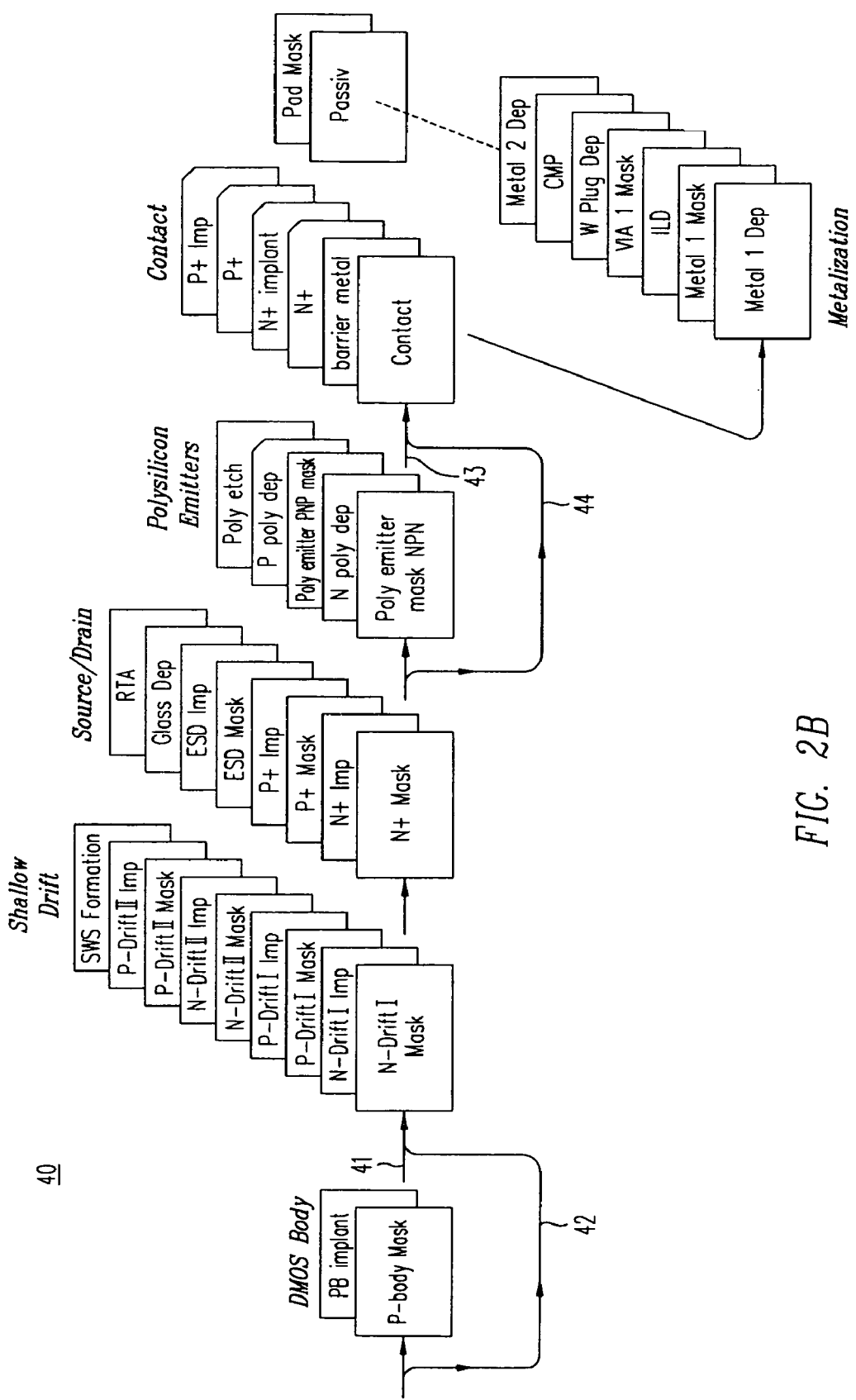
FIG. 2B is a chart of the process flow for the fabrication of an epi-less isolated BCD arrangement from the shallow implants.

FIGS. 2A and 2B illustrate modular process-architectures 30 and 40 for fabricating a variety of fully-isolated bipolar, CMOS and DMOS devices without the need for high temperature processing, or epitaxy.

In principle, because no high temperatures are required to achieve electrical isolation used the disclosed techniques, the formation of the sidewall NI regions, the dielectric filled trenches, and the DN floor isolation regions can be performed in any order without adversely impacting the electrical isolation of integrated devices. In practice, however, some fabrication sequences are preferred since they simplify wafer processing. Process details for forming the trench isolation structures are detailed in the aforementioned application Ser. No. 11/298,075.

In this integrated process, devices are defined by a combination of masked implants comprising chain-implants or high-energy implants. To achieve final dopant profiles that are substantially as-implanted, only minimal dopant redistribution from diffusions and high temperature processing are possible. As-implanted dopant profiles differ from standard monotonically decreasing concentrations of diffused Gaussian profiles because they can be optimized to set device characteristics independently.

In addition to offering greater flexibility in the sequence of forming the isolation structures, the low-temperature process architecture disclosed allows the sequence of device formation to be rearranged with minimal impact on device performance. For example the bipolar base implants may precede or follow the MOS gate formation steps. To maintain the self-aligned MOS transistor characteristic, the LDD implants must follow gate formation but precede sidewall spacer formation while the N+ and P+ source and drain implants must occur subsequent to sidewall formation.

In a preferred embodiment, the modular integrated process sequence 30 of FIG. 2A involves the following steps:
Sidewall isolation and STI formation
Complementary well and deep implant formation
Complementary bipolar base formation
Dual gate formation Following the steps shown in process flow 30, the modular integrated process sequence 40 of FIG. 2B continues with the following steps
DMOS body formation
Shallow drift and sidewall spacer formation
Source and drain implant formation
Polysilicon emitter formation
Contact formation
Multilayer interconnect formation
Bump metal redistribution layer formation
Passivation
Under bump metal and bump formation A key feature of this process is its modularity, or ability to exercise only the processes required to implement a desired set of devices. As such, many of the processes listed above and shown in FIGS. 2A and 2B are optional. Referring again to modular process-architecture 30 in FIG. 2A, complementary well formation comprises a sequence of mask and implants with no subsequent high temperature diffusion and minimal dopant segregation. For example a pre-implant oxide may be thermally grown prior to implantation at a low temperature, e.g. 850° C. to 900° C., to a thickness of several hundred angstroms to minimize surface contamination. One pre-implant oxide may be used for several well implantations without the need to strip and re-grow the oxide. More than one P-type and N-type well maybe formed in different regions to facilitate fabrication of different voltage devices.

For example a $1^{st}$ P-type well is formed using a boron chain implant resulting in a non-monotonic or non-Gaussian doping concentration profile which may include at least a top portion PW1 and a buried or deeper portion PW1B or any number of regions comprising implants of varying energy and dose. Deeper portion PW1B may comprise a heavier dose implant and a higher concentration than the upper well portion PW1.

A $2^{nd}$ P-type well is formed also using a boron chain implant resulting in a non-monotonic or non-Gaussian doping concentration profile which may include at least a top portion PW2 and a buried or deeper portion PW2B or any number of regions comprising implants of varying energy and dose. Deeper portion PW2B may also comprise a heavier dose implant and a higher concentration than the upper well portion PW2. The concentration and doping profile of the $1^{st}$ P-type well and the $2^{nd}$ P-type well are dissimilar, and can be optimized for devices with different operating voltage requirements. For example the $1^{st}$ P-type well may be optimized for constructing 1.5V, 2.5V or 3.3V NMOS transistors, while the $2^{nd}$ P-type well may be optimized for fabricating 5V, 12V or 20V NMOS transistors.

In a similar fashion, a $1^{st}$ N-type well is formed using a phosphorus chain implant resulting in a non-monotonic or non-Gaussian doping concentration profile which may include at least a top portion NW1 and a buried or deeper portion NW1B or any number of regions comprising implants of varying energy and dose. Deeper portion NW1B may comprise a heavier dose implant and a higher concentration than the upper well portion NW1.

Likewise, a $2^{nd}$ N-type well is also formed using a phosphorus chain implant resulting in a non-monotonic or non-Gaussian doping concentration profile which may include at least a top portion NW2 and a buried or deeper portion NW2B or any number of regions comprising implants of varying energy and dose. Deeper portion NW2B may also comprise a heavier dose implant and a higher concentration than the upper well portion NW2. The concentration and doping profile of the $1^{st}$ N-type well and the $2^{nd}$ N-type well are dissimilar, and can be optimized for devices with different operating voltage requirements. For example the $1^{st}$ N-type well may be optimized for constructing 1.5V, 2.5V or 3.3V PMOS transistors, while the $2^{nd}$ N-type well may be optimized for fabricating 5V, 12V or 20V PMOS transistors.

In a preferred embodiment, the aforementioned P-type wells are implanted to a depth no deeper than the DN floor isolation layer, i.e. comprising a chain implant with its highest implant energy less than the DN implant energy. Accordingly, a P-type well sitting above a DN floor isolation region should not substantially counter-dope the DN layer or significantly diminish the DN layer's isolation effectiveness.

Another deep implant option is the formation of a high voltage deep drift region. Masked and implanted with energies up to or even exceeding that of the deepest N-type well implants, the N-type drift region (ND) can be adjusted so its total implant dose $Q_{ND}$ is optimum for constructing high-voltage transistors. The total implanted charge of a high voltage drift should be in the range of 1E12 $cm^{-2}$ to 5E12 $cm^{-2}$.

In one embodiment of this invention, shallow trench isolation is formed after complementary well formation, following flow number 31 in FIG. 2A. In this sequence, the well doping profiles and junction depths are unaffected by the presence of the shallow trench isolation (STI) regions. It should be noted that the term shallow trench isolation is a misnomer, despite its common use in the art. Shallow trench isolation is analogous to LOCOS field oxide in that it spaces MOS field effect transistors from one another and prevents unwanted surface inversion and leakage between and among these transistors. So in the sense of suppressing surface transistor action, i.e. raising parasitic field threshold voltages above the supply voltage so they never turn on, STI does provide a type of "isolation". But the Type-II trench isolation disclosed herein is capable of fully isolating a device, allowing it to float above the P-type substrate potential, whereas STI cannot do this. Specifically, STI is too shallow to connect to the deep implanted floor isolation region DN, and therefore does not form a floating pocket in the way that Type-II isolation does.

In a preferred embodiment, the shallow trenches have a shallower depth and a narrower width than the deeper trenches forming the Type-II isolation structures. In this manner, the shallow trenches may be inserted between devices with less adverse impact on die area and transistor packing density. For example, in one embodiment the deep trenches may be 1.6 microns deep and 0.4 microns wide, i.e., with a 4× aspect ratio, while the shallow trenches may be 0.2 to 0.5 microns deep and only 0.2 microns wide, with only a 1× to 2.5× aspect ratio. Lower aspect ratio trenches are easier to etch and refill than high aspect ratio trenches, especially at high densities where loading effects can affect plasma or reactive ion etch speed and uniformity. At the shallow end of the range, the STI depth is adequate to electrically separate N+ and P+ implants from overlapping or touching, but is not deep enough to limit the lateral extent of deeper bipolar base implants. In an NPN bipolar transistor, for example, STI can then be inserted between N+ emitter and P+ base contact implants, but is inadequate to prevent lateral overlap of the PB base implant onto the N+ collector implant, which may impact the base-to-collector breakdown rating of the device. Conversely, if the STI depth is chosen to be at the high end of the stated range and deeper than the base implant, it cannot be inserted between the N+ emitter and the P+ base contact since it would disconnect the PB base from its P+ contact.

One key benefit of shallow trench isolation over LOCOS field oxide isolation is the lack of a bird's beak, a sloped oxide region that interferes with MOS transistor operation in complex and undesirable ways, and ultimately limits transistor packing density. In LOCOS field oxide regions having widths less than 0.4 microns, encroachment of the bird's beak from both sides results in excessive bird's beak length, oxide thinning, compromised electrical performance, and high stress. The more vertical profile of shallow trench isolation is better than LOCOS especially at dimensions less than 0.3 microns.

In another embodiment of this invention, the shallow trench isolation may be introduced prior to the well formation and integrated into the sidewall isolation process sequence. In one implementation, the shallow trenches may be etched and filled using the same steps that are used to form the sidewall isolation trenches, with an additional mask to prevent the NI sidewall implant from entering the STI trenches. In another implementation, separate masking and etching steps may be used to produce the STI trenches and the sidewall isolation trenches, but they may share some or all of the refill and planarization steps. By introducing the shallow trench isolation prior to well formation, the oxide present in the shallow trench may affect the well dopant profiles, reducing the silicon junction depth such that the buried or deep implanted portion of the wells, e.g. NW1B and PW1B, are located closer to the silicon surface. In some instances these deep implanted portions may actually touch the silicon surface which could be beneficial if it raises the field threshold under the STI without degrading transistor breakdown voltage. Conversely, if the deep implant portion of the wells is too heavily concentrated, transistor breakdown could suffer and off-state leakage current increase.

In still another embodiment of this invention, in flow 32, shown in FIG. 2A, the shallow trench isolation regions are left out entirely and their processing steps skipped.

After sidewall isolation, well formation and shallow trench isolation, complementary base regions may be formed following process flows 33 and 34, shown in FIG. 2A. An implant is photolithographically defined and implanted to form the PB base region of NPN bipolar transistors. Similarly, an implant is photolithographically defined and implanted to form the NB base region of PNP bipolar transistors.

The base implants may comprise single implants or chain implants—in one embodiment, a deeper lighter portion and a shallower heavier portion. The shallow portion may be used to reduce base resistance while the deeper portion establishes the current gain β and Early voltage $V_A$ of the device. The bipolar transistors may be formed using either polysilicon or implanted emitters. The base regions may be deeper for implanted emitters than for polysilicon emitters.

After complementary base formation, single, dual, or triple gate oxides are formed. In a dual gate oxide process, a first oxide is grown at a low temperature, e.g. 850° C. to 900° C., to a given thickness $x_{ox1}$. The oxide is then masked and removed, generally by etching in HF acid, in regions where a thinner gate oxide is desired. Care must be taken during the etching not to remove significant oxide from the dielectric-filled trenches, either by covering them during the etch process or by limiting the etch time. Alternatively, a capped trench, as described in application Ser. No. 11/298,075, titled "Isolation Structures For Semiconductor Integrated Circuit Substrates And Methods Of Forming The Same" by R. K. Williams and incorporated herein by reference, may be used to alleviate trench oxide erosion.

After the gate oxide is removed from select active regions, the entire wafer is then oxidized a second time to a second thickness $x_{ox(thin)}$ in regions where no oxide was present at the time of the second oxidation. In regions where oxide remained prior to the second gate oxide, the oxide grows from its starting thickness $x_{ox1}$ to a new thickness $x_{ox(thick)}$ resulting from the two sequential oxidations. The thick oxide is generally thinner than the linear combination of the two oxide thicknesses, i.e. $x_{ox(thick)} < (x_{ox1} + x_{ox(thin)})$, particularly for thicker gate oxides, since oxidation slows-down from a linear growth rate to a more asymptotic parabolic growth rate as it grows thicker. If, for example, the thick oxide is only slightly thicker than the thin oxide, then a linear summation of oxide thicknesses is a good approximation. If the thick oxide in several times thicker than the thin oxide, the second oxidation may have little impact on the final thickness.

In general, thicker oxides are used to support higher gate voltages. For thicknesses above 100 Angstroms, the maximum steady-state gate voltage is limited to around 4 MV/cm, but extremely thin gates can support higher electric fields, e.g. at 6 to 8 MV/cm without rupture (in part because they "leak" due to quantum mechanical tunneling effects). Despite their lower maximum voltage ratings, thinner gate oxides are desirable for achieving lower threshold voltage transistors and for suppressing unwanted short channel effects in deep submicron transistors. Examples may include a 150 Å gate for a 6V device, and a 300 Å for a 12V device.

After single, dual, or triple gate oxide formation, gate polysilicon is then deposited. The polysilicon layer may be in-situ doped (doped during deposition), or deposited un-doped and then doped P-type in some regions and N-type in other regions. A refractory metal such platinum, titanium or tungsten may then be deposited and optionally heated at a low temperature to react the metal and polysilicon, forming a low-resistance silicide. The gate is then photolithographically masked and etched.

In an alternative process flow, the thicker gate is first grown, and covered with an in-situ doped polysilicon layer which is subsequently masked and etched. Unwanted, thick gate oxide is then removed. The thin gate oxide is then grown, covered with a second polysilicon layer, this one being un-doped, and subsequently masked and doped to form both P-type and N-type polysilicon regions. A refractory metal may then be deposited on the second polysilicon layer and reacted to form silicide. The second polysilicon layer is masked and etched to form the low-voltage gates. In this alternative process flow, the higher-voltage, thick-gate devices do not have a silicide, resulting in lower maximum switching speed. One advantage of this process flow is it is possible to form a poly-to-poly capacitor between the first and the second polysilicon layers.

In an alternative process flow following paths 35 and 36, shown in FIG. 2A, the base implants are introduced after the gate oxidation steps, having the advantage that the gate oxidation process has no impact on the base dopant profiles. This is especially advantageous for polysilicon emitter bipolar transistor formation where the base is necessarily very shallow for high frequency operation. Another advantage of this flow is that the patterned polysilicon layers may be used to define the emitter regions of the bipolar transistors, allowing better dimensional control of the emitter regions.

After gate formation and base formation are completed, the process proceeds as illustrated in process flow chart 40 of FIG. 2B. Following process flow 41, a dedicated DMOS body may be introduced through a mask using a tilt implant. For fabricating an N-channel lateral DMOS, a boron implant in the range of 1E13 $cm^{-2}$ to 9E13 $cm^{-2}$ is introduced at a 45 degree angle, penetrating into the silicon beneath the MOS gate. To provide implant uniformity for MOS gates of various orientations, the wafers should be mechanically rotated during ion implantation.

An alternative flow 42 skips the P-body formation.

Shallow drift or Lightly-doped Drain (LDD) implants are masked and implanted sequentially including for example more lightly doped 12V or 20V drift regions, and more heavily doped 1.5V, 3V or 5V drift implants. After these shallow implants, a sidewall spacer oxide is formed using traditional methods, for example by depositing a thick oxide and etching it back using an anisotropic etch.

Heavily-doped N+ and P+ implants are masked and implanted using, for example an arsenic dose of about 5E15 $cm^{-2}$ and $BF_2$ dose of about 2E15 $cm^{-2}$, respectively. An optional implant may also be introduced to improve ESD performance. For example, a phosphorous dose of 1E15 $cm^{-2}$ may be used.

An Interlevel Dielectric (ILD) layer is formed by conventional processing, such as deposition of one or more layers of oxide, silicon nitride, or other suitable dielectric materials. In the event that high-frequency polysilicon emitter bipolar transistors are desired, the process continues on flow 43, where polysilicon emitter windows are opened and polysilicon is deposited. The polysilicon may be doped in-situ or deposited un-doped and then masked and ion implanted to form P-type and N-type polysilicon emitters. If such high-frequency bipolar transistors are not required, flow 44 can be used instead and the polysilicon emitter steps skipped.

The wafers are annealed using a rapid-thermal-anneal (RTA) process to activate the implanted dopants. Aside from the gate oxidation processes, this step comprises the most significant portion of the thermal budget in the process. This characteristic is unique in that most isolated IC processes have substantial high-temperature processing associated with isolation and well formation.

Multilayer interconnects are formed using a standard processing techniques, including contact masking and etching, barrier metal, contact plug, or via deposition and etch-back, metal deposition, metal masking and etching. The first metal layer may be covered with a second ILD layer, and the processes repeated to form additional levels of metal interconnect. The metal thickness depends on the minimum line width to be etched, but the lower levels may typically be in the range of 0.3-0.8 microns, while the top level may typically be up to 3 microns thick, in order to handle higher current densities.

One or more passivation layers such as oxide or silicon nitride are then deposited, masked and etched to define bond pad openings.

An optional top metal layer may be used to redistribute the pad locations uniformly across the chip for bump assembly, typically in a regular grid array. This metal layer forms a redistribution layer (RDL). In this case, the passivation layers are etched in the bump locations and an appropriate bump material is deposited, such as a three layer sandwich of metal comprising titanium as an Ohmic contact layer, followed by nickel as a barrier, and finally silver as a solderable metal. Silver solder bumps are then plated on the wafer and the finalized wafer is ready for dicing.

Low-Voltage Devices

Figures 1, 3A:
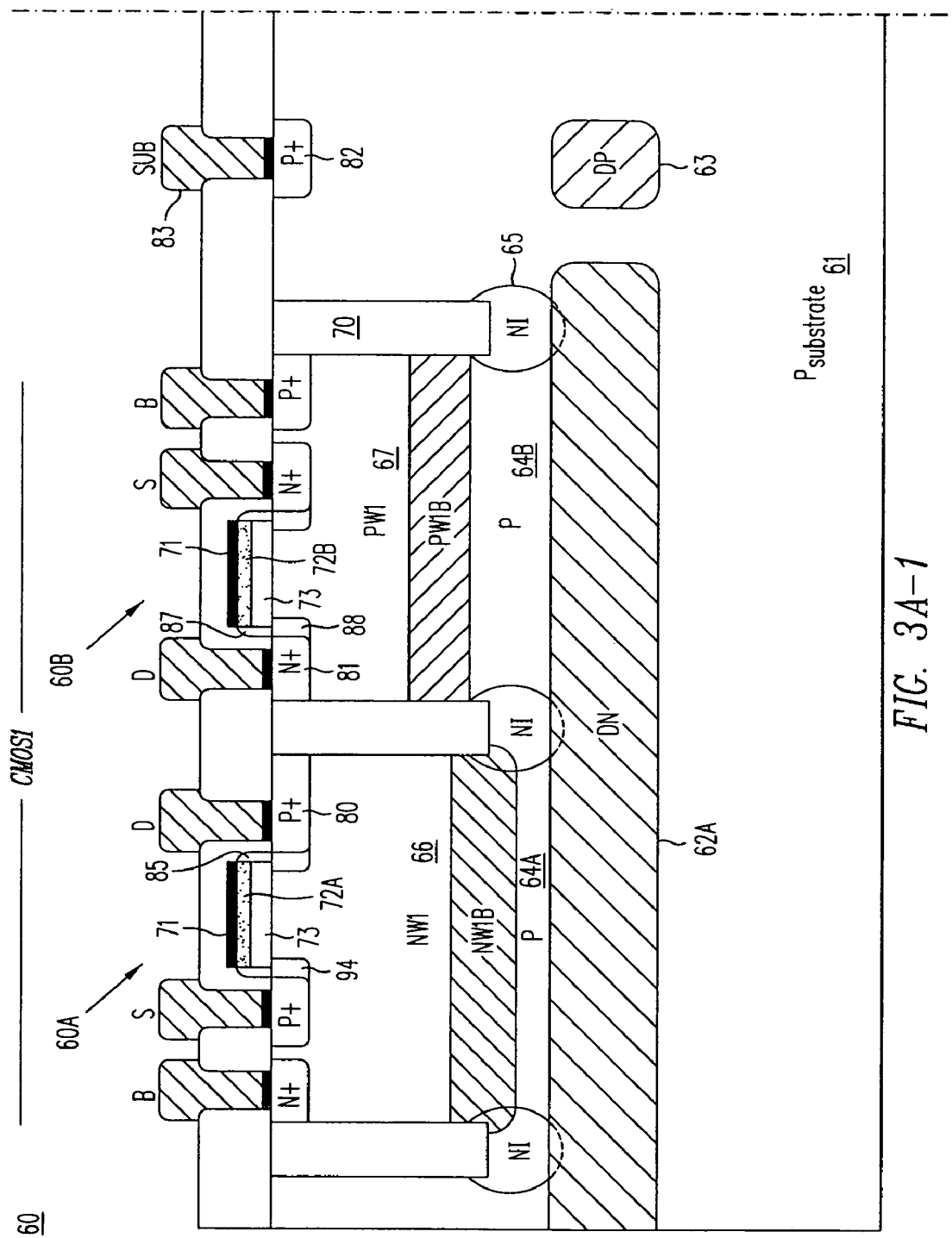
FIG. 3A is a cross-sectional view of a multi-voltage isolated CMOS fabricated using the Type-II trench isolation process.

FIG. 3A illustrates a cross section 60 of two isolated CMOS devices, CMOS1 and CMOS2, fabricated in a common P-type substrate 61. CMOS1 is formed in a first isolation region that is isolated from substrate 61 by a floor isolation region 62A, dielectric-filled trenches 70 and NI regions 65. Within this isolation region, a first N-type well 66 is used to form the body or well region containing a first PMOS 60A. N-type well 66 is also used to contact floor isolation region 62A, either directly by overlapping floor isolation region 62A, or indirectly by contacting and overlapping NI region 65. In a preferred embodiment, the doping profile of N-type well 66 is non-monotonic, comprising at least a top portion NW1 and a deeper portion NW1B, and N-type well 66 is formed using a phosphorus chain implant of differing energies and doses. In the event that the bottom of N-type well 66 does not overlap onto floor isolation region 62A, an intervening P-type region 64A will result. P-type region 64A is floating and has no substantial electrical effect on CMOS1.

A first P-type well 67 is used to form the body or well regions containing a first NMOS 60B. In a preferred embodiment, the doping profile of the P-type well 67 is non-monotonic, comprises at least a top portion PW1 and a deeper portion PW1B, and is formed using a boron chain implant of differing energies and doses. Should P-type well 67 not overlap onto floor isolation region 62A, an intervening P-type region 64B will result. Since region 64B is also P-type it is electrically shorted to the potential of P-type well 67. While N-type well 66 and P-type well 67 may touch, in a preferred embodiment, trench 70 separates them, thereby reducing the isolated CMOS device's susceptibility to latch-up, a type of unwanted parasitic thyristor conduction.

Within N-type well 66, the PMOS 60A comprises a P+ source and drain 80, a sidewall spacer 85, a lightly-doped drain (LDD) 94, a polysilicon gate 72A with a silicide-layer 71. The gate 72A is located atop a first gate oxide layer 73, which has a thickness $x_{ox1}$. Within P-type well 67, the NMOS 60B comprises an N+ source and drain 81, a sidewall spacer 87, an LDD 88, a polysilicon gate 72B with silicide layer 71. The gate 72B is located atop first gate oxide layer 73, which has a thickness $x_{ox1}$, optimized for the best overall performance and voltage capability for both PMOS 60A and NMOS 60B comprising CMOS1.

A second CMOS pair, CMOS2, is formed in a second isolation region that is isolated from substrate 61 by a floor isolation region 62B, trenches 70 and NI regions 65. Within this second isolation region, a second N-type well 68 is used to form the body or well region of a second PMOS 60C, which preferably has different a breakdown voltage or electrical conduction properties than the first PMOS 60A. The N-type well 68 is also used to directly or indirectly contact floor isolation region 62B. In a preferred embodiment, the doping profile of the N-type well 68 is non-monotonic, different from the doping profile of first N-type well 66, comprising at least a top portion NW2 and a deeper portion NW2B, and is formed using a phosphorus chain implant of differing energies and doses. In the event that the bottom of N-type well 68 does not overlap onto floor isolation region 62B, an intervening P-type region 64C will result. P-type region 64C is floating and has no substantial electrical effect on CMOS2.

A second P-type well 69 is used to fabricate a second NMOS 60D, which preferably have different characteristics than those fabricated in NMOS 60B. In a preferred embodiment, the doping profile of the second P-type well 69 is non-monotonic, different from the doping profile of first P-type well 67, comprising at least a top portion PW1 and a deeper portion PW1B, and is formed using a boron chain implant of differing energies and doses. Should P-type well 69 not overlap onto floor isolation region 62B, an intervening P-type region 64D will result. Since region 64D is also P-type, it is electrically shorted to the potential of P-type well 69. While N-type well 68 and P-type well 69 may touch, in a preferred embodiment, trench 70 separates them, thereby reducing their susceptibility to latch-up.

Within N-type well 68, PMOS 60C comprises a P+ source and drain 90, a sidewall spacer 85, an LDD 86, and a polysilicon gate 72C with silicide layer 71. Gate 72C is located atop a second gate oxide layer 74, which has a thickness $x_{ox2}$ that is preferably different from the thickness $x_{ox1}$ of the first gate oxide layer 73. Within P-type well 69, NMOS 60D comprises an N+ source and drain 91, a sidewall spacer 87, an LDD 91, a polysilicon gate 72D with silicide layer 71. Silicided gate 72D is located atop second gate oxide layer 74, which has a thickness $x_{ox2}$, optimized for the best overall performance and voltage capability for both PMOS 60C and NMOS 60D, comprising CMOS2.

In a preferred embodiment, CMOS2 comprises higher voltage devices than CMOS 1. In this case, the second gate oxide 74 is thicker than the first oxide layer 73, and the second N-type well 68 and second P-type well 69 have a lower surface concentration and greater depth than the first N-type well 66 and first P-type well 67. The polysilicon material in gates 72A, 72B, 72C and 72D can comprise N-type doping for both PMOS 60A and 60C and NMOS 60B and 60D, or alternatively the gate 72A in PMOS 60A and optionally the gate 72C in PMOS 60C may comprise P-type doped polysilicon.

Any number of CMOS devices can be integrated by introducing trenches 70 between and amongst them, either atop a shared floor isolation region, or in an isolated region with its own dedicated floor isolation region electrically biased to a potential different from the potential of other floor isolation regions. By including additional well implants and gate oxides, any number of fully isolated CMOS devices can be integrated and optimized for operation at different voltages and device densities.

Figure 3B:
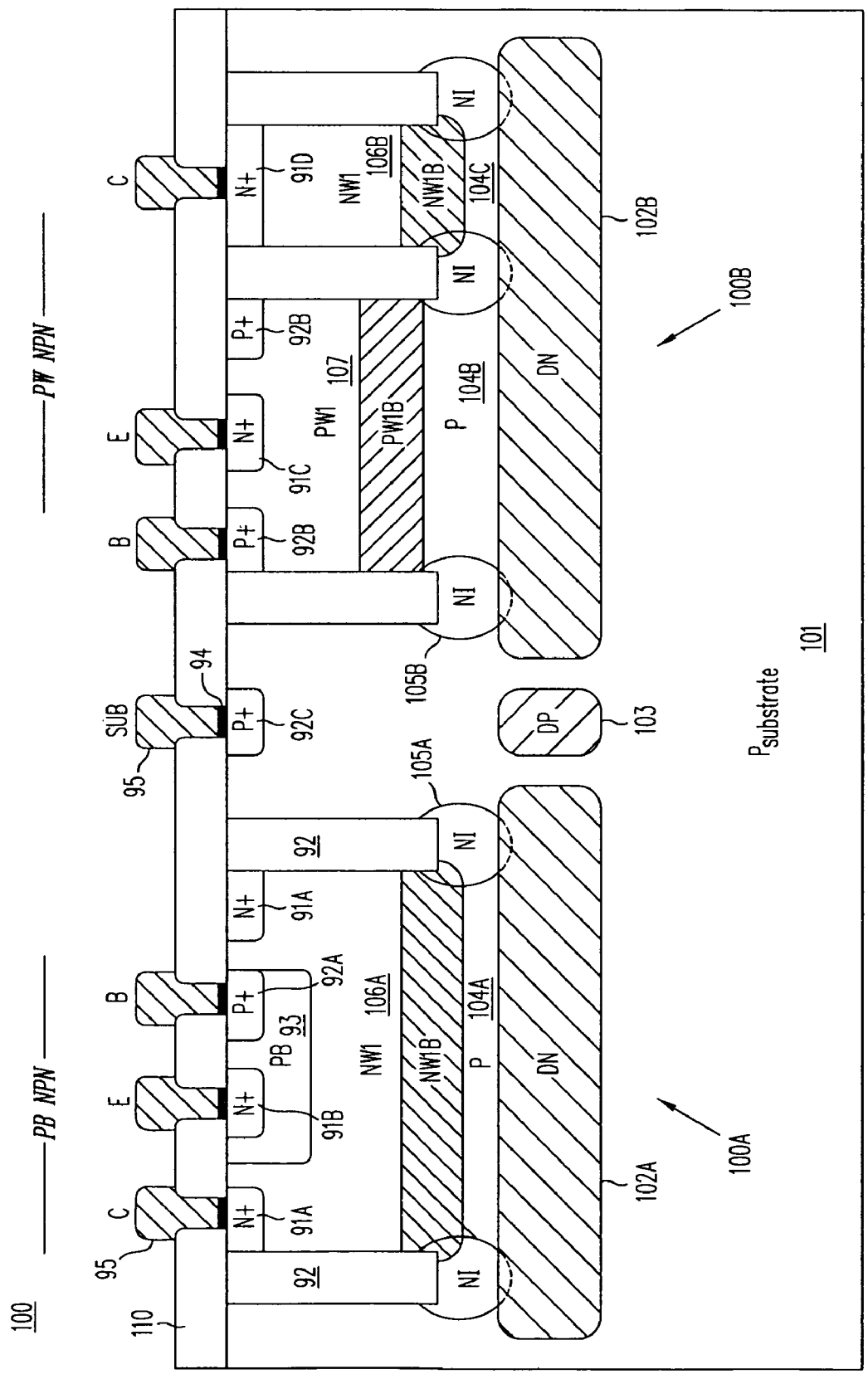
FIG. 3B is a cross-sectional view of P-base and P-well type NPN bipolar transistors fabricated using the Type-II trench isolation process.

FIG. 3B illustrates low-voltage NPN bipolar transistors 100A and 100B, fabricated in a P-type substrate 101. Bipolar devices 100A and 100B can be fabricated monolithically and simultaneously with the CMOS transistors 60A-60D shown in FIG. 3A, using the same substrate, isolation, wells implants, shallow implants and interconnection.

NPN 100A uses a dedicated PB base implant while NPN 100B utilizes one of the available CMOS P-type wells as its base. In NPN 100A, a DN floor isolation region 102A, an NI region 105A and a first N-type well 106A electrically form the collector, shorted to one another through the NI region 105A. The intervening P-type region 104A may very small or may not even exist if the bottom of the deep portion NW1B of N-type well 106A overlaps onto DN floor isolation region 102A. In a preferred embodiment, first N-type well 106A contains a non-monotonic doping profile having a surface portion NW1 with a lighter concentration than the deeper portion NW1B. The lighter portion NW1 reduces depletion spreading into PB base 93 thereby increasing the Early voltage of NPN 100A, while the deep portion NW1B, in combination with DN floor isolation region 102A, helps reduce collector resistance and reduces the collector saturation voltage. In a preferred embodiment, the doping profile of the first N-type well 106A is formed using a phosphorus chain implant of differing energies and doses.

Top-side collector contact is facilitated through an N+ region 91A; contact to the base 93 is achieved through a P+ region 92A; and N+ region 91B serves as the emitter. Device isolation includes dielectric-filled trenches 92 with underlying NI regions 105A circumscribing the entire NPN transistor 10A. Contact is achieved through a metal layer 95 and barrier metal layer 94 touching the P+ region 92A and the N+ regions 91A and 91B through contact windows formed in an ILD layer 110.

In NPN transistor 100B, a DN floor isolation region 102B and an NI region 105B electrically form the collector, contacted from the surface through an N-type well 106B and an N+ region 91D. A P-type well 107 forms the base of the transistor 100B. In a preferred embodiment, the doping profile of P-type well 107 is non-monotonic, comprising at least a top portion PW1 and a deeper portion PW1B, and is formed using a boron chain implant of differing energies and doses. The deeper portion PW1B of first P-type well 107 may have a higher concentration than the top portion PW1. A P-type region 104B may be present beneath the P-type well 107.

Top-side contact to the base (P-type well 107) is made through a shallow P+region 92B. An N+ region 91C functions as the emitter of the NPN transistor. Device isolation includes trenches 90 and NI regions 105B circumscribing the entire NPN transistor. Contact is formed by metal layer 95 and barrier metal layer 94 touching the P+region 92B and the N+ regions 91C and 91D through contact windows formed in ILD layer 110. A deep implanted DP region 103 may be formed between DN floor isolation regions 102A and 102B to suppress leakage due to punch-through.

P-type well 107 may comprise the same doping profile PW1 and subsurface region PW1B as the well optimized for some of the NMOS devices 60B and 60D, described above. By relying on the same P-type well as NMOS transistors 60B and 60D, NPN 100B may be compromised in its performance, with tradeoffs adversely impacting current gain, breakdown voltage, and frequency response. In contrast, the performance of NPN 10A, with its own dedicated P-base implant, can be independently optimized with minimal compromises necessary.

Figure 3C:
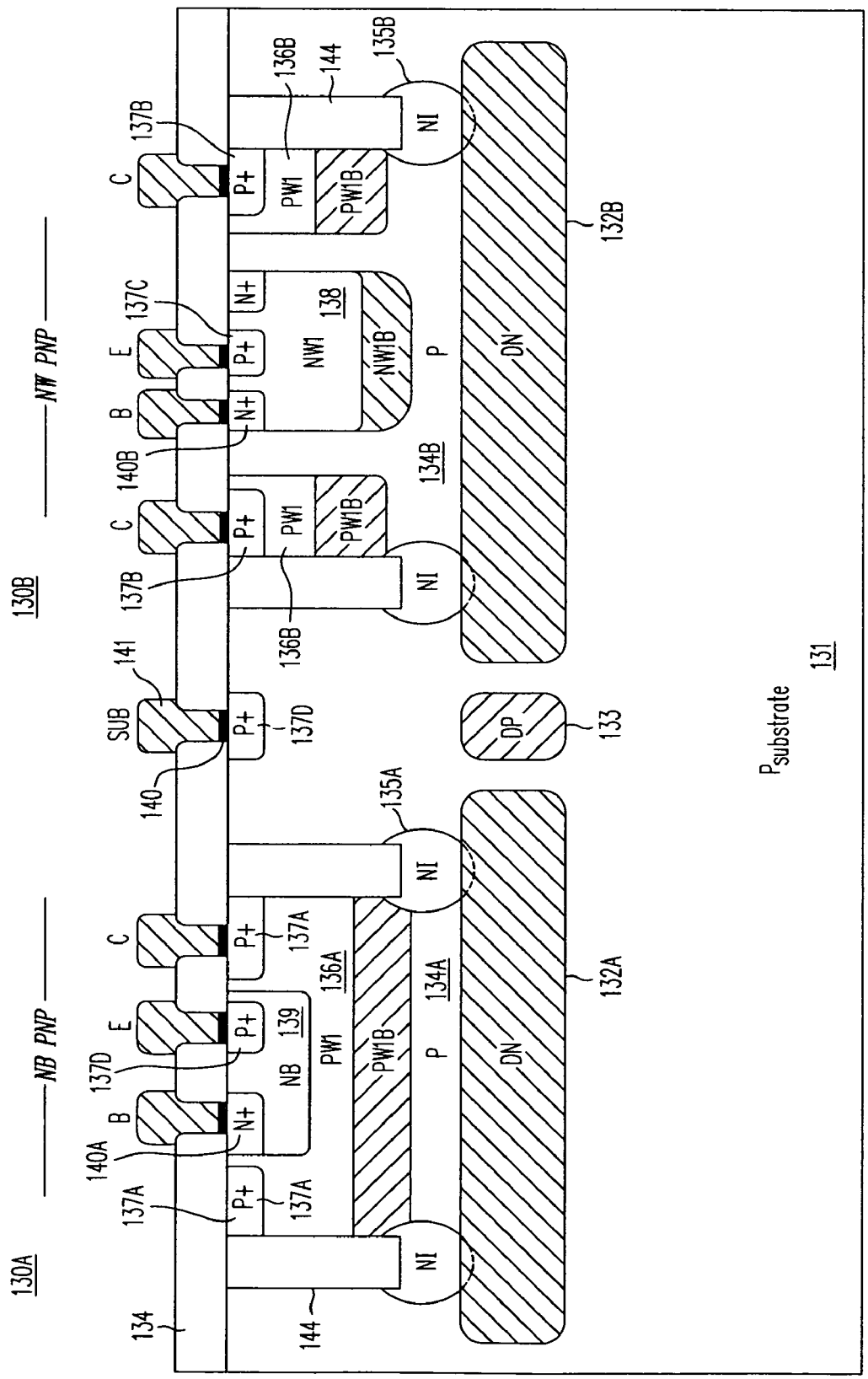
FIG. 3C is a cross-sectional view of N-base and N-well type PNP bipolar transistors fabricated using the Type-II trench isolation process.

FIG. 3C illustrates a cross-sectional view of low-voltage PNP bipolar transistors 130A and 130B, fabricated in a P-type substrate 131. Bipolar transistors 130A and 130B can be fabricated monolithically and simultaneously with the CMOS transistors 60A-60D shown in FIG. 3A and the NPN bipolar transistors 100A and 100B shown in FIG. 3B, using the same substrate, isolation structures, well implants, shallow implants and interconnections.

In FIG. 3C, PNP 130A uses a dedicated NB base implant while PNP 130B utilizes an N-type well as its base. In PNP 130A, a P-type well 136A forms the collector. In a preferred embodiment, P-type well 136A has a non-monotonic doping profile comprising at least a top portion PW1 and a deeper portion PW1B and preferably formed using a boron chain implant of differing energies and doses. A lighter top portion PW1 reduces depletion spreading into NB base 139, thereby increasing the Early voltage $V_A$ of PNP 130A, while the deeper portion PW1B reduces collector resistance, thus lowering the collector voltage where transistor saturation occurs. Alternatively a P-type well having a doping profile different from the doping profile of P-type well 136A may be substituted for P-type well 136A.

Electrical contact to the collector (P-type well 136A) is facilitated through a P+region 137A; contact to base 139 is achieved through a shallow N+ region 140A; and a P+ region 137D forms the emitter. The isolation structure includes a floor isolation region 132A and dielectric-filled trenches 144 with underlying NI regions 135A circumscribing the entire PNP 130A. Contact is achieved by a metal layer 141 and a barrier metal layer 140 touching the P+ regions 137A and 137D and N+ region 140A through contact windows formed in an ILD layer 134.

In PNP 130B, a DN floor isolation region 132B, NI region 135B and trenches 144 electrically isolate the collector (P-type region 134B) from substrate 131. The collector contacts the surface through a P+ region 137B and an optional P-type well 136B. An N-type well 138 forms the base of PNP 130B. In a preferred embodiment, the doping profile of the N-type well 138 is non-monotonic comprising at least a top portion NW1 and a deeper portion NW1B and preferably formed using a phosphorus chain implant of differing energies and doses. P-type well 136B may also be formed with a non-monotonic doping profile as shown, comprising at least a top portion PW1 and a deeper portion PW1B and preferably formed using a boron chain implant of differing energies and doses. A portion of P-type region 134B may be present beneath N-type well 138, but may be negligibly thin, having minimal effect on device behavior.

Top-side contact to the base (N-type well 138) is achieved through a shallow N+ region 140B. A P+ region 137C forms the emitter. The isolation structure includes floor isolation region 132B and trenches 144 with underlying NI regions 135B circumscribing PNP 130B. Contact is achieved by metal layer 141 and barrier metal layer 140 touching the P+ regions 137B and 137C and N+ region 140B through contact windows formed in ILD layer 134. A deep implanted DP region 133 may be present between DN floor isolation regions 132A and 132B to suppress leakage due to punch-through.

PNP 130B utilizes first N-type well 138, which may comprise the same doping profile NW1 and subsurface region NW1B as the N-type well optimized for integrating submicron PMOS 60A or 60C. As a result the vertical dopant profile of the first N-type well 138 would be substantially similar to the vertical dopant profile of well 66 or 68 in PMOS 60A or 60C, respectively. By relying on the same N-type well as PMOS 60A or 60C, the performance of PNP 130B may be compromised. By contrast, PNP 130A, which includes its own dedicated N-type base implant 139, can be independently optimized without compromising the performance of other integrated devices.

The collector of PNP 130B comprises wells 136B which may be formed in the same process step as the P-type well optimized for integrating NMOS 60B or 60D, in which case each of wells 136B would have a vertical dopant profile substantially similar to the vertical dopant profile of 67 or 69 of NMOS 60B or 60D, respectively.

The modular process described is therefore capable of integrating a wide variety of fully-isolated low-voltage CMOS and complementary bipolar (i.e. both NPN and PNP) transistors with minimal high-temperature processing. Layers such as first and second N-type wells in PMOS 60A and 60C, respectively, and the first and second P-type wells in MMOS 60B and 60D, respectively, are reused for maximum flexibility but in a preferred embodiment are optimized for CMOS performance and reliability, while bipolar devices are generally not optimized unless a dedicated base implant is included.

High-Voltage Devices

Figure 4A:
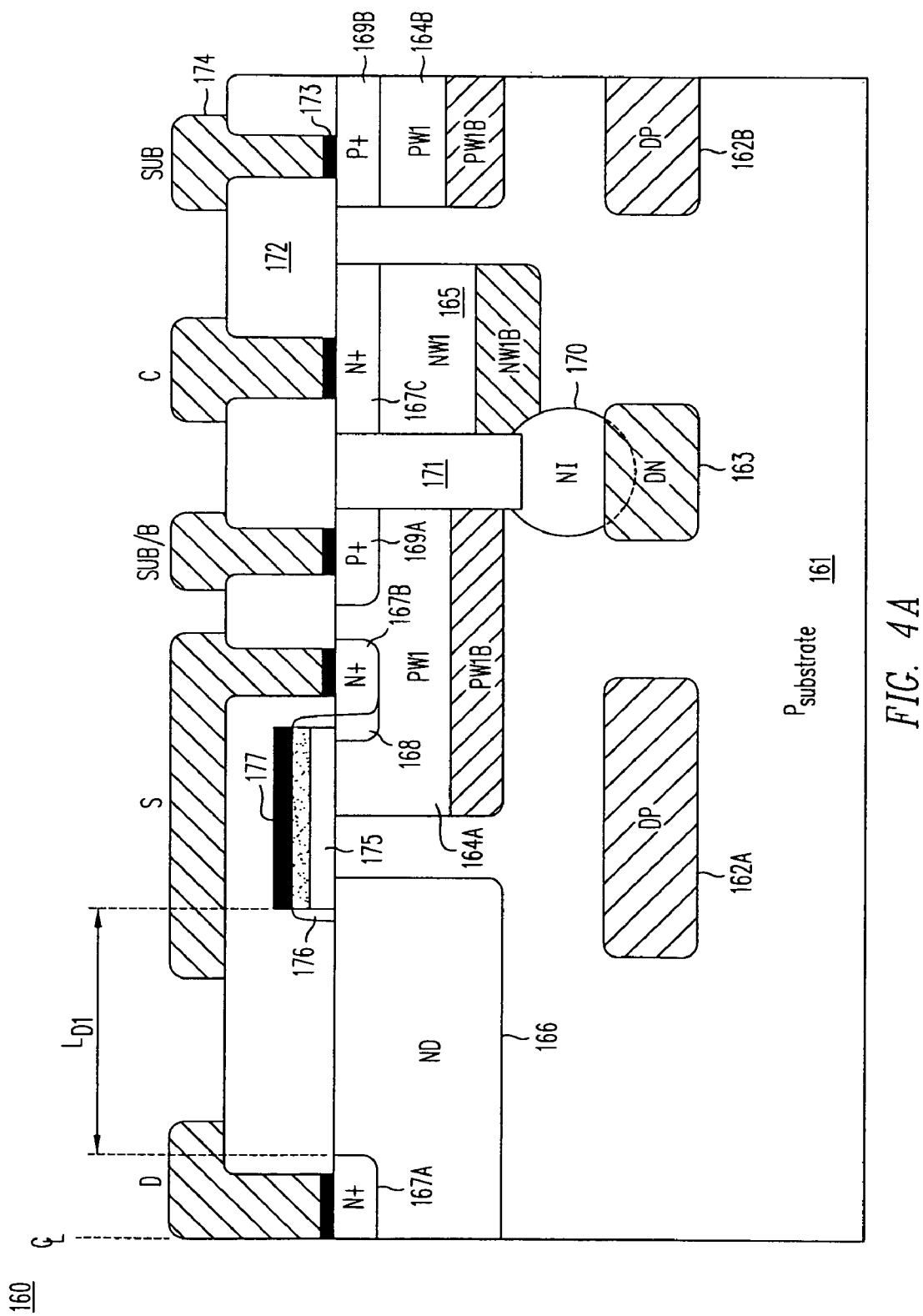
FIG. 4A is a cross-sectional view of a non-isolated high-voltage extended LDD N-channel lateral DMOS device fabricated using the Type-II trench isolation process.
Figure 4B:
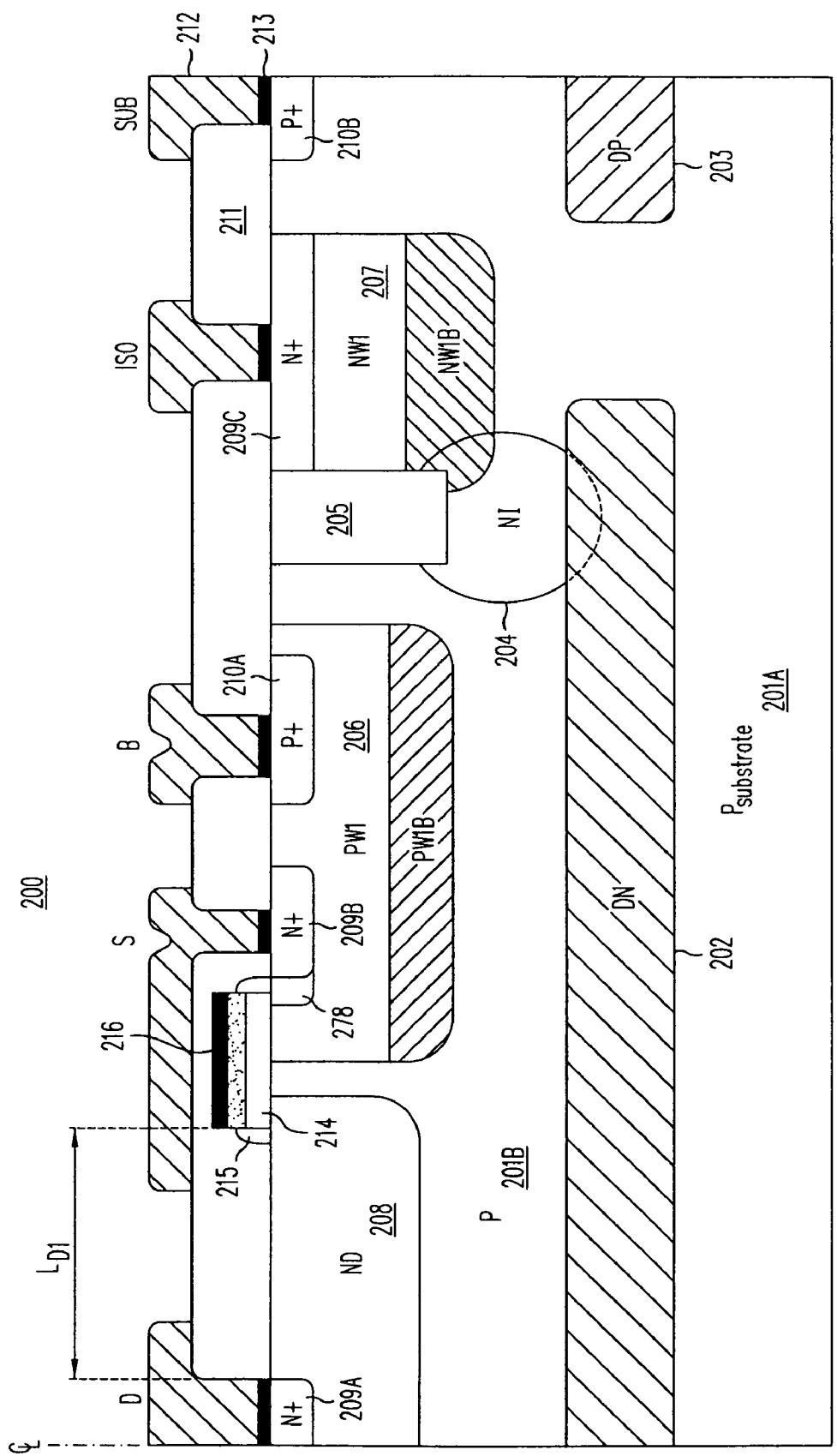
FIG. 4B is a cross-sectional view of a drain-centric isolated high-voltage extended LDD N-channel lateral DMOS device fabricated using the Type-II trench isolation process.
Figure 4C:
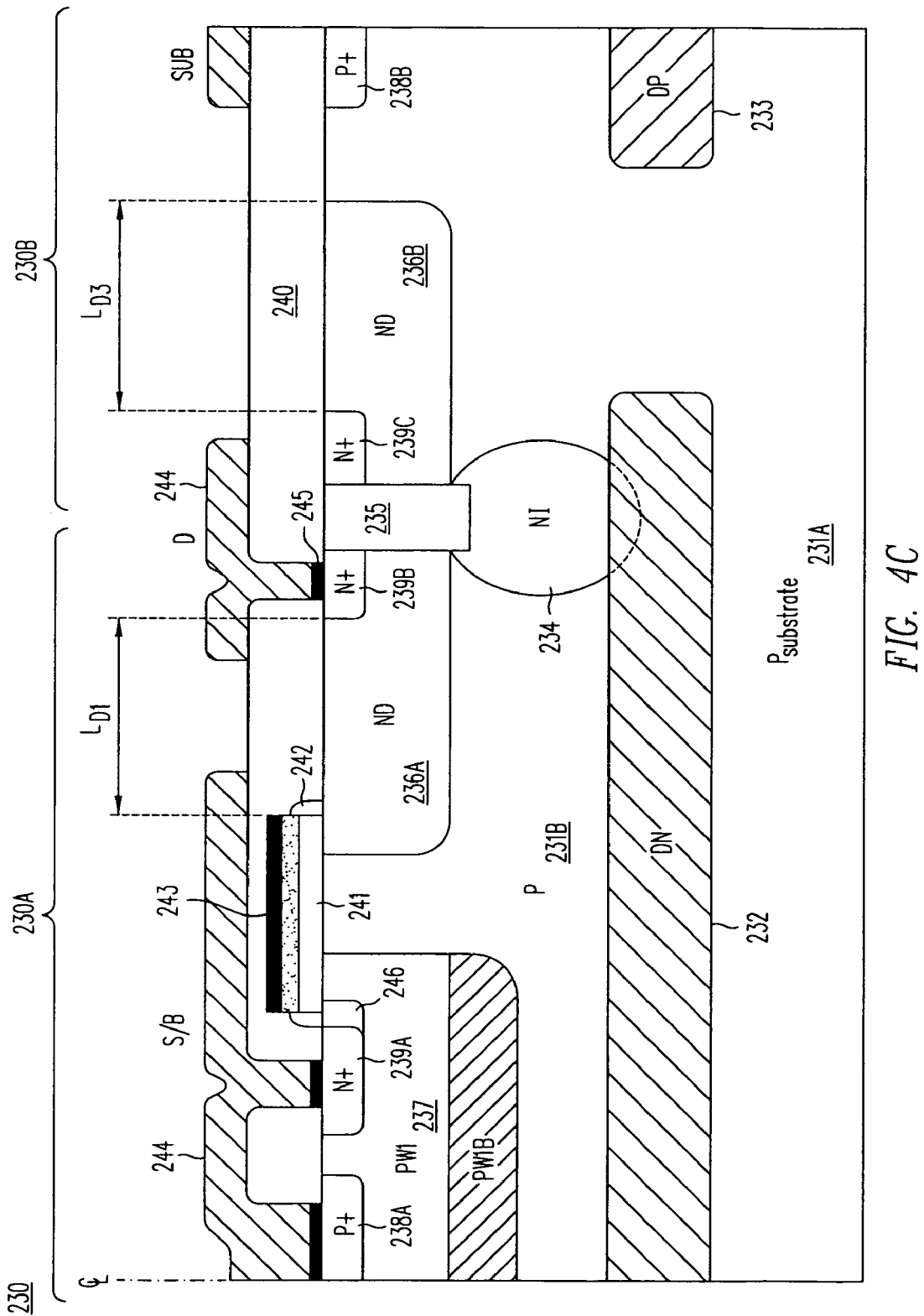
FIG. 4C is a cross-sectional view of a source-centric isolated high-voltage extended LDD N-channel lateral DMOS device fabricated using the Type-II trench isolation process.

FIGS. 4A-4C illustrate several non-isolated and isolated high-voltage N-channel transistors which may be constructed in the disclosed modular BCD process. These devices are formed using a deep implanted N-type drift region ND to relax surface electric fields and enhance device avalanche breakdown voltage capability. The deeper ND layer, unlike the shallow post-polysilicon LDD region used to form 12V drift regions, is not self-aligned to the gate. The deeper junction, when optimized, offers the capability of a lower surface electric field and reduced hot carrier effects than shallow self-aligned drift regions.

FIG. 4A shows a cross-sectional view of a non-isolated N-channel lateral DMOS 160 fabricated in accordance with the disclosed modular process and with minimal high temperature processing. The device comprises an N+ drain region 167A with an N-type drift region 166 of length $L_{D1}$, a silicided gate 177 sitting atop a gate oxide layer 175, and an N+ source contact 167B and P+ body contact 169A. A P-type well 164A extends under gate 177 and forms the LDMOS body. P-type well 164A may comprise a non-monotonic doping profile including at least a top portion PW1 and a deeper portion PW1B or any number of regions comprising implants of varying energy and dose. Deeper portion PW1B may comprise a heavier dose implant and a higher concentration than the upper portion PW1, reducing surface electric fields and impact ionization near the surface. A deep implanted DP region 162A may be included to enhance device ruggedness by moving the highest electric field even farther away from the silicon surface. In a preferred embodiment, N-type drift region 166 is spaced apart from P-type well 164A. By locating P-type well 164A under only a portion of the channel beneath gate 177, the device has two channel concentrations: the heavier concentration of P-type well 164A sets the device threshold and prevents punch-through, while the lighter substrate portion dominates the device breakdown and impact ionization characteristics.

A sidewall spacer 176 and lightly-doped source extension 168 are artifacts of CMOS fabrication and are not beneficially required for proper operation of the DMOS 160. Device fabrication without integrated CMOS could eliminate these features altogether. Because, however, the source extension 168 is relatively highly doped compared to deep drift ND 166, the effect of source extension 168 on the operation of DMOS 160 is negligible.

In a preferred embodiment, N+ drain 167A may be at the center of the DMOS device, circumscribed by gate 177, P-type well 164A, and source 167B. This drain-centric device may also be surrounded by a dielectric-filled trench 171 with an underlying NI sidewall region 170 and a deep N-type region 163 forming an enclosing ring electrically biased to a positive potential above substrate 161 through an N-type well 165 and an N+ region 167C. N-type regions 167C, 165, 170, and 163 may advantageously collect any electrons injected into the substrate in the event that drain 167A becomes forward-biased relative to P-type substrate 161, thus preventing these electrons from interfering with other devices integrated in substrate 161.

Deep P-type region 162A and P-type well 164A suppress unwanted parasitic bipolar conduction in P-type substrate 161 by increasing minority carrier (electron) recombination. Substrate hole-current resulting from electrons recombining in region 162A may flow through P-type well 164A and through an optional outer ground ring comprising a P+ region 169B, a P-type well 164B, and a DP layer 162B. Despite its lack of isolation, non-isolated lateral DMOS 160 suppresses bipolar conduction in three ways, through recombination of minority carriers in DP region 162A, through collection of minority carriers in deep N-type region 163, and through low-impedance "grounding" by P+ substrate contacts 169A and 169B.

FIG. 4B illustrates a fully-isolated N-channel lateral DMOS 200 fabricated in a P-type substrate 201A and an isolated P-type pocket 201B with an N+ drain region 209A, an N-type drift region 208 of length $L_{D1}$, a gate 216, a gate oxide layer 214, an N+ source region 209B, and a P+ region 210A contacting a P-type well 206, which comprises the body region of DMOS 200. P-type well 206 may include at least a top portion PW1 and a deeper portion PW1B or any number of regions comprising implants of varying energy and dose. Deeper portion PW1B may comprise a heavier dose implant and a higher concentration than the upper portion PW1.

A sidewall spacer 215 and a lightly-doped source extension 218 are artifacts of CMOS fabrication and are not beneficially required for proper operation of the DMOS 200. Because of its relatively high doping concentration, the effect of source extension 218 on the operation of high-voltage DMOS device 200 is negligible.

P-type region 201B and the DMOS 200 fabricated within it are isolated from substrate 201A by an isolation structure formed by a high-energy implanted floor isolation region 202, a dielectric-filled trench 205, and an NI region 204, without the need for high-temperature diffusions or epitaxy. Floor isolation region 202 is electrically contacted through an N+ implant 209C, an N-type well 207, and NI region 204, to an ISO electrode formed by a metal layer 212 and an optional barrier metal layer 213 extending through an ILD layer 211. Trench 205 may be located on the inner edge of N-type well 207, as shown, or N-type well 207 may be surrounded on both its inner and outer edges by trench isolation. A P+ substrate connection region 210B with an underlying DP layer 203 and optional P-type well (not shown) may also surround DMOS 200.

The potential of floor isolation region 202 is set by the ISO electrode and may be the same as the potential of the drain region 209A, the P-type well 206, the substrate 201A, or some other fixed or changing potential. The maximum allowable voltage differential between floor isolation region 202 and N-type drift region 208 is limited by punch-through of the intervening P-type region 201B, while the maximum voltage differential between floor isolation region 202 and P-type well 206 is set by the avalanche breakdown voltage between these two regions. If floor isolation region 202 is connected to the same potential as drain region 209A, this punch-through breakdown may be avoided. However, if the floor isolation region 202 is connected to the same potential as substrate 201A, then P-type well 206 may be biased to a potential more negative than substrate 201A.

FIG. 4C shows a cross-sectional view of an LDMOS 230, in which the P-type body, rather than the drain, is located at the center of the device, and the gate and drain surround the body. A P+ region 238A, a P-type well 237, and an N+ source region 239A are surrounded by a gate 243 and a gate oxide layer 241, which is further surrounded by an N-type drift region 236A of length $L_{D1}$ and an N+ drain region 239B.

P-type well 237 may include at least a top portion PW1 and a deeper portion PW1B or any number of regions comprising implants of varying energy and dose. Deeper portion PW1B may comprise a heavier dose implant and a higher concentration than the upper portion PW1.

An active portion 230A of LDMOS 230 is fabricated within a P-type pocket 231B, which is isolated from substrate 231A by a dielectric-filled trench 235, a floor isolation region 232, and an NI region 234. A drift region 236A overlaps onto NI layer 234 thereby biasing floor isolation region 232 to the same potential as drain region 239B. Alternatively, an optional N-type well (not shown) can be included to connect drain region 239B to floor isolation region 232.

For enhanced device ruggedness, an N+ source connection region 239A and a P+ body connection region 238A may be electrically shorted by metal by a metal layer 244, and an optional barrier metal layer 245, extending through openings in an ILD layer 240.

A sidewall spacer 242 and a lightly-doped source extension 246 are artifacts of CMOS fabrication and are not beneficially required for proper operation of the LDMOS 230. Because of its relatively high doping concentration, the effect of source extension 246 on LDMOS 230 is negligible.

In the preferred embodiment shown in FIG. 4C, an inactive region 230B contains an N-type edge termination region 236B and an N+ region 239C, biased at the same potential as drain region 239B, which surround the outer periphery of the isolated DMOS 230, thereby extending its blocking voltage relative to substrate 231A. The entirety of LDMOS 230 may also be surrounded by a P+ ground contact region 238B and/or a deep implanted P-type region DP 233. In an alternate embodiment, the outer edge of the device may end with trench 235.

Figure 5:
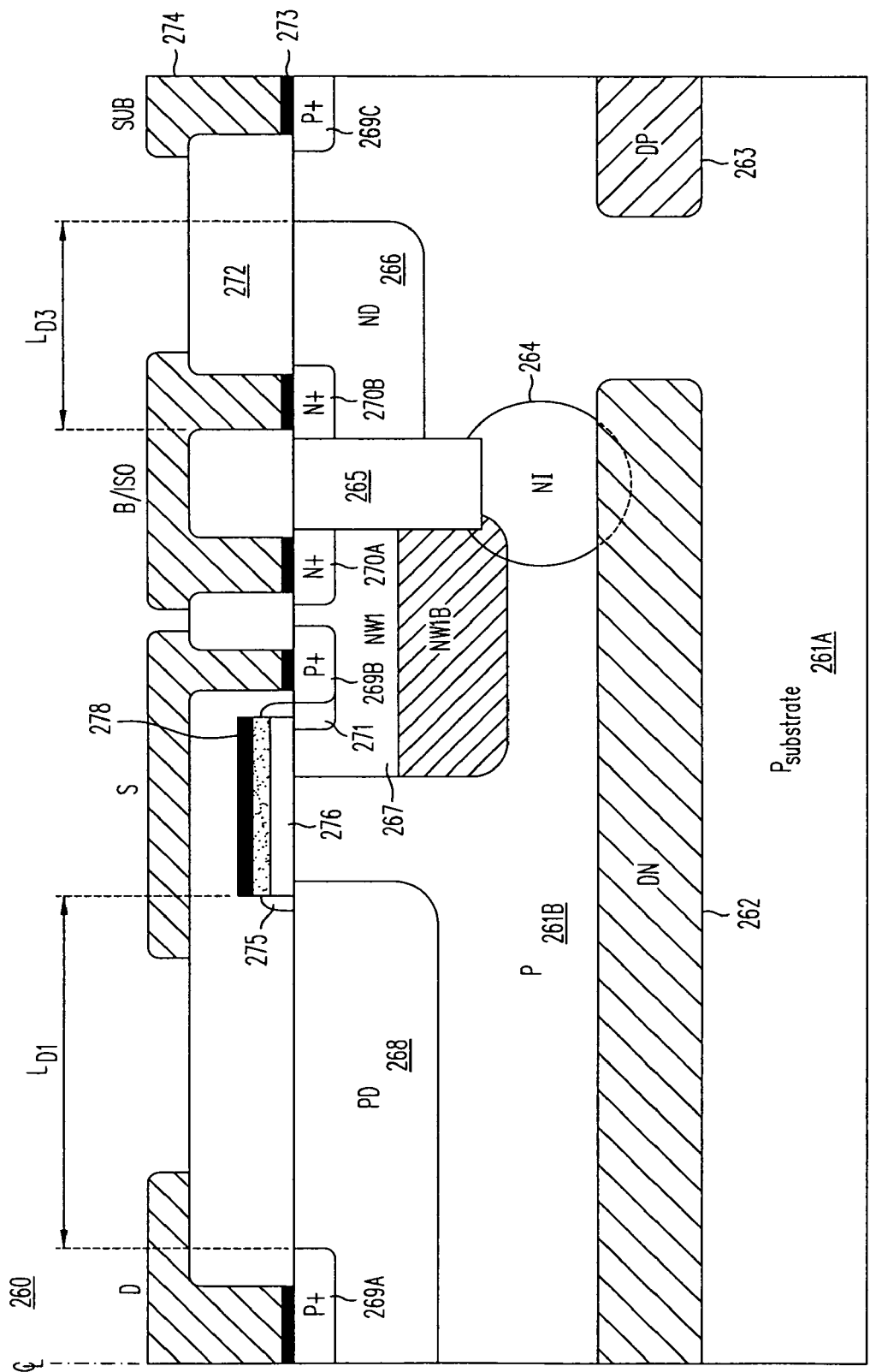
FIG. 5 is a cross-sectional view of a high-voltage extended LDD P-channel lateral DMOS device fabricated using the Type-II isolation process.

FIG. 5 illustrates a cross-sectional view of a P-channel fully isolated lateral DMOS 260. Fabricated in a P-type substrate 261A and an isolated P-type pocket 261B, DMOS 260 comprises a central P+ drain region 269A, an optional implanted deep drift PD 268 of length $L_{D1}$, a gate 278, a gate oxide layer 276, a P+ source region 269B, an N+ implant 270A contacting an N-type well 267 comprising the body region. The N-type well 267 may include a top portion NW1 and a buried or deeper portion NW1B or any number of regions comprising implants of varying energy and dose. Deeper portion NW1B may comprise a heavier dose implant and a higher-concentration than the upper portion NW1.

Alternatively, an N-type well comprising a chain implant with at least a top portion NW2 and a deeper portion NW2B or any number of regions comprising implants of varying energy and dose may be used in place of the N-type well 267. Deeper portion NW2B may comprise a heavier dose implant and a higher concentration than the upper portion NW2 yet deeper portion NW2B may be lighter in doping than the deeper portion NW1B of N-type well 267.

Alternatively, deep drift PD 268, implanted before gate formation, can be replaced by a shallow P-type drift region, implanted later in the process, such as the LDD 86 used in the CMOS2 shown in FIG. 3A. If the implant occurs after polysilicon gate formation, the shallow drift region will be self aligned to the gate, further reducing the risk of overlap of the drift region and the N-type well 267 acting as the body region of LDMOS 260. In another embodiment, deep drift PD 268 does not extend under gate 278 but stops some distance from the edge of gate 278, with a portion of P-type pocket 261B present between deep drift PD 268 and gate 278. The more lightly doped material in P-type pocket 261B can carry the on-state current in LDMOS 260 in the absence of PD region 268, albeit at a higher resistance.

A sidewall spacer 275 and a lightly-doped source extension 271 are artifacts of CMOS fabrication and are not beneficially required for proper operation of the LDMOS 260. Because of its relatively high doping concentration, the effect of source extension 271 on the operation of high-voltage LDMOS 260 is negligible.

P-type pocket 261B and LDMOS 260 fabricated within it are isolated from substrate 261A by an isolation structure that comprises a high-energy implanted DN floor-isolation region 262; a dielectric-filled trench 265; and an NI implant 264 connecting the trench 265 and floor isolation region 262, without the need for high-temperature diffusions or epitaxy. DN floor isolation region 262 is electrically contacted through N+ implant 270A, N-type well 267, and NI region 264. Electrical contact to the device is made via contact windows etched in an ILD layer 272, with metal layer 274, and optional barrier metal layer 273.

As shown, trench 265, located on the outer edge of N-type well 267, may be surrounded by an additional ND high voltage termination region 266 of length $L_{D3}$, contacted by an N+ region 270B and preferably shorted to N-type well 267. A P+ substrate contact region 269C with an optional underlying DP layer 263 and/or an optional P-type well (not shown) may also surround LDMOS 260.

DN floor isolation region 262 and the body region, i.e. N-type well 267, are preferably tied to the high-voltage positive supply rail $V_{DD}$ by the "B/ISO" electrode and are often also connected to source connection "S". The source S and body B/ISO pins may remain separated if, for example, a current sensing source resistor is needed.

Integrated Diodes in Type-II Isolated BCD Process

Figure 6A:
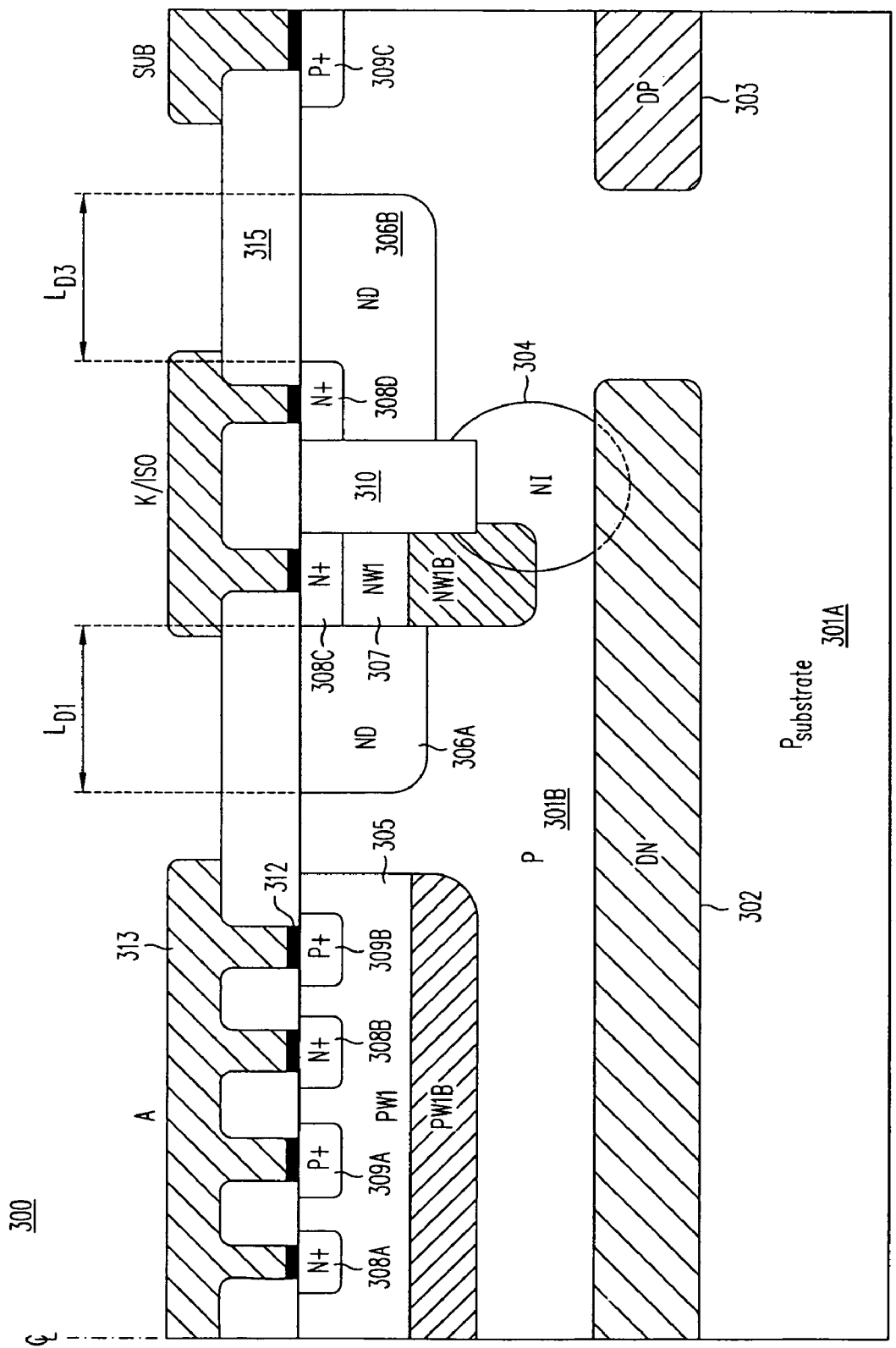
FIG. 6A is a cross-sectional view of an isolated common anode P-N junction rectifier fabricated using the Type-II isolation process.

In many power applications, an isolated high-voltage diode is required for application as a rectifier or for re-circulating inductor current during the break-before-make interval in switching converters. FIG. 6A illustrates one such isolated diode 300 comprising a DN cathode 302 and a segmented anode comprising P+ regions 309A and 309B enclosed within a P-type well 305. In one embodiment of this invention, the doping profile of P-type well 305 is non-monotonic comprising at least a top portion PW1 and a deeper portion PW1B and formed using a boron chain implant of differing energies and doses.

Diode 300 is isolated from substrate 301A by DN layer 302, an N-type well 307 and an NI sidewall region 304. An internal drift region ND 306A of length $L_{D1}$ connected to N-type well 307 is used to improve avalanche breakdown of the isolated diode 300. Electrical contact to diode 300 is performed through contact windows etched in an ILD layer 315, with a metal layer 313, and optional barrier metal layer 312.

The combination of DN layer 302, NI layer 304, N-type well 307, and isolated DN drift region 306A are biased by an electrode "K/ISO" to a potential equal to or above substrate 301A. P+ regions 309A and 309B (the anode) along with parasitic N+ emitter regions 308A and 308B are shorted together and to anode connection "A" which may be forward-biased relative to the cathode or reverse-biased up to the breakdown voltage of P-type well 305 to DN floor isolation region 302. By essentially forming a saturated parasitic NPN bipolar, N+ regions 308A and 308B help reduce the amount of unwanted hole-current leaking into substrate 301A.

As shown, a dielectric-filled trench 310 located on the outer edge of N-type well 307 may comprise the outer edge of the device, or may otherwise be surrounded by an additional high voltage termination region 306B of length $L_{D3}$, contacted by an N+ region 308C and electrically shorted to well 307 via metal layer 313. A P+ substrate connection 309C with an optional underlying DP layer 303 and/or an optional P-type well (not shown) may surround the device. Diode 300 may be symmetrical about the centerline, shown at the left edge of FIG. 6A, in which case the NI sidewall region 304 and the dielectric-filled trench 310 may be annular and laterally surround P-type well 305. (Note: As used herein, the term "annular" is intended to refer to any region or other feature that laterally surrounds another region or feature, whether the shape of the annular region or feature is circular, polygonal or some other shape.)

Figure 6B:
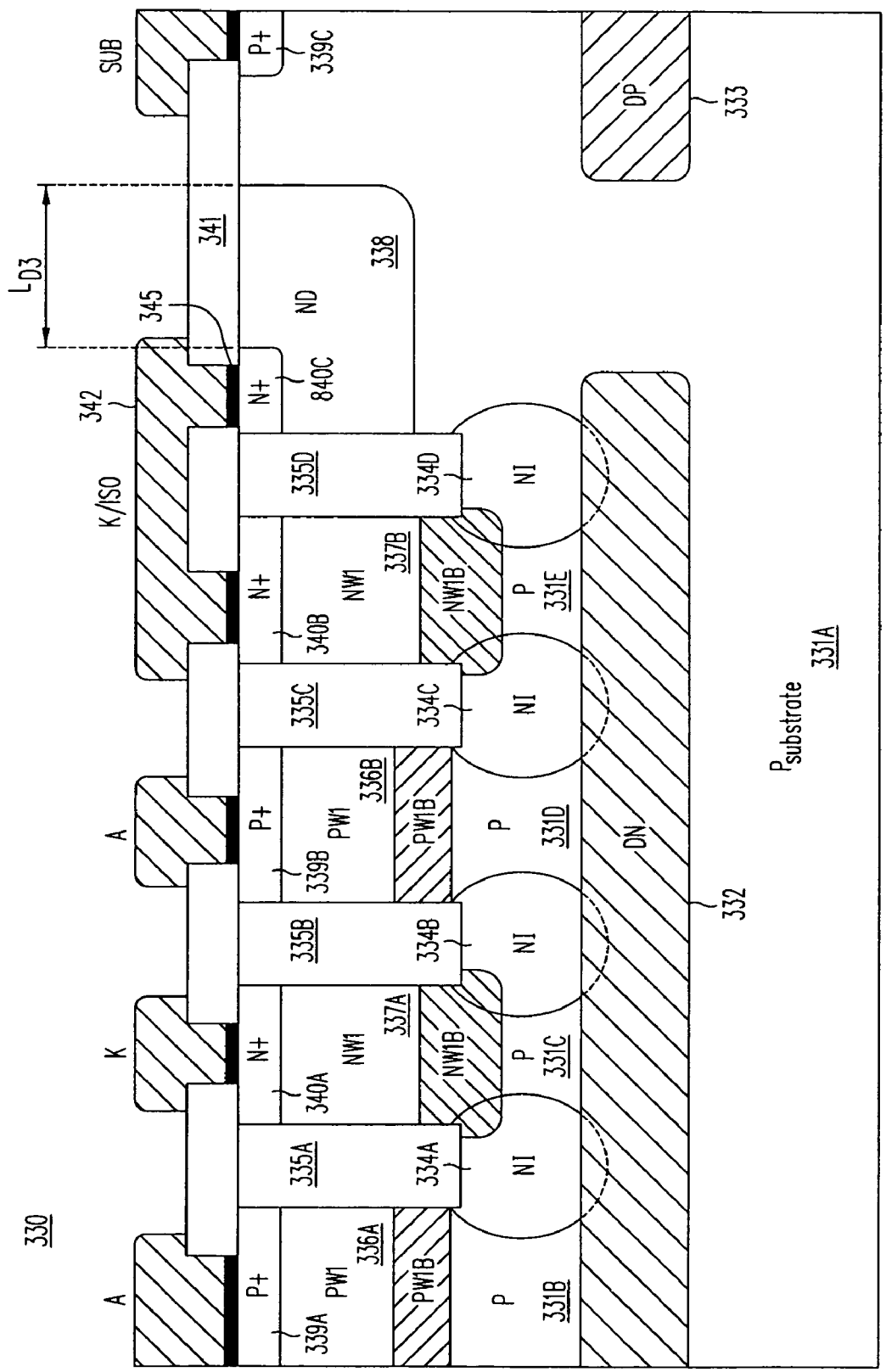
FIG. 6B is a cross-sectional view of an isolated segmented anode P-N junction rectifier fabricated using the Type-II isolation process.

Another isolated diode 330 is illustrated in FIG. 6B, comprising a DN cathode region 332 and a segmented anode comprising P+ regions 339A and 339B enclosed within P-type wells 336A and 336B. In one embodiment, the doping profile of the P-type wells 336A and 336B is non-monotonic, comprising at least a top portion PW1 and a deeper portion PW1B and preferably formed using a boron chain implant of differing energies and doses.

DN layer 332, N-type wells 337A and 337B, N+ regions 340A and 340B, NI regions 334A, 334B, 334C and 334D and dielectric-filled trenches 335A, 335B, 335C, and 335D form the cathode and isolation-structure of the diode 330, surrounding and separating multiple P-type anode regions 339A and 339B and wells 336A and 336B from substrate 331A. The number of anode regions shown in FIG. 6B represents a simplified device for exemplary purposes—many more anode regions could be included to scale the device for higher currents. Electrical contact to the device is performed through contact windows etched in an ILD layer 341, with a metal layer 342, and optional barrier metal layer 343.

In the event that P-type wells 336A and 336B and N-type wells 337A and 337B are not sufficiently deep to overlap onto DN cathode region 332, isolated P-type pockets 331B, 331C, 331D and 331E may result, but with minimal impact on the performance of diode 330. Specifically, P-type pockets 331B and 331D are electrically shorted to P-type wells 336A and 336B respectively, while pockets 331C and 331E are floating, surrounded by N-type material on all sides, i.e. N-type wells 337A and 337B above, NI regions 334A and 334B or 334C and 334D on the sides, and DN cathode region 332 from below.

The internal breakdown voltage of isolated diode 330 is determined by the avalanche breakdown voltage of P-type wells 336A and 336B relative to NI regions 334 and to DN cathode region 332. The external breakdown of DN cathode region 332 to the surrounding substrate 331A, and to the ground ring comprising P+ region 339C and optional DP layer 333 is determined by the outer edge termination of the diode 330. Illustrative of one such termination, exterior ND drift region 338 of length $L_{D3}$ is used to enhance device breakdown by reducing surface electric fields.

JFETs in Type-II Isolated BCD Process

Unlike conventional enhancement-mode MOSFETs which are "normally-off" devices, JFETs conduct drain current even with their gates biased to their source potential, i.e. they conduct at $V_{GS}=0$. Such devices are convenient in forming current sources for start-up circuitry when other transistors are not yet operational.

Figure 7A:
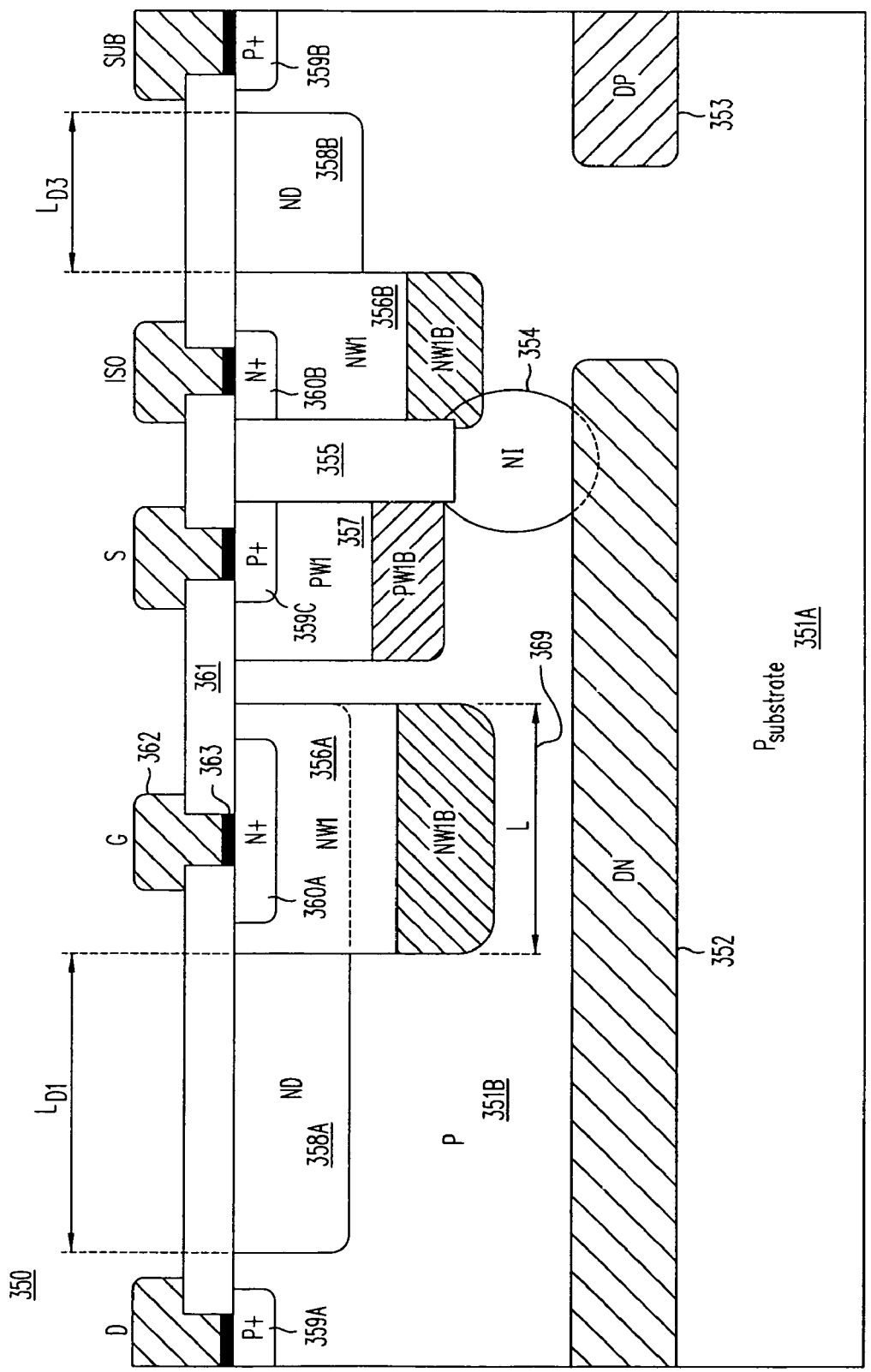
FIG. 7A is a cross-sectional view of an isolated high-voltage P-channel JFET.

FIG. 7A illustrates a high-voltage isolated P-channel JFET 350 including a P+ drain region 359A, a P-type channel region 351B, a top gate comprising an N-type well 356A and an N+ region 360A, a bottom gate comprising a DN floor isolation region 352, and a source comprising a P-type well 357 and a P+ region 359C. In a one embodiment, the doping profile of N-type well 356A is non-monotonic comprising at least a top portion NW1 and a deeper portion NW1B and preferably formed using a phosphorus chain implant of differing energies and doses.

JFET 350 is isolated from a substrate 351A by DN floor isolation region 352, an NI region 354 and an enclosing dielectric-filled trench 355. The bottom gate, DN floor isolation region 352, is electrically biased at the "ISO" potential through an N-type well 356B and an N+ region 360B. The bottom gate bias may vary in potential in proportion with top gate "G" or be biased at a fixed potential.

While the outer edge of the isolated JFET 350 may be defined by trench 355, the device may also be surrounded by a high-voltage termination comprising N-type well 356B, N+ region 360B, and/or lightly-doped ND region 358B of length $L_{D2}$. This outer termination determines the maximum potential JFET 350 can be biased above surrounding P-type substrate 351A. The internal breakdown of isolated JFET 350 is determined primarily by the length $L_{D1}$ of lightly-doped region 358A and the breakdown voltage of the P-I-N junction comprising P+ region 359A, P region 351B and DN floor isolation region 352. The entire diode 350 may be terminated by a P+ substrate ring 359B with an optional underlying DP region 353 and/or a P-type well (not shown). Electrical contact to the device is performed through contact windows etched in an ILD layer 361, with a metal layer 362, and an optional barrier metal layer 363.

Figure 7B:
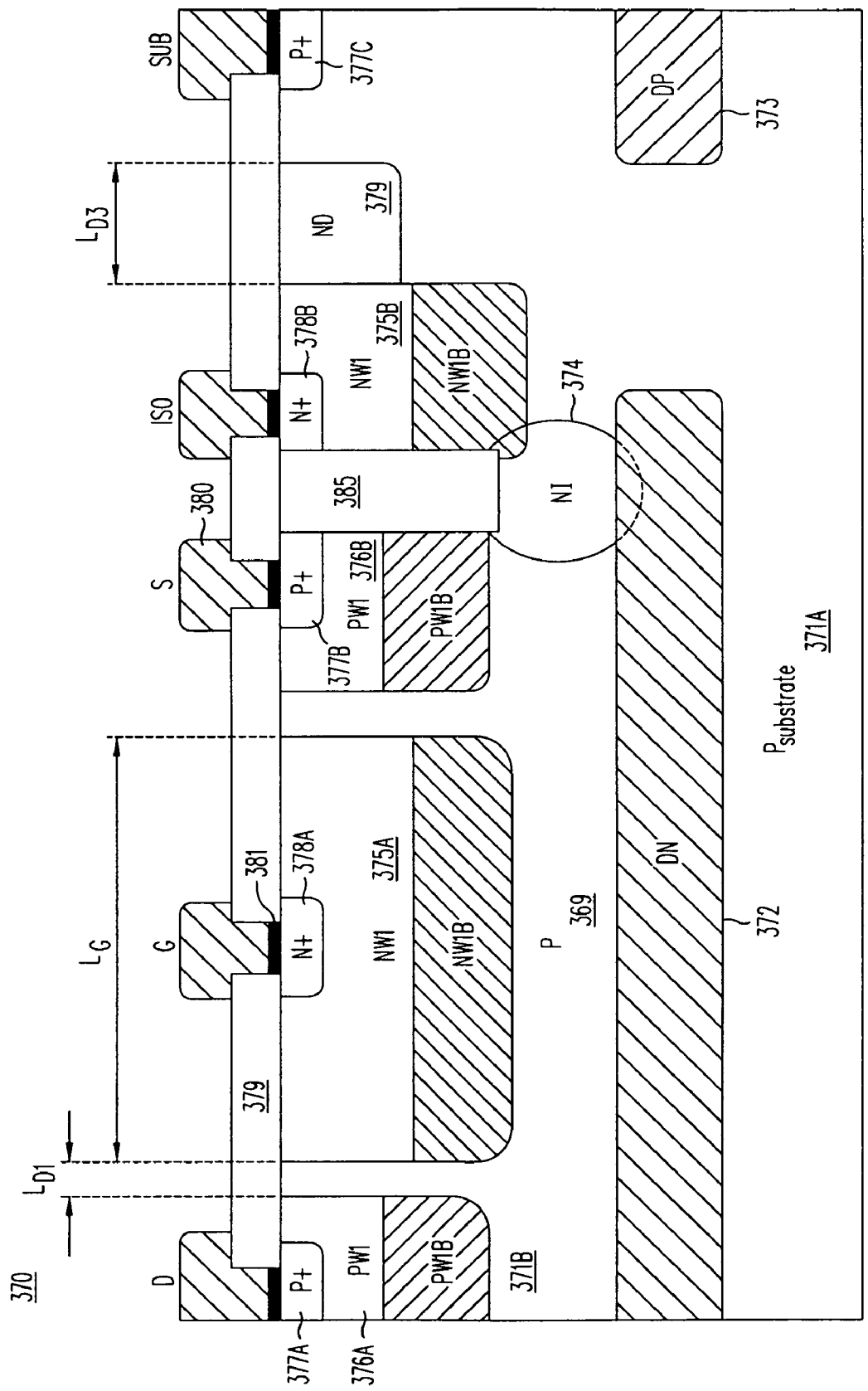
FIG. 7B is a cross-sectional view of an isolated low-voltage P-channel JFET.

FIG. 7B illustrates another isolated P-channel JFET 370, including a P+ drain region 377A with a surrounding P-type well 376A, a P-type channel region 371B, a top gate comprising an N-type well 375A and an N+ region 378A, a bottom gate comprising a DN floor isolation region 372, and a source comprising a P-type well 376B and a P+ region 377B. In one embodiment, the doping profile of the N-type well 375A is non-monotonic comprising at least a top portion NW1 and a deeper portion NW1B and preferably formed using a phosphorus chain implant of differing energies and doses.

JFET 370 is isolated from a substrate 371A by a DN floor isolation region 372, an NI region 374 and an enclosing dielectric-filled trench 385. Bottom gate, DN floor isolation region 372, is electrically biased at the "ISO" potential through an N-type well 375B and an N+ region 378B. The bottom gate bias may vary in potential in proportion with top gate "G" or be biased at a fixed potential.

While the outer edge of the isolated JFET 370 may be defined by trench 385, the device may also be surrounded by a high-voltage termination comprising an N-type well 375B, an N+ region 378B, and a lightly doped ND region 379 of length $L_{D3}$. This outer termination determines the maximum potential JFET 370 can be biased above surrounding P-type substrate 371A. The internal breakdown of isolated JFET 370 is ideally determined by the avalanche voltage of the junction comprising P+ region 377A, P-type well 376A, P region 371B and DN floor isolation region 372. The entire diode 370 may be terminated by a P+ substrate ring 377C with an optional underlying DP region 373 and/or a P-type well (not shown). Electrical contact to the device is performed through contact windows etched in an ILD layer 379, with a metal layer 380, and an optional barrier metal layer 381.

Polysilicon Emitter Bipolar Transistors in Type-II Isolated BCD Process

Bipolar transistors with diffused emitters are limited in their maximum frequency by carrier transport across both the base and emitter regions. A prior art method to improve the high-frequency capability of such devices is to replace the diffused emitter with polysilicon in direct contact with the base region (see, e.g., Michael Reisch, *High-frequency Bipo-* lar Transistors, Springer, 2003). By adjusting the base depth for the ultra-shallow polysilicon emitter, frequencies in the tens of gigahertz can be achieved.

Such polysilicon emitter bipolar transistors can be adapted to fit into the modular low-temperature as-implanted BCD process as disclosed with a minimal number of additional process steps, benefiting from the enhanced isolation capability, the non-monotonic well doping profiles, the sharing of common implants for wells, floor isolation regions, sidewall isolation region, and base contact implants with other devices in the BCD arsenal, and the capability to isolate and "float" any single bipolar device or group of bipolar and CMOS devices at a high voltage above the surrounding substrate potential without changing the manufacturing process.

Unlike many conventional BiCMOS and BCD processes which integrate only high speed NPN transistors, the disclosed modular process has the capability to integrate high-frequency, complementary (i.e. NPN and PNP) bipolar devices. Moreover, in a preferred embodiment, the doping profiles of such bipolar transistors are customized to enhance the "analog" performance of the devices, rather than increasing digital switching speed. Analog optimized characteristics include achieving a relatively constant current gain β over a wide range of collector currents, a high Early voltage $V_A$, a large transconductance $g_m$, and a high gain-bandwidth product.

Figure 8:
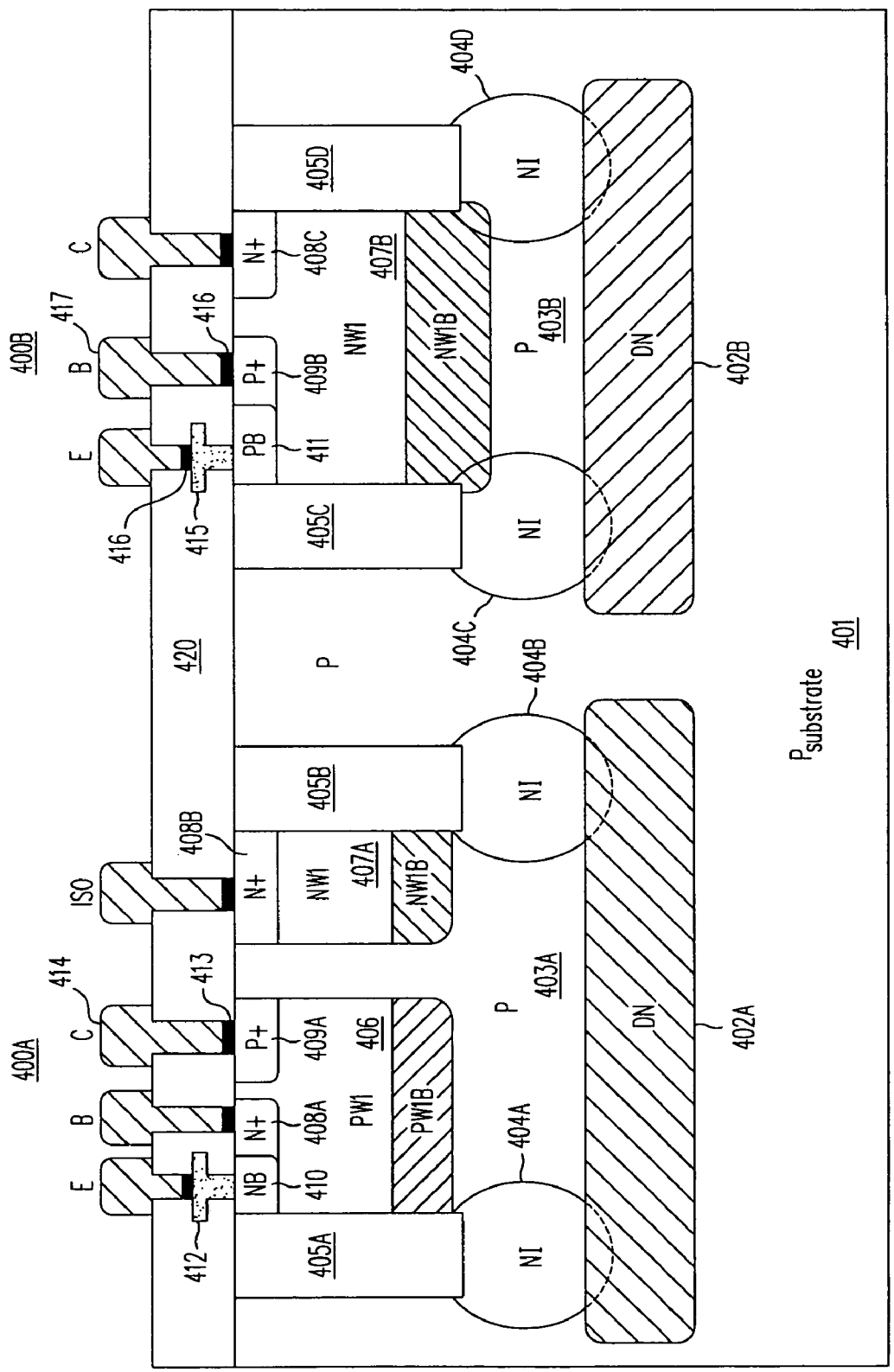
FIG. 8 is a cross-sectional view of PNP and NPN polysilicon-emitter bipolar transistors.

FIG. 8 illustrates an NPN polysilicon emitter bipolar transistor 400B and a PNP polysilicon emitter bipolar transistor 400A. NPN 400B includes an N-type polysilicon-emitter 415 and a P-type base PB 411 formed in an N-type well 407B and isolated from a common P-type substrate 401 by an isolation structure comprising dielectric-filled trenches 405C and 405D; NI regions 404C and 404D, and an implanted DN floor isolation region 402B. DN floor isolation region 402B is electrically connected to the N-type well 407B through overlapping NI regions 404C and 404D. The area of polysilicon-emitter 415 contacting the surface of substrate 401 is determined by a polysilicon emitter mask.

In a preferred embodiment, N-type well 407B contains a non-monotonic doping profile having a surface portion NW1 with a lighter doping concentration than the deeper buried NW1B portion. The lighter doping concentration of surface portion NW1 reduces depletion spreading in PB base 411, thereby increasing the Early voltage $V_A$, while the deeper portion NW1B, in combination with DN floor isolation region 402B helps to reduce collector resistance and improves transistor saturation. In a preferred embodiment, the doping profile of the N-type well 407B is formed using a phosphorus chain implant of differing energies and doses. A P-type floating layer 403B shown between N-type well 407B and DN floor isolation region 402B may be very small or may not even exist if the bottom of N-type well 407B overlaps onto DN floor isolation region 402B.

Top-side collector contact is facilitated through an N+ region 408C; contact to the base is achieved through a P+ region 409B; and N-type polysilicon-emitter 415 forms the emitter. The isolation structure includes dielectric-filled trenches 405C and 405D with underlying NI isolation regions 404C and 404D circumscribing the entire NPN 400B. Contact with NPN 400B is achieved by a metal layer 417 and an optional barrier metal layer 416 extending through contact windows formed in an ILD layer 420.

PNP 400A includes a P-type polysilicon-emitter 412 and an NB base implant 410 formed within a P-type well 406. Top-side collector contact is facilitated through a P+region 409A; contact to the base is achieved via an N+ region 408A. Contact is achieved by a metal layer 414 and optional barrier metal layer 413 extending through contact windows formed in an ILD layer 420.

A DN floor isolation region 402A, NI regions 404A and 404B, and dielectric-filled trenches 405A and 405B isolate a P-type pocket 403A and a P-type well 406 from substrate 401. DN floor isolation region 402A is biased through an N-type isolation contact well 407A and an N+ region 408B.

In a preferred embodiment, P-type well 406 has a non-monotonic doping profile comprising at least a top portion PW1 and a deeper portion PW1B and preferably formed using a boron chain implant of differing energies and doses. The P-type pocket 403A may very thin and may not even exist if the bottom of P-type well 406 overlaps onto DN floor isolation region 402A. The lighter doping of the top portion PW1 reduces depletion spreading in NB base 410, thereby increasing the Early voltage $V_A$ while the deeper portion PW1B reduces collector resistance and improves transistor saturation.

Bipolar devices NPN 400A and PNP 400B can be fabricated monolithically and simultaneously with the CMOS transistors 60A-60D shown in FIG. 3A, using the same substrate, isolation, wells implants, shallow implants and interconnection.

Type-II Isolated BCD Process Design Considerations

The voltage capability of isolated devices in Type-II trench isolation is determined by the relative junction depths of the implanted regions. Unlike other trench isolation schemes, the maximum breakdown voltage of an isolated device is not determined by the trench depth but by the depth and implant energy of the deep implanted DN floor isolation region.

Figure 9B:
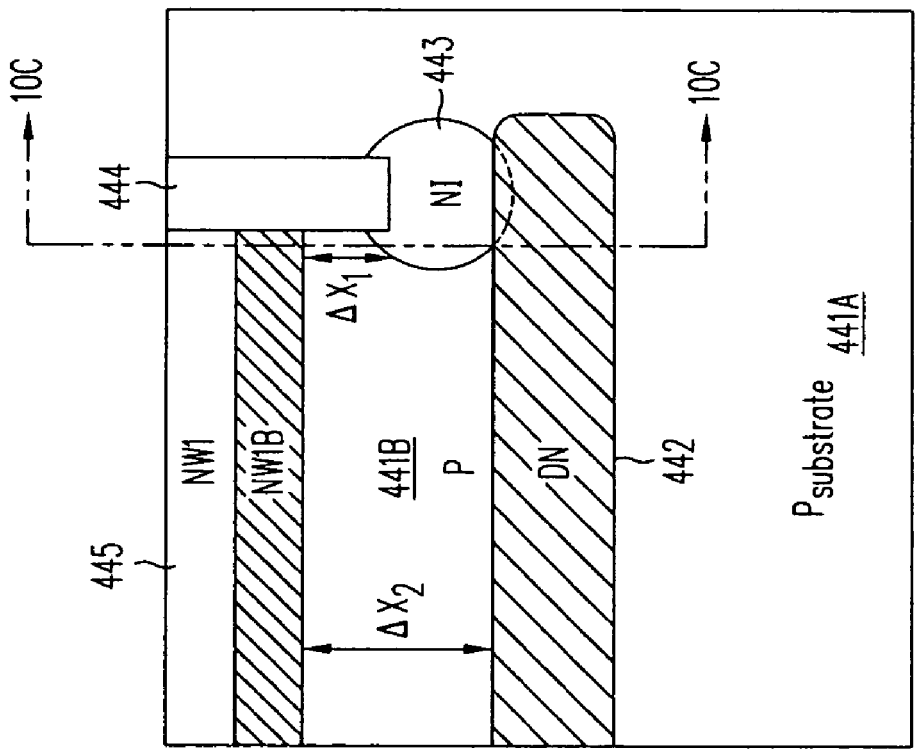
FIGS. 9A-9F illustrate design rules relating to Type-II isolation, including the separation between a surface P+ region and a DN floor isolation region (FIG. 9A); the N-type well approaching the NI region (FIG. 9B); the N-type well touching the NI region (FIG. 9C); the N-type well substantially overlapping the NI region (FIG. 9D); the N-type well overlapping the DN floor isolation region (FIG. 9E); and the formation of a P-type pocket above the N-type well (FIG. 9F).
Figure 9A:
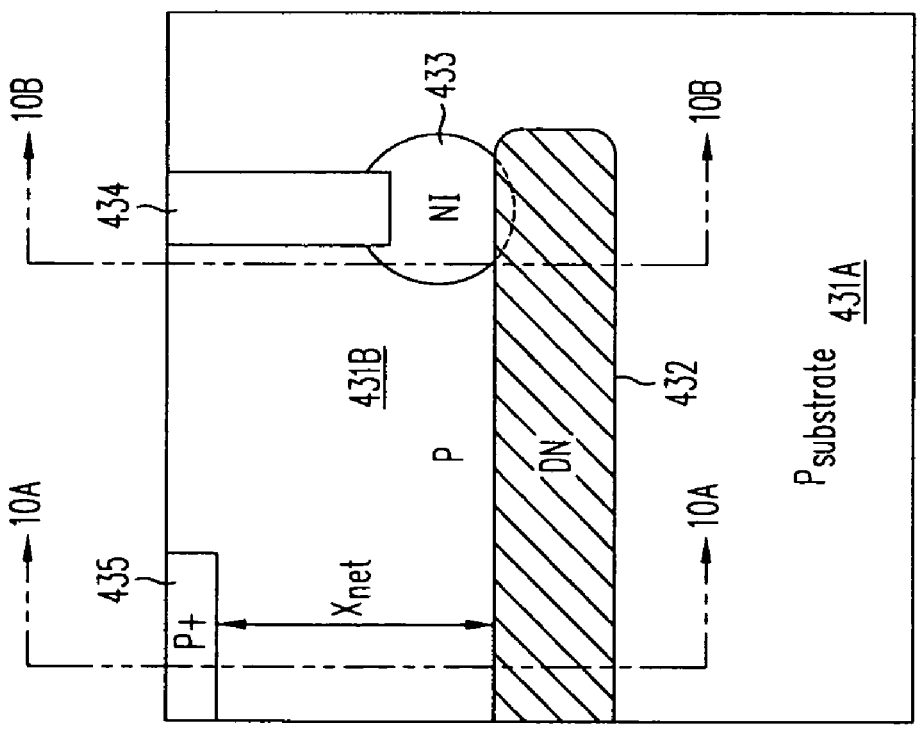

As illustrated in FIG. 9A, the voltage capability of Type-II isolation typically exceeds other trench isolation schemes, because the NI isolation region 433 implanted into the bottom of trench 434 before it is filled, bridges the gap between the top of DN floor isolation region 432 and the bottom of trench 434, eliminating the requirement for deep trench etching and filling.

An isolated device's maximum voltage capability is limited by the one-dimensional avalanche breakdown of the junction formed by P+ region 435, P-type pocket 431B, and DN floor isolation region 432. Depending on the doping concentration of P-type pocket 431B, the mechanism of avalanche breakdown may be P-N junction avalanche or P-I-N reach-through breakdown. If the doping of isolated P-type pocket 431B is sufficiently concentrated, the depletion region of the P-N junction formed between DN floor isolation region 432 and P-type pocket 431B under electrical reverse-bias will avalanche before the depletion region ever reaches P+ region 435. This can be mathematically expressed as $x_D(BV)<x_{net}$, where $x_D(BV)$ is the width of depletion spreading in P-type pocket 431B at the onset of avalanche breakdown at a voltage BV and $x_{net}$ is the "net thickness" between P+ region 435 and DN floor isolation region 432. In such instances, the breakdown voltage is determined primarily by the doping concentration of DN floor isolation region 432 and the doping concentration of the isolated P-type pocket 431B, which is equivalent to the doping concentration of substrate 431A.

Alternatively, if P-type pocket 431B is doped lightly, the depletion region "reaches through" P-type region 431B, i.e. $x_D(BV)>x_{net}$. Fully depleted, the lightly-doped P-type pocket 431B behaves similar to an in intrinsic region in a P-I-N diode. As a result, the breakdown voltage is linearly proportional to the thickness $x_{net}$ of lightly doped region 431B. This can be mathematically approximated as $BV \approx E_{crit} \cdot x_{net} + BV_0$, where $E_{crit}$ is the critical avalanche electric field of silicon, ranging from 20 to 35 V/μm depending on concentration, and $BV_0$ is a linear fitting parameter approximating the breakdown of the P-N junction when is the intrinsic layer has zero thickness, i.e. $x_{net}=0$.

In the disclosed low-temperature process, the as-implanted doping profile accurately sets the maximum breakdown, avoiding the variability coming from high-temperature diffusion. For a fixed phosphorus dose, the DN implant's depth and hence the breakdown voltage BV is linearly proportional to implant energy. For an implant of 2 to 2.5 MeV, breakdown voltages range from 20 to 35 volts, corresponding to approximately a 1 micron net thickness of P-type pocket 431B. While this behavior linearly scales to thicker layers and higher voltages, the maximum energy of commercially available ion implanters today limits this breakdown voltage to tens of volts.

As shown in FIG. 9B, the combined depth of dielectric-filled trench 444 and trench bottom NI region 443 must great enough that NI implant 443 overlaps onto DN floor isolation region 442 to complete the isolation of P-type pocket 441B from substrate 441A. Given these factors, the depth of N-type well 445 is bounded by several considerations. If N-type well 445 is implanted too shallow, it will not overlap NI region 443, i.e. $\Delta x_1>0$, and DN floor isolation region is undesirably left electrically floating, subject to unwanted parasitic and transient phenomena. If $\Delta x_1>0$, then necessarily $\Delta x_2>0$, floating P-type pocket 441B separates N-type well 445 from DN floor isolation region 442, and the resistance of N-type well 445 is not reduced by the presence of DN floor isolation region 442. Without overlapping the highly-doped DN floor isolation region 442, achieving low resistivity in N-type well 445 depends solely on the non-monotonic doping profile of N-type well 445, where N-type well 445 comprises a chain-implanted well with a lower portion NW1B, higher in concentration than an upper portion NW1. Achieving a low well resistivity is beneficial to prevent parasitic CMOS latch-up, an unwanted and potentially damaging thyristor effect, but threshold- and breakdown-voltage considerations limit the maximum surface concentration of the N-type well 445.

Figure 9D:
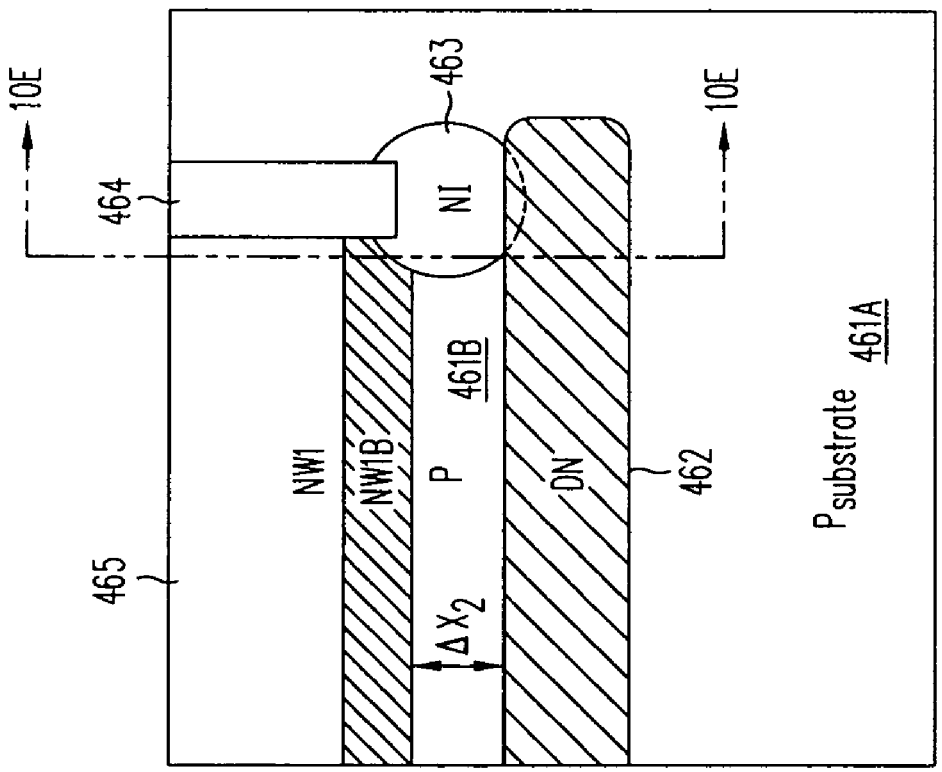
Figure 9C:
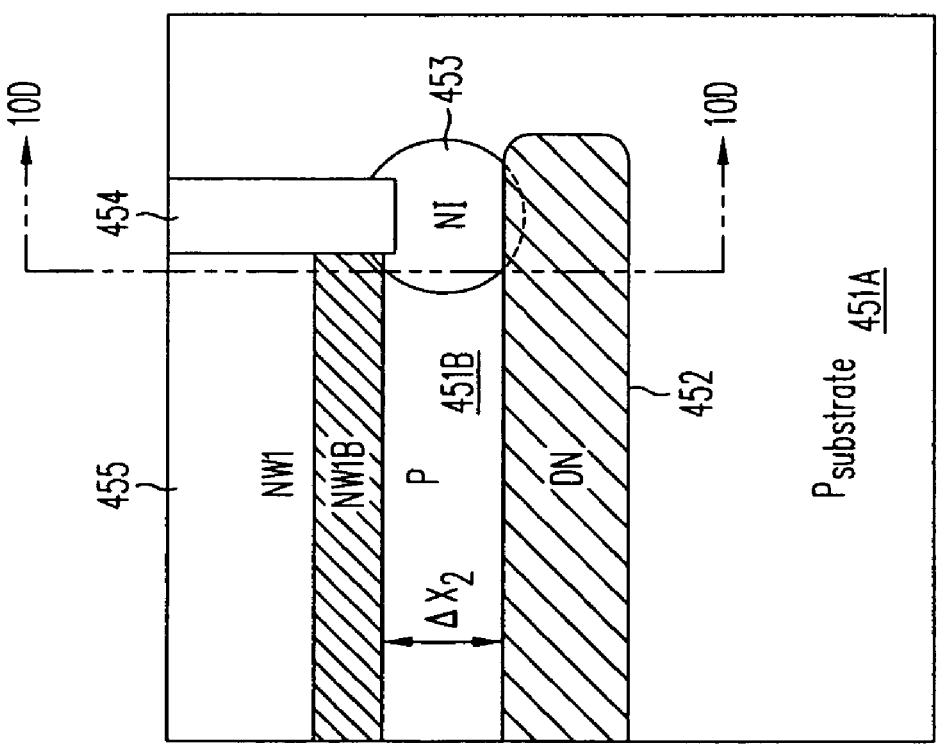

In FIG. 9C, an N-type well 455 is implanted to a greater depth than N-type well 445, such that the bottom portion of well 455 extends vertically to a depth below dielectric-filled trench 454 and overlaps onto NI region 453, i.e. using the previous definition, $\Delta x_1<0$. While this doping profile is preferred over that of the structure in FIG. 9B, floating P-type pocket 451B separates N-type well 455 from the top of DN floor isolation region 452, i.e. $\Delta x_2>0$, so that the presence of the floor isolation region 452 does not reduce the resistivity of N-type well 455.

FIG. 9D illustrates a further improvement, where the bottom of an N-type well 465 is implanted deeper than dielectric-filled trench 464 and substantially overlaps NI region 463. Provided that the thickness of intervening P-type pocket 461B is very small, i.e. in the limit as $\Delta x_2 \to 0$, then N-type well 465 "punches through" to DN floor isolation region 462 with very little voltage, and the resistivity of N-type well 465 is beneficially reduced.

Figure 9F:
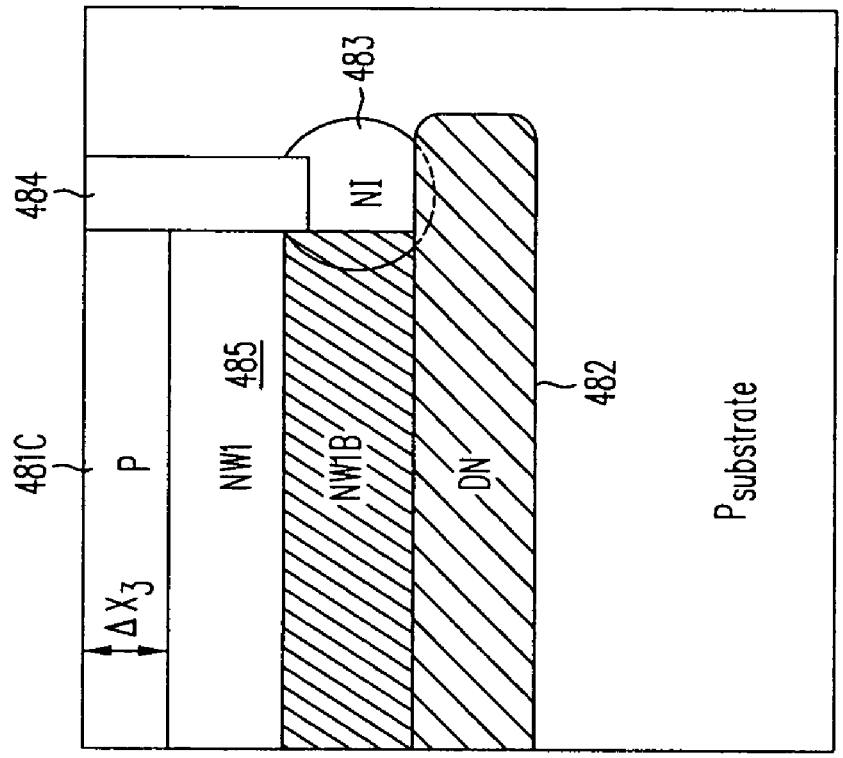
Figure 9E:
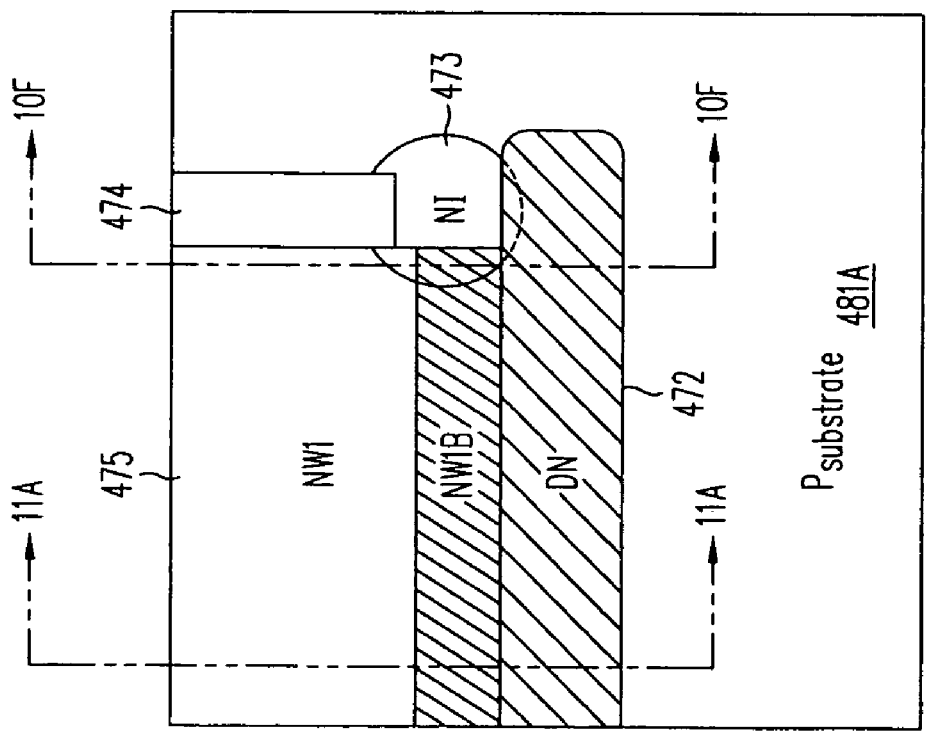

In a preferred embodiment of this invention, illustrated in FIG. 9E, an N-type well 475 overlaps onto both DN floor isolation region 472 and NI region 473, and has a lighter-doped top portion NW1 extending along the entire vertical dimension (depth) of dielectric-filled trench 474, from the surface of substrate 481A to a deeper portion NW1B of N-type well 475. The combination of the deeper portion NW1B of well 475 overlapping DN floor isolation region 470 reduces the resistivity of N-type well 475 substantially, improving latch-up and snap-back breakdown without adversely impacting threshold or lowering the voltage capability of CMOS devices (not shown) formed within N-type well 475.

FIG. 9F illustrates an isolation arrangement similar to that shown in FIG. 9E, but where the shallowest implants of N-type well 485, i.e., the implant or implants forming the top portion NW1 of N-type well 485 are too deep to prevent the unwanted formation of a P-type layer 481C of a depth $\Delta x_3$ atop portion NW1. To avoid this problem, either the implant energy of the shallowest phosphorus implant into N-type well 485 can be reduced, or an additional lower energy implant can be added to the well's chain of implants.

In conclusion, Type-II trench isolation avoids the need for deep trench sidewall isolation by introducing an intervening NI layer overlapping and bridging the gap between the bottom of a trench and the top of the high-energy implanted DN floor isolation region, enabling the use of deeper, higher energy floor isolation. The deeper floor isolation places additional design considerations on the formation of any isolated N-type well. The N-type well preferably should include a deep portion overlapping or nearly overlapping the DN floor isolation region to avoid the formation of an unwanted floating P-type region, or the floating P-type region should be kept as thin (vertically) as possible so that the DN floor isolation region and the N-type well "punch-through" to each other and behave electrically similar to overlapping implanted regions.

The aforementioned criteria for forming isolated N-type wells in Type-II trench isolation can further be understood by analyzing the one-dimensional dopant profiles shown in FIG. 10, illustrating doping concentration N(x) versus depth x below the surface of the substrate. The depth x referenced to the substrate surface at x=0. For example, FIG. 10A illustrates a one-dimensional dopant profile corresponding to the structure of at cross section 10A-10A in FIG. 9A with P+ region 435 (represented by dopant profile 503), P-type isolated pocket 431B (represented by dopant profile 502), DN floor isolation region 432 (represented by dopant profile 504), and P-type substrate 431A (represented by dopant profile 501). The net isolation thickness $x_{net}$ is illustrated as the separation between shallow P+ region 435 and DN floor isolation region 504. As shown, the dopant profile is defined perpendicular to the substrate surface, parallel to the trench 434. This particular profile is measured sufficiently far from the trench that the presence of the NI trench implant is not present.

Figure 10A:
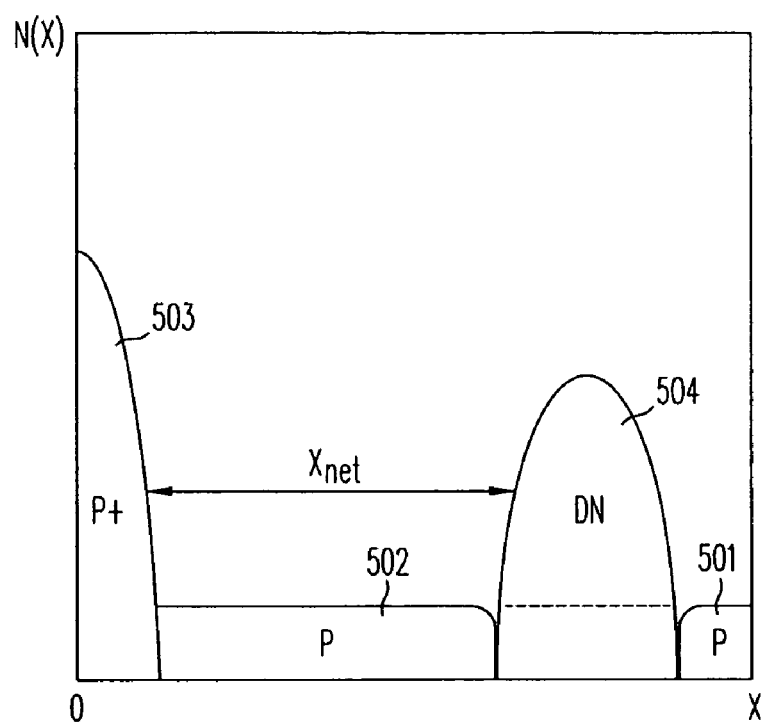
FIGS. 10A-10F are graphs illustrating dopant profiles at various vertical cross sections of FIGS. 9A-9F.
Figure 10B:
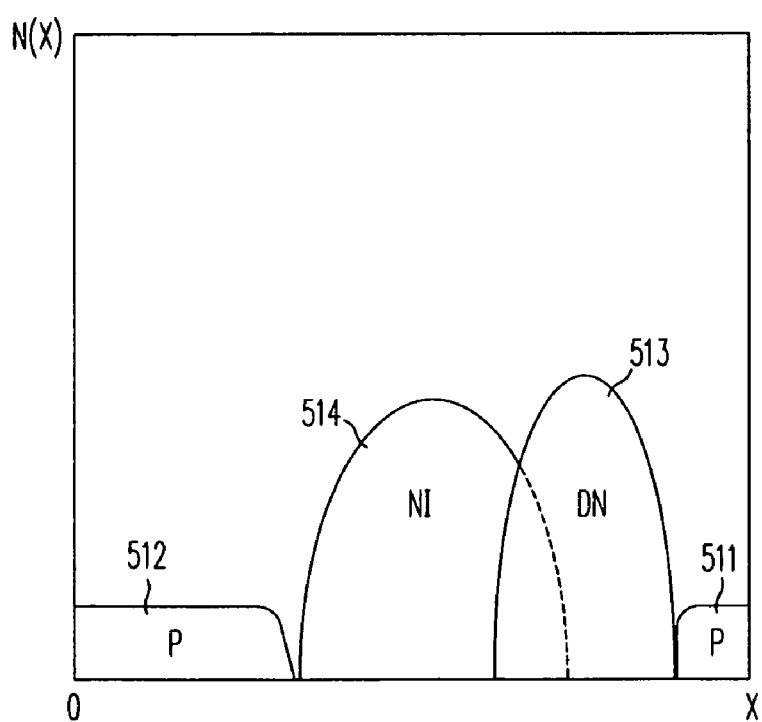

FIG. 10B illustrates the dopant profile at cross section 10B-10B of FIG. 9A adjacent to the trench 434, where the NI region 433 is present but where the shallow P+region 435 is absent. Isolated P-type pocket 431B along the trench (represented by dopant profile 512) sits atop NI region 433 (represented by dopant profile 514) which in turn overlaps DN floor isolation region 432 (represented by dopant profile 513), formed in P-type substrate 431A (represented by dopant profile 511). The peak concentration of the NI region 433 (profile 514) is actually formed at the trench bottom, but lateral straggle from ricochets during implantation spread the implant laterally to a width slightly greater than the trench itself.

Figure 10C:
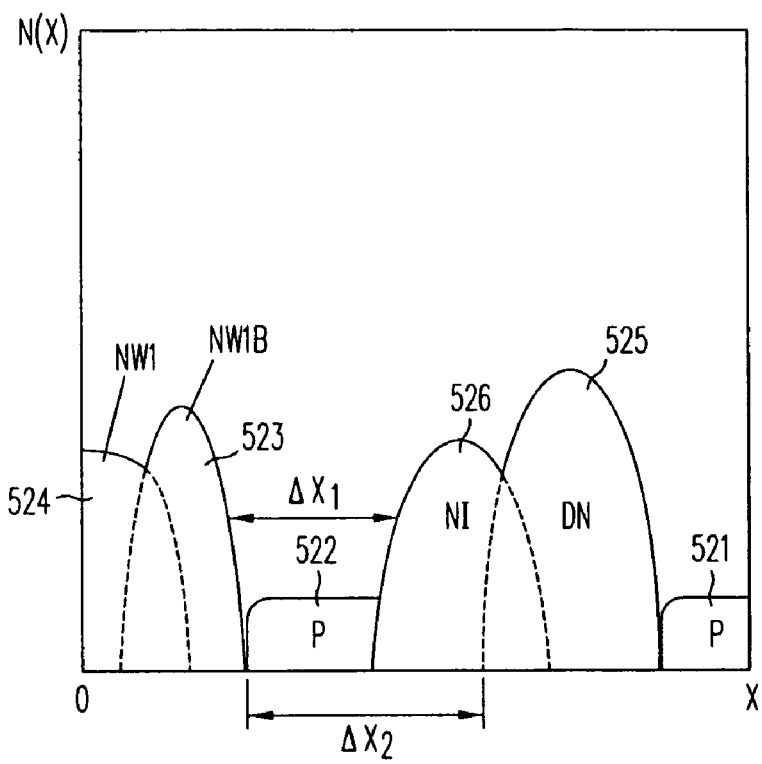

FIG. 10C illustrates the dopant profile at cross section 10C-10C adjacent to the trench 444 of the isolation structure shown in FIG. 9B where the N-type well 445 does not overlap onto the NI region 443 or the DN floor isolation region 442. As shown, DN floor isolation region 442 (represented by dopant profile 525) formed in P-type substrate 441A (represented by dopant profile 521) is overlapped by NI region 443 (represented by dopant profile 526). N-type well 445 comprises an upper portion NW1 (represented by dopant profile 524) and a deeper portion NW1B (represented by dopant profile 523). The combined dopant profiles of upper portion NW1 and deeper portion NW1B indicate the overall dopant profile of N-type well 445 is non-monotonic. As shown in FIG. 10C, the maximum doping concentration in deeper portion NW1B is greater than the maximum doping concentration in upper portion NW1. An intervening P-type pocket 441B (represented by dopant profile 522) separates the bottom of deeper portion NW1B (profile 523) from NI region 443 (profile 526) by a distance $\Delta x_1$. Also illustrated in FIG. 10C, the gap between deeper portion NW1B (profile 523) and DN floor isolation region 442 (profile 525) in cross sections where NI region 443 is not present has a distance $\Delta x_2$ with greater spacing than $\Delta x_1$.

Figure 10D:
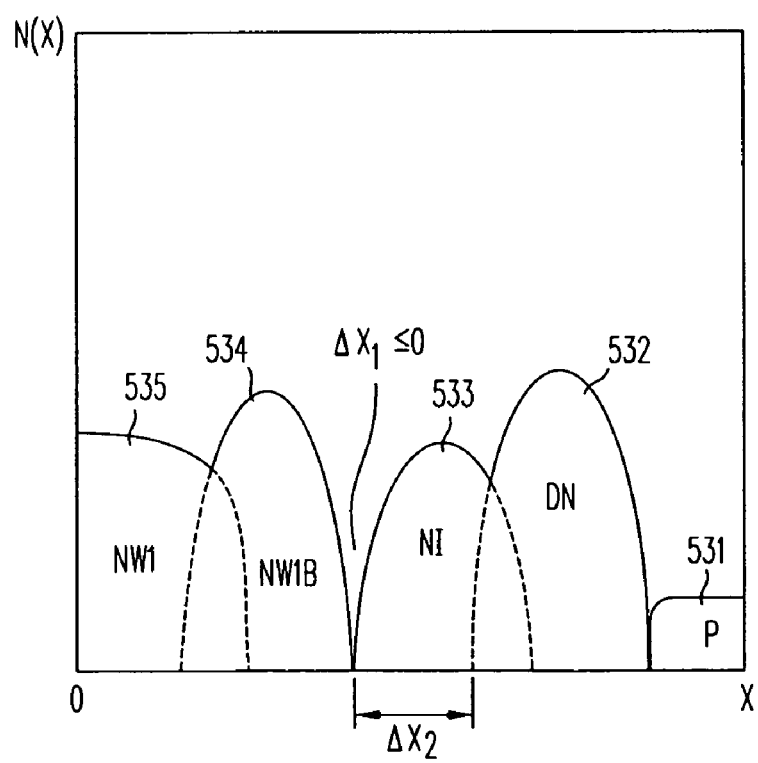

FIG. 10D illustrates the dopant profile at cross section 10D-10D adjacent to the trench 454 of the isolation structure shown in FIG. 9C, where the N-type well 455 just touches the NI region 453 but does not overlap the DN floor isolation region 452. As shown, DN floor isolation region 452 (represented by dopant profile 532) formed in P-type substrate 451A (represented by dopant profile 531) is overlapped by NI region 453 (represented by dopant profile 533). N-type well 455 comprises an upper portion NW1 (represented by dopant profile 535) and a deeper portion NW1B (represented by dopant profile 534). No P-type region separates the bottom of deeper portion NW1B (profile 534) from NI region 453 (profile 533), i.e. $\Delta x_1 \leq 0$. In cross sections where NI region 453 is not present, there is a gap=$\Delta x_2$ between deeper portion NW1B (profile 534) and DN floor isolation region 452 (profile 532) comprising an intervening portion of P-type pocket 451B (not shown) of the same concentration as the substrate 451A.

Figure 10E:
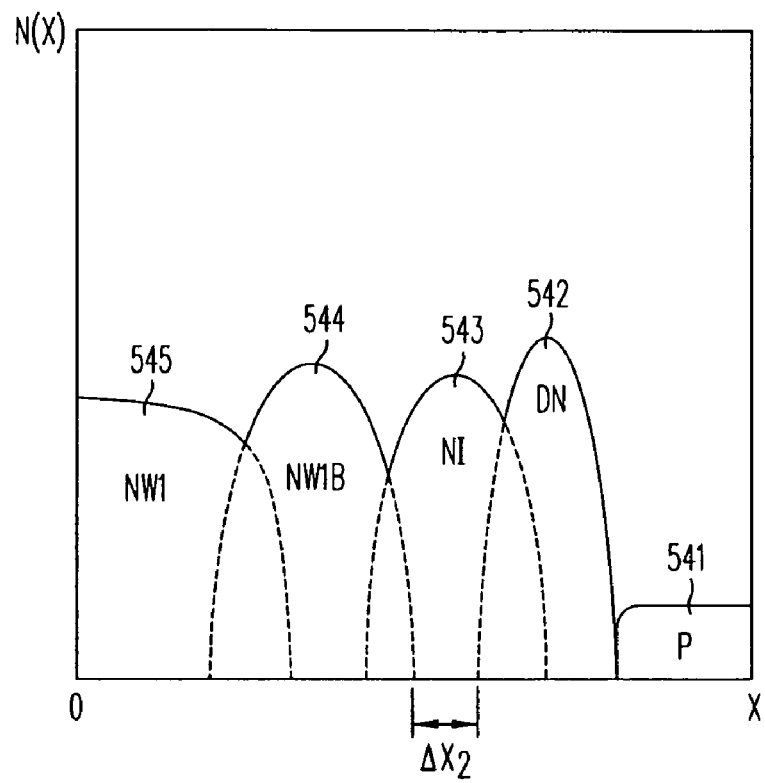

FIG. 10E illustrates the dopant profile at cross section 10E-10E adjacent to the trench 464 of the isolation structure shown in FIG. 9D, where the N-type well 465 substantially overlaps the NI region 463 but does not overlap the DN floor isolation region 462. As shown, DN floor isolation region 462 (represented by dopant profile 542) formed in P-type substrate 461A (represented by dopant profile 541) is overlapped by NI region 463 (represented by dopant profile 543) and NI region 463 (profile 543) is overlapped by N-type well 465, comprising a deeper portion NW1B (represented by dopant profile 544) and an upper portion NW1 (represented by dopant profile 545). No portion of P-type pocket 461B separates the bottom of deeper portion NW1B (profile 544) from NI region 463 (profile 543), i.e. $\Delta x_1 < 0$. In cross sections where NI region 463 is not present, there is a gap=$\Delta x_2$ between deeper portion NW1B (profile 544) and DN floor isolation region 462 (profile 542) comprising a thin intervening portion of P-type pocket 461B (not shown) of the same concentration as the substrate 461A. Such a doping profile allows the deeper portion NW1B of N-well 465 and DN floor isolation region 462 to punch through the thin portion of P-type pocket 461B at low bias conditions, essentially shorting the deeper portion NW1B of N-well 465 to DN floor isolation region 462.

Figure 10F:
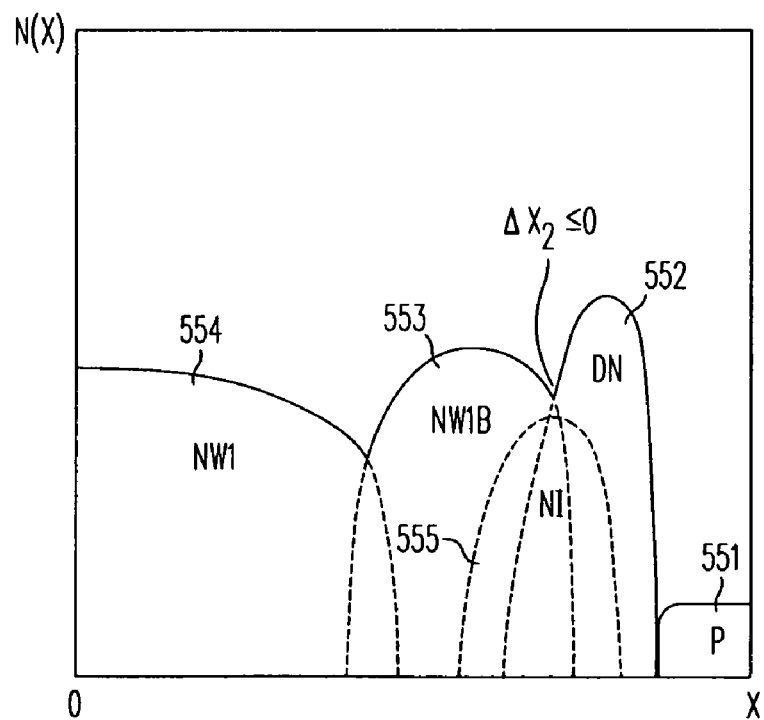

FIG. 10F illustrates the dopant profile at cross section 10F-10F adjacent to the trench 474 of the preferred isolation structure shown in FIG. 9E where the N-type well 475 overlaps both the NI region 473 and the DN floor isolation region 472. As shown, DN floor isolation region 472 (presented by doping profile 552) formed in P-type substrate 471 (presented by doping profile 551) is overlapped by NI region 473 (presented by doping profile 555) and N-type well 475 comprising a deeper portion NW1B (presented by doping profile 553) and an upper portion NW1 (presented by doping profile 554). No P-type region separates the bottom of deeper portion NW1B (profile 553) from NI region 473 (profile 555), i.e. $\Delta x_1 \ll 0$. Furthermore, in cross sections where NI region 473 is not present, no gap or intervening P-type region exists between deeper portion NW1B (profile 553) and DN floor isolation region 472 (profile 552), i.e. $\Delta x_2 < 0$. In this configuration, all N-regions are electrically shorted together to produce a low resistivity of N-type well 475 for good CMOS latch-up suppression and snapback breakdown prevention, yet maintaining a low surface concentration needed to for low threshold CMOS and high beta bipolar transistors. The entire Type-II trench isolated well structure, formed without high-temperature processes, is compatible with large diameter silicon wafers and may be used in conjunction with subsequent shallow trench isolation as well.

Figure 11A:
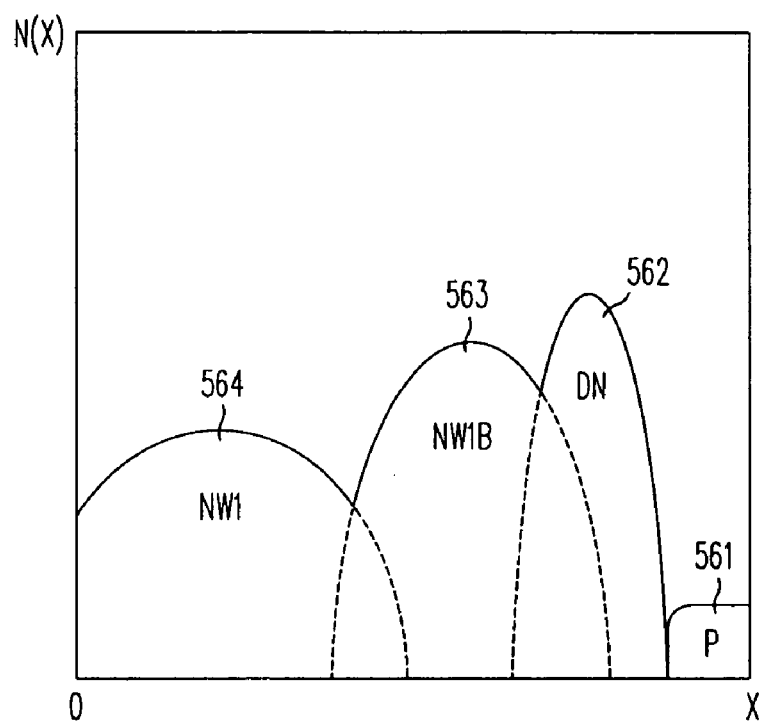
FIGS. 11A-11C are graphs illustrating dopant profiles of different forms of the upper portion of an N-type well inside a Type-II isolation structure.

Another dopant profile 11A-11A, not adjacent to the trench 747 in preferred isolation structure of FIG. 9E is illustrated by FIG. 11A, revealing that without the presence of NI region 473, the N-type well 475 comprising an upper portion NW1 (represented by dopant profile 564) and a deeper more heavily concentrated portion NW1B (represented by dopant profile 563) still overlaps onto DN floor isolation region 472 (represented by dopant profile 562) to form a continuous N-type region of non-monotonic doping in substrate 471 (represented by dopant profile 561).

Figure 11B:
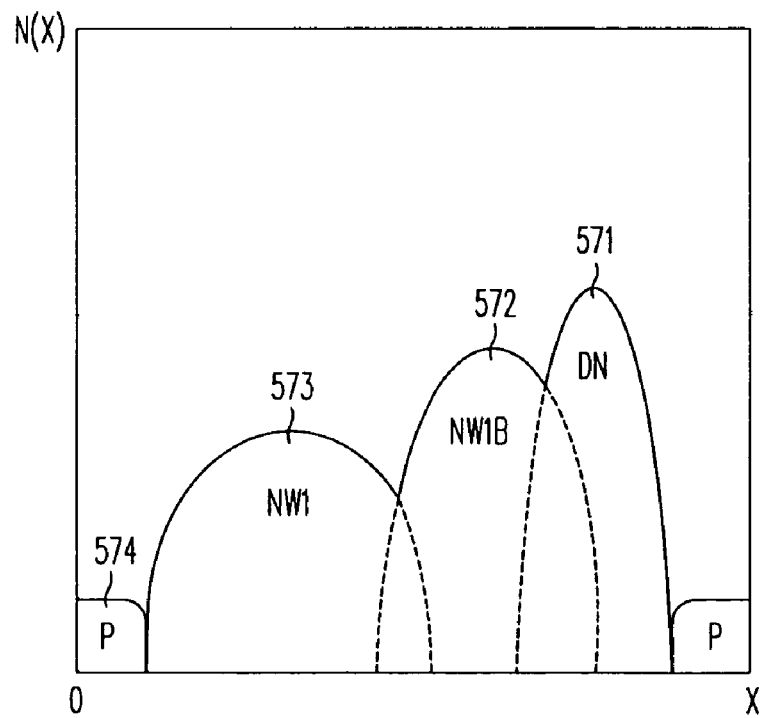

FIG. 11B illustrates the problem illustrated in the structure of FIG. 9F, where the upper portion NW1 of N-type well 485 (represented by dopant profile 573) is too deep and inadvertently forms a surface P-type layer 481C (represented by dopant profile 574). The energy and depth of upper portion NW1 (profile 573) does, however, overlap the deeper portion NW1B (represented by dopant profile 572), which in turn preferably overlaps DN floor isolation region (represented by dopant profile 571) to form a continuous N-type region. Implanting upper portion NW1 (profile 573) at a lower energy can prevent upper portion NW1 from overlapping of deeper portion NW1B (profile 572) of N-type well 485 and adversely affect device operation, performance, and reliability. So if upper portion NW1 (profile 573) is too deep, a phantom-P-type surface layer 481C (profile 574) is formed and if implanted too shallow, low-resistance overlap to deeper well portion NW1B (profile 572) is sacrificed instead.

Figure 11C:
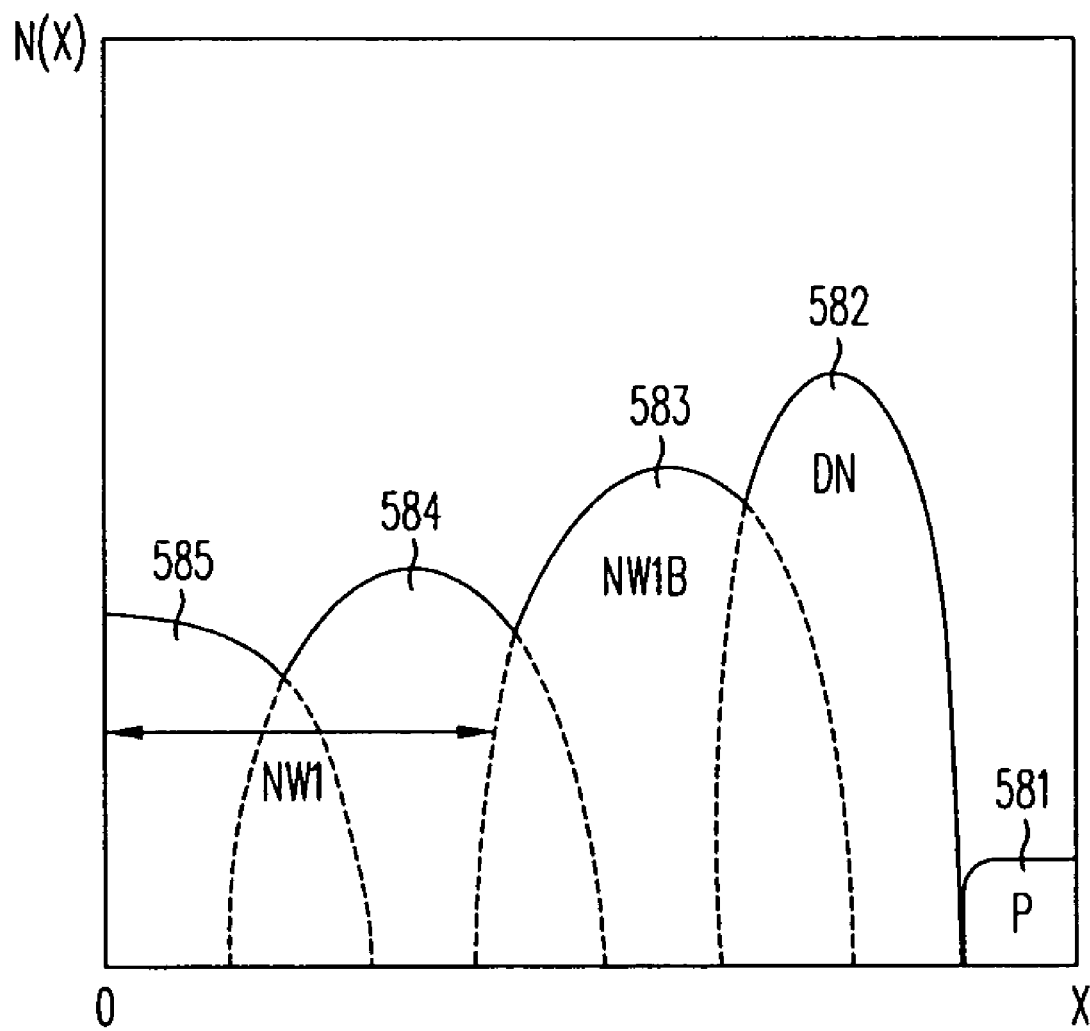

The solution to this undesirable trade-off is to employ multiple dopant (e.g., phosphorus) implants to form the top portion NW1 as shown in FIG. 11C. As shown, upper portion NW1 comprises two overlapping implants (represented by dopant profiles 585 and 584) which in turn overlap deeper portion NW1B (represented by dopant profile 583) to form a three implant N-type well. This well, in turn, overlaps DN floor isolation region (represented by dopant profile 582) all formed within P-type substrate (represented by dopant profile 581). While a three-implant well is illustrated, higher in concentration with increasing depth, any number of implants of varying dose and energy can be used to form other non-Gaussian non-monotonic doping profiles so long that the N-type implants adequately overlap.

The consideration for the relative depth of isolated N-type well regions with respect to Type-II isolation structures is not as complex a factor when forming P-type wells, since the isolated pocket is already P-type. Because no floating P-type layer is formed regardless of the dopant profile of the P-type well, the main concern is to avoid making the P-type well so deep that it counter-dopes the DN floor isolation region or that the breakdown voltage between the P-type well and the DN floor isolation region is inadequate to support operation at the maximum supply voltage.

Maintaining a lower dopant concentration in the P-type well increases the breakdown voltage between the P-type well and the N-type floor isolation region but may compromise certain NMOS characteristics. To remedy this tradeoff, a separate deeper P-type implant, introduced at a depth shallower than the DN layer but overlapping the bottom of the P-type well, may be used as needed to lower the well resistivity and suppress snapback.

Figure 12A:
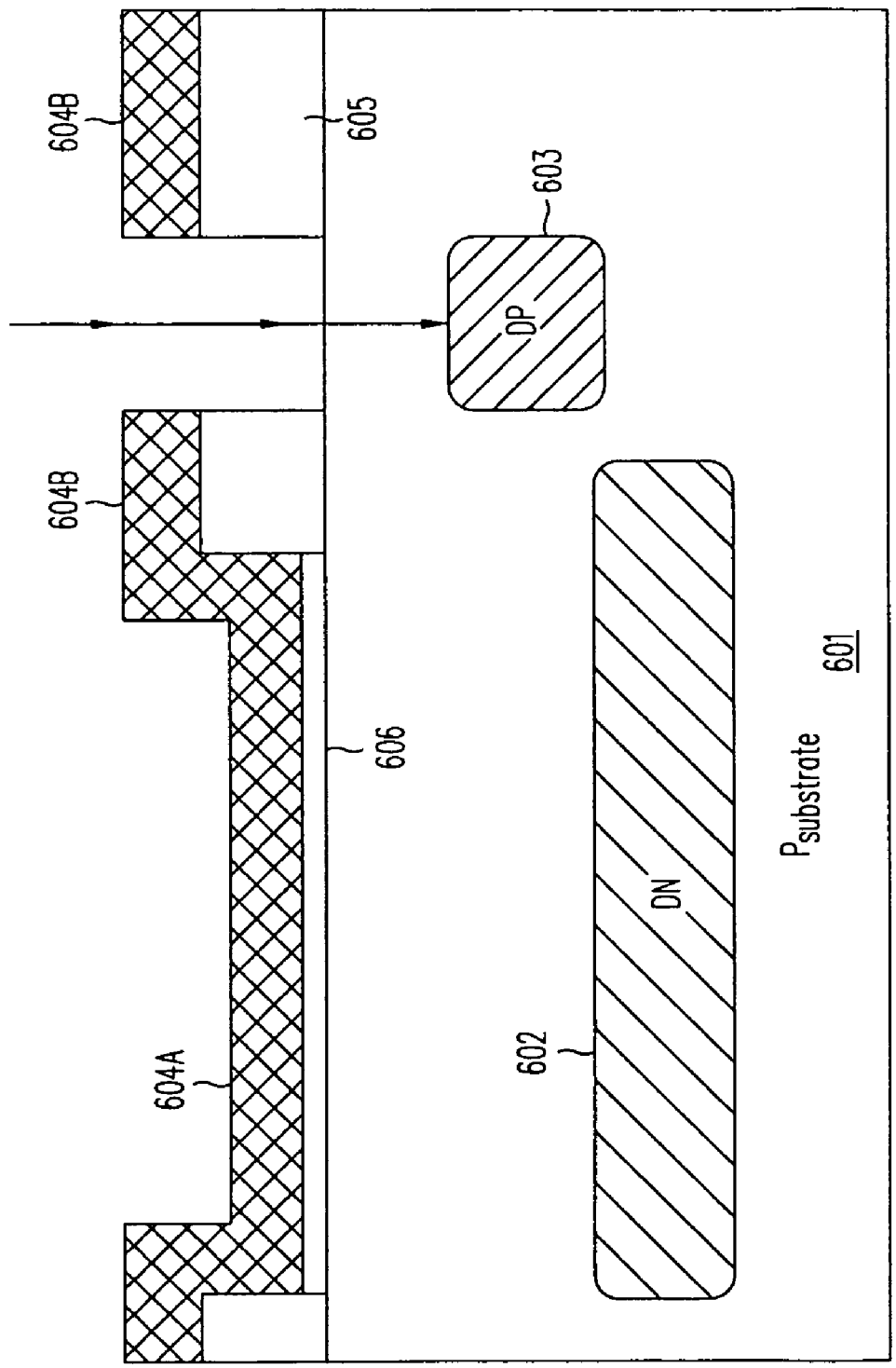
FIG. 12A is a cross-sectional view illustrating the fabrication of a medium depth DP implant and a DN floor isolation region.

This extra P-type implant may also serve other purposes, including reducing the spacing between isolated pockets. FIG. 12A illustrates the a deep P-type region 603, herein referred to as a "DP" region, formed using a high energy implantation into a P-type substrate 601 defined by a mask layer 604B and optionally by oxide layer 605 patterned using mask layer 604B. In one possible manufacturing flow, oxide layer 605 is grown on substrate 601 and then masked and etched. Substrate 601 is oxidized to produce a thin pre-implant oxide layer 606. The deep N-type implant is then introduced to form DN floor isolation region 602, followed by using photoresist 604B or any other thick mask material to define the location of the implanted DP region 603.

Figure 12B:
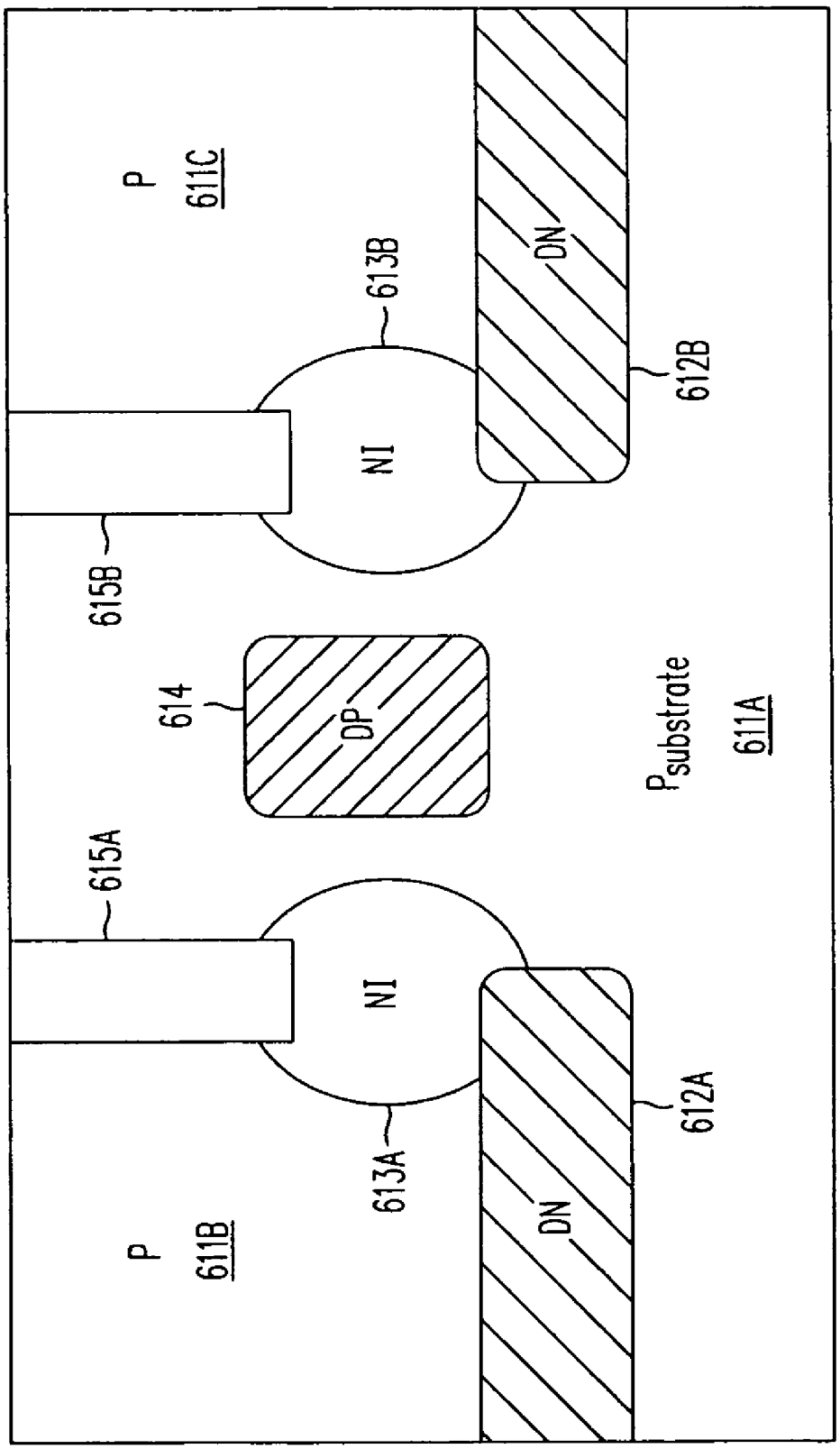
FIG. 12B is a cross-sectional view illustrating the fabrication of a dielectric-filled trench and underlying NI regions.

Use of a DP deep implanted region 614 is illustrated in FIG. 12B, where two isolated P-type pockets 611B and 611C are isolated from surrounding P-type substrate 611A by Type-II trench isolation. Isolated pocket 611B is surrounded by a concentric dielectric-filled trench 615A, a trench bottom NI region 613A and a DN floor isolation region 612A. Isolated pocket 611C is surrounded by a concentric dielectric-filled trench 615B, a trench bottom NI region 613B and a DN floor isolation region 612B. As shown, DP region 614 is located between NI regions 613A and 613B to reduce the risk of punch-through breakdown. DN floor isolation regions 612A and 612B are pulled back from the edge of the NI regions 613A and 613B such that the lateral separation between DN floor isolation regions 613A and 613B is greater than the lateral separation between NI regions 613A and 613B. In this manner, isolated regions can be more closely packed together to reduce chip size.

Alternative Type-II Isolated BCD Process

Figure 13A:
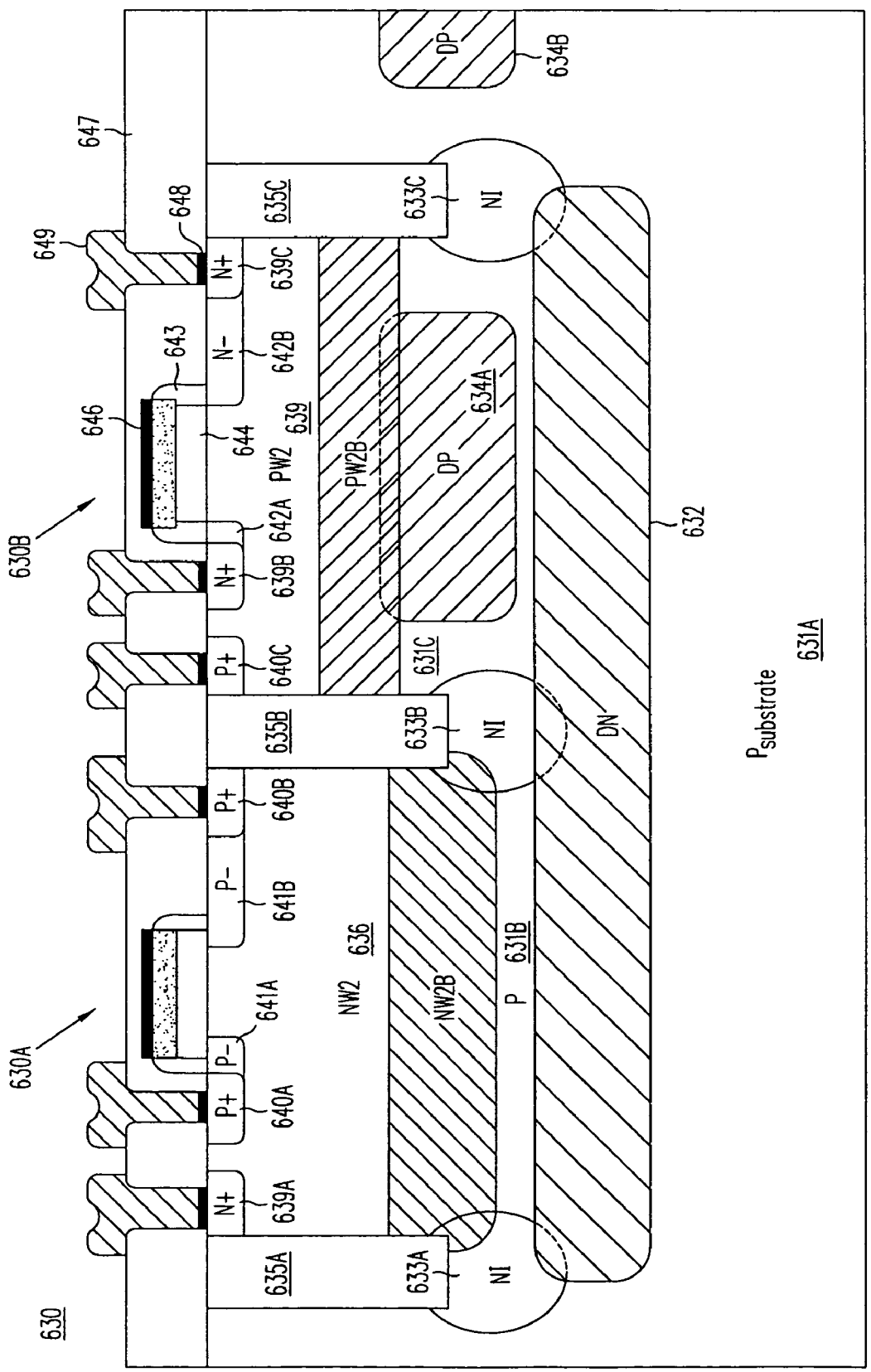
FIG. 13A is a cross-sectional view of high voltage N-channel and P-channel LDD MOSFETS with a medium-depth DP implant.

Aside from permitting a reduced space between isolated pockets, a DP implant may be used for lowering the effective P-type well resistivity in low- and high-voltage NMOS formation. In FIG. 13A, for example, a complementary pair of lightly doped drain (LDD) MOSFET transistors are formed and isolated by trench isolation.

The isolated PMOS 630A of FIG. 13A comprises an N-type well 636, an N+ well contact region 639A, a P+ source region 640A, a P− source extension 641A, a P− drain extension 641B and a P+ drain region 640B. The isolated NMOS 630B of FIG. 13A comprises a P-type well 637, a P+ well contact region 640C, an N+ source region 639B, an N− source extension 642A, an N− drain extension 642B and an N+ drain region 639C. Both NMOS 630B and PMOS 630A use gate oxide layers 644 with gates 646 and sidewall spacers 643 to form the MOSFET channel. Contact to the regions of NMOS 630B and PMOS 630A is made through contact windows etched in an ILD layer 647, with a metal layer 649 and optional barrier metal layer 648 present in the contact windows.

The N-type well 636 and P-type well 637 comprise non-monotonic doping profiles with at least surface regions NW2 and PW2 and deeper portions NW2B and PW2B respectively. The wells are isolated from substrate 631A by trench isolation comprising NI regions 633A and 633C overlapping DN layer 632 and dielectric-filled trenches 635A and 635C. Trench 635B combined with NI region 633B isolates the PMOS 630A and NMOS 630B from one another.

The bottom portion NW2B of N-type well 636 may overlap onto DN floor isolation region 632 or may leave a thin P-type pocket 631B interposed between the floor isolation region 632 and N-type well 636. In one embodiment, P-type well 637 is shallower than N-type well 636 and trenches 635A-635C. In this case a lightly-doped P-type pocket 631C is present between the bottom of P-type well 637 and the top of DN floor isolation region 632. Because well 637 and pocket 631C both comprise. P-type silicon, no region is left electrically floating. The introduction of DP region 634A beneath P-type well 637 reduces the resistivity of this combined P-type region and improves the structure's resistance to CMOS latch-up and NMOS snapback, particularly in higher voltage LDD NMOS as shown. The same high-energy boron implant can be used to form a DP region 634B between the isolated region shown in FIG. 13A and another isolated region (not shown).

Figure 13B:
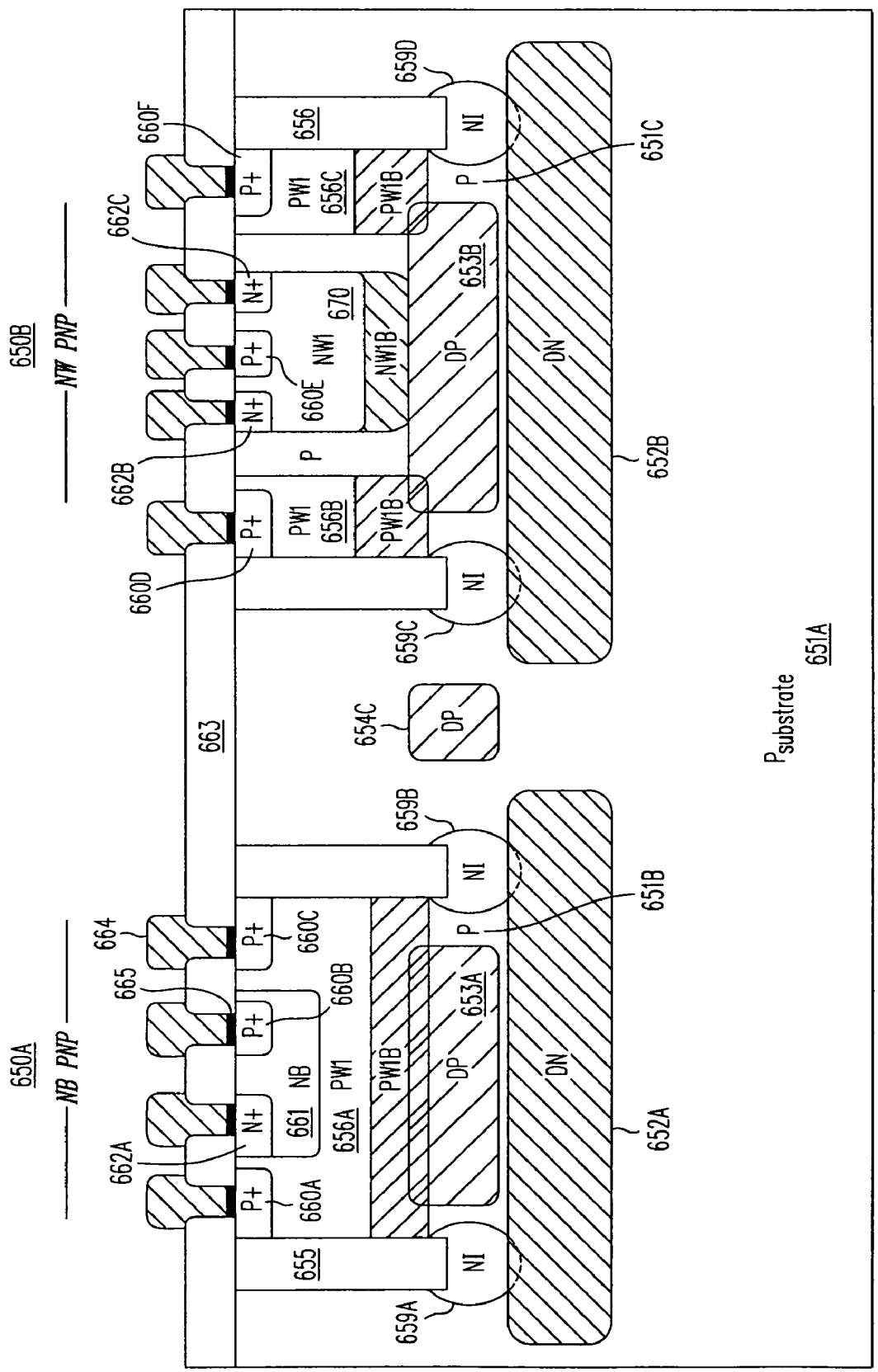
FIG. 13B is a cross-sectional view of NB and NW base PNP transistors with a medium-depth DP implant.

Another benefit of a DP region is to improve the electrical performance of various PNP transistors. In FIG. 13B two types of PNP devices are shown using an implanted DP region.

In a PNP 650A, an N-type base 661 is formed within a P-type well 656A which contains a P+ region 660B as emitter and a N+ region 662A to facilitate contact with N-type base 661. P-type well 656A, acting as the collector is contacted through P+ regions 660A and 660C. PNP 650A is isolated from a P-type substrate 651A by a Type-II isolation structure comprising dielectric-filled trenches 655, NI regions 659A and 659B, and a DN floor isolation region 652A. An N-type well (not shown) overlaps some portion of NI regions 659A and 659B, and is used to electrically bias DN floor isolation 652A.

In one embodiment, P-type well 656A does not overlap onto DN floor isolation region 652A. In such instances, a lightly doped P-type pocket 651B is present between the bottom of P-type well 656A and the top of DN floor isolation region 652A. Because P-well 656A and pocket 651B both comprise P-type dopant, no region is left electrically floating. The introduction of DP region 653A beneath P-type well 656A, however, reduces the resistivity of the combined P-type region and thereby reduces the collector resistance of PNP 650A.

In PNP 650B, an N-type well 670 forms the base region and contains a P+ region 660E as emitter and a N+ regions 662B and 662C to facilitate contact with the base region. A P-type pocket 651C, acting as the collector further contains P-type wells 656B and 656C, contacted through P+ regions 660D and 660F. PNP 650B is isolated from P-type substrate 651A by a Type-II isolation structure comprising dielectric-filled trenches 656, NI regions 659C and 659D, and a DN floor isolation region 652B. NI regions 659C and 659D are contacted by an N-well, for example, outside the plane of FIG. 13B.

In a preferred embodiment of PNP 650B, N-type well 670 does not overlap onto DN floor isolation region 652B, such that a P-type pocket 651C is present between the bottom of N-well 670 and the top of DN floor isolation region 652B. If P-type pocket 651C is sufficiently thin, N-type well 670 may punch-through to DN floor isolation region 652B, electrically shorting N-type well 670 to DN floor isolation region 652B. The introduction of a DP region 653B beneath N-type well 670 suppresses punch-through and improves the isolation between the base (N-type well 670) and the isolation regions (DN floor isolation region 652B and NI regions 659C and 659D). In addition, DP region 653B reduces the resistivity of the P-type regions enclosed by the isolation structure and thereby reduces the collector resistance of PNP 650B.

By optimizing implant energy of DP region 653B for a depth shallower than the DN floor isolation region 652B, DP region 653B is capable of improving both NPN and PNP bipolar device performance, such as the devices shown in FIGS. 3B and 3C, reducing the propensity for CMOS latch-up and NMOS snapback breakdown, and reducing the spacing between isolated wells.

Non-Isolated BiCMOS in Type-II Isolated BCD Process.

While the process of this invention allows the integration of fully isolated devices, its modularity allows designers to skip the NI and DN implants when full isolation is not needed. In so doing, the full isolated BCD device arsenal reverts to CMOS with NPN bipolar transistors, i.e. into a BiCMOS process with fewer masks and lower cost. The modularity of the architecture further means the electrical characteristics of the CMOS remains unaltered whether the CMOS is isolated or non-isolated. The electrical characteristics of the NPN remain unaltered except that the DN layer reduces collector resistance of the isolated version. The NPN is still "self-isolating," just like the PMOS devices, since it is formed inside an N-type well that naturally forms a reverse-biased junction to the surrounding P-type substrate.

FIGS. 14A-14E illustrate several NMOS transistors formed with conventional shallow trench isolation (STI). Without the complete isolation of the DN and NI regions, described above, the P-type well that serves as the body region of these NMOS devices is shorted to the P-type substrate. These non-isolated devices may be formed either by removing the NI and DN implants from the particular device instance thereby mixing isolated and non-isolated devices on the same integrated circuit, or by skipping those process steps.

Figure 14A:
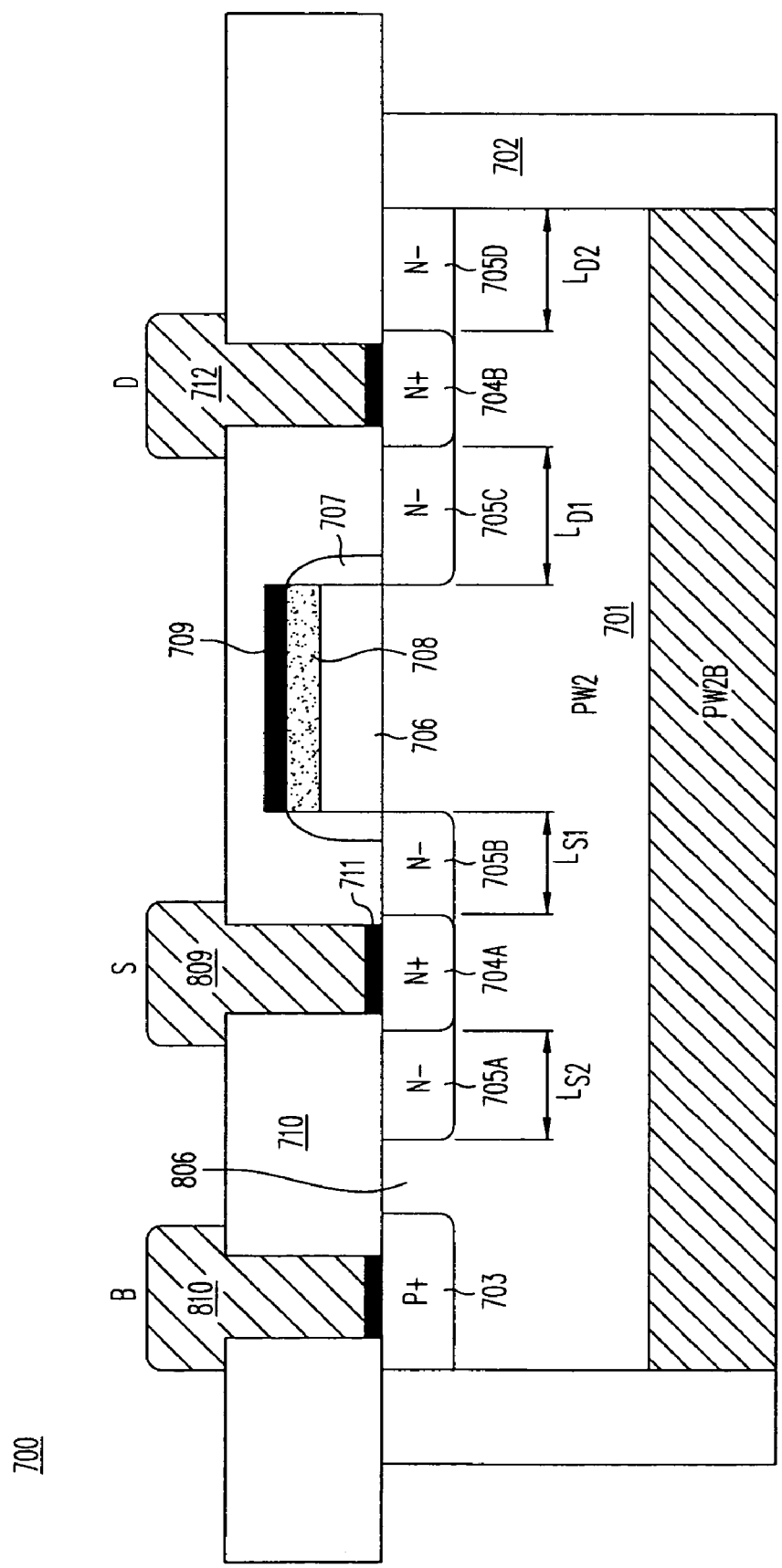
FIG. 14A is a cross-sectional view of an LDD N-channel MOSFET with a symmetric drift region.

FIG. 14A shows a cross-sectional view of a symmetrically-drifted NMOS 700, i.e. a device having a drifted source and a drifted drain. NMOS 700 comprises a P-type well 701, a P+ contact region 703, N+ source and drain regions 704A and 704B, a gate oxide layer 706, a polysilicon gate 708, a gate silicide 709 and sidewall spacers 707. NMOS 700 includes N− drifted source and drain regions 705B and 705C having lengths $L_{S1}$ and $L_{D1}$ respectively and which conduct current in the on state, and passive N− drift terminations 705A and 705D of lengths $L_{S2}$ and $L_{D2}$ which prevent surface breakdown of the N+ junctions but do not carry current. The lengths of drift regions $L_{S1}$ and $L_{D1}$ may be optimized independent of the lengths of passive termination lengths $L_{S2}$ and $L_{D2}$. In some embodiments, the drift regions may also be formed by different process steps than the passive terminations, such that their doping profiles may also be independently optimized.

P-type well 701 preferably comprises an upper portion PW2 and a deeper portion PW2B where the deeper portion PW2B has a higher dopant concentration than the upper portion PW1.

NMOS 700 is bounded on its periphery by a dielectric-filled trench 702. Contact to NMOS 700 through ILD layer 710 is facilitated by a barrier metal layer 711 and an interconnect metal layer including drain contact 712, source contact 809, and well contact 810.

Figure 14B:
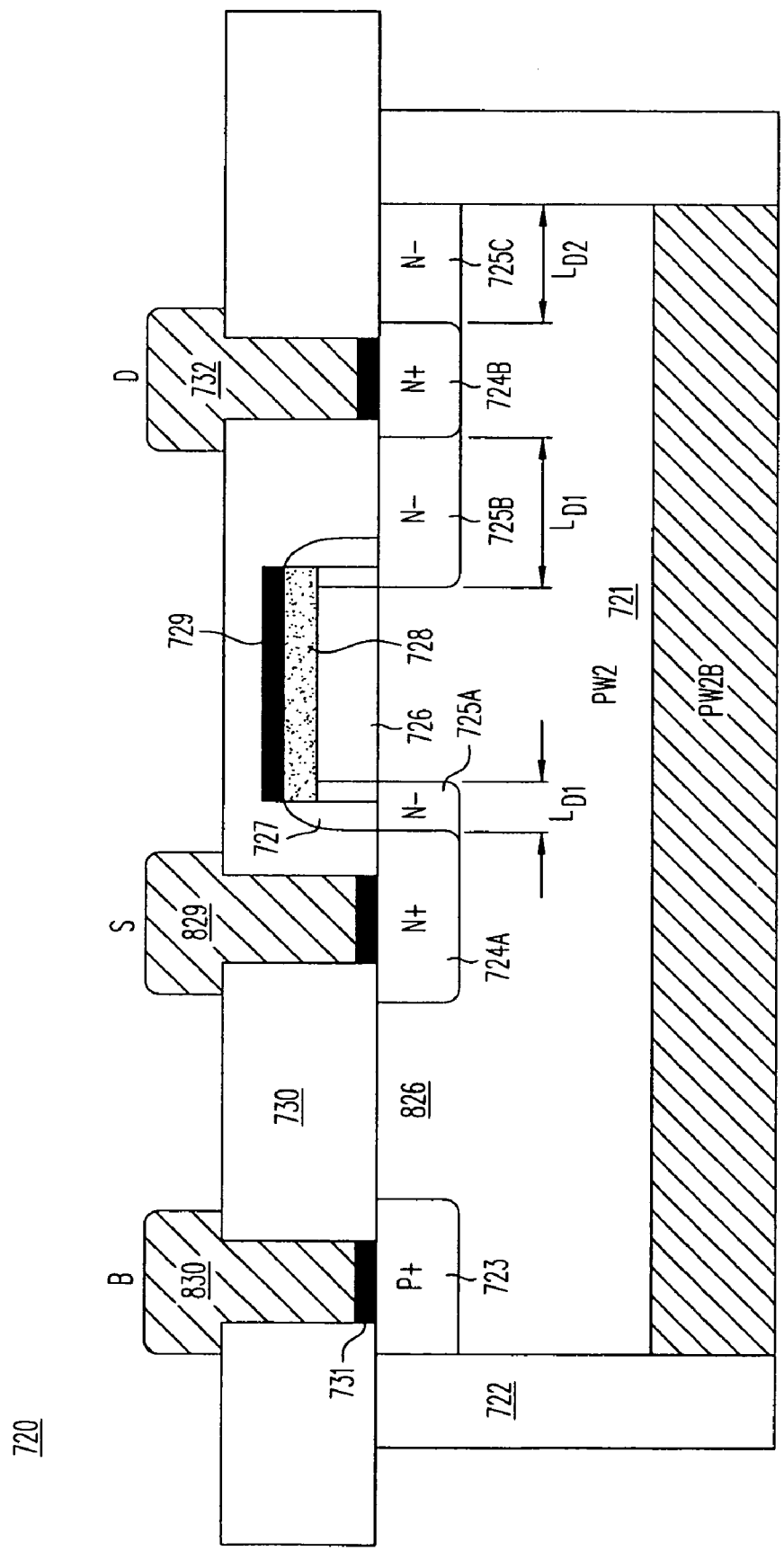
FIG. 14B is a cross-sectional view of an LDD N-channel MOSFET with an asymmetric drift region.

FIG. 14B shows a cross-sectional view of an asymmetrically drifted NMOS 720, i.e. a device having a drifted drain and but only a short, sidewall-spacer-defined drifted source. NMOS 720 comprises a P-type well 721, a P+ contact region 723, N+ source and drain regions 724A and 724B, a gate oxide layer 726, a polysilicon gate 728, a gate silicide 729 and sidewall spacers 727. NMOS 720 also includes a source extension 725A that is defined by the sidewall spacer 727, an artifact of the conventional LDD CMOS process. A mask-defined drain extension 725B of length $L_{D1}$ conducts current in the on state, while a passive N− drift termination 725C of length $L_{D2}$ prevents surface breakdown of the N+ drain junction but does not carry current. The lengths and doping concentrations and profiles of source extension 725A, drain extension 725B, and drift termination 725C may be optimized independently.

Figure 14C:
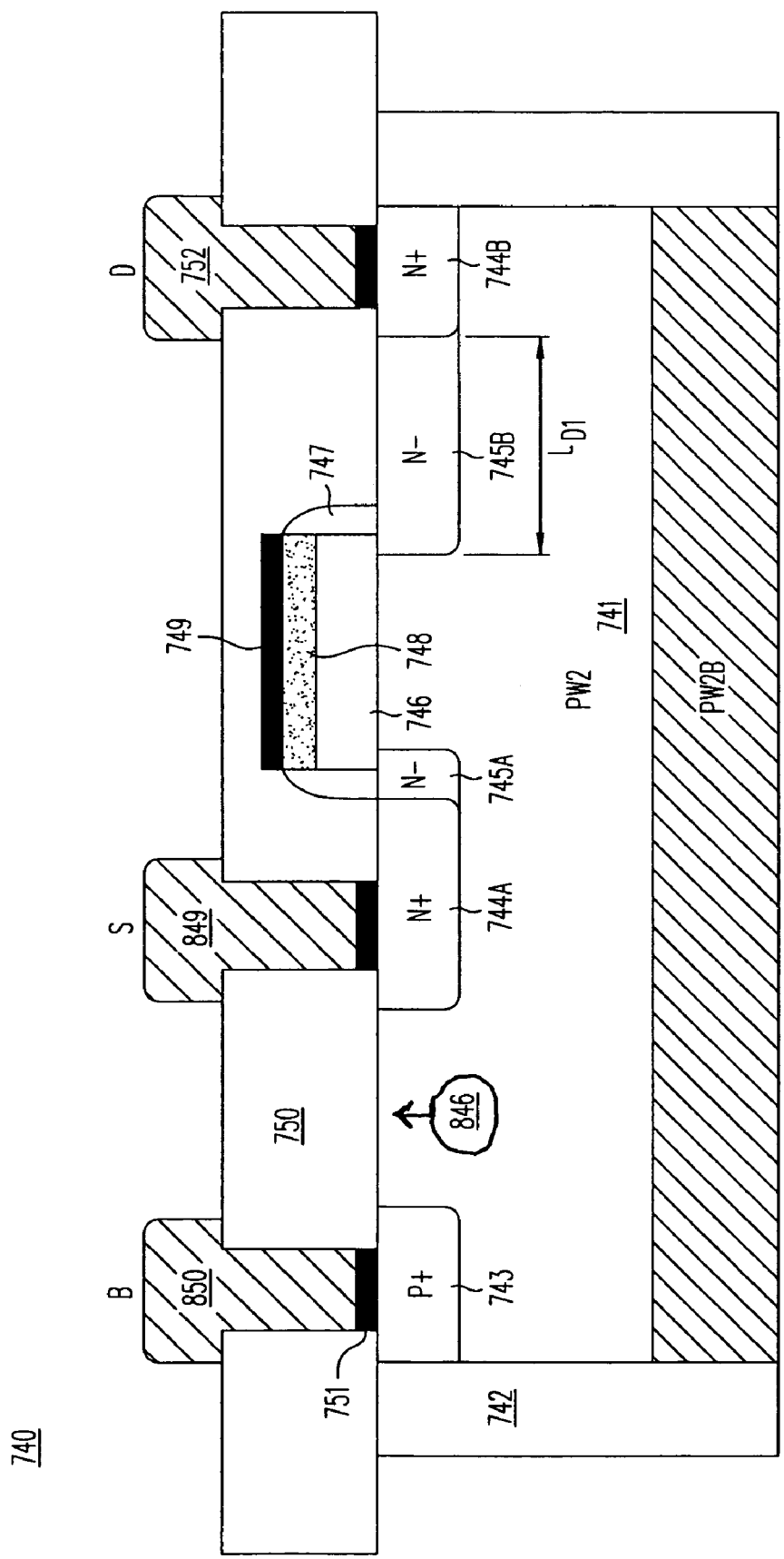
FIG. 14C is a cross-sectional view of an LDD N-channel MOSFET with an asymmetric drift and a drain region abutting an isolation trench.

FIG. 14C shows a cross-sectional view of an asymmetrically drifted NMOS 740. NMOS 740 comprises a P-type well 741, a P+ contact region 743, N+ source and drain regions 744A and 744B, a gate oxide layer 746, a polysilicon gate 748, a gate silicide 749 and sidewall spacers 747. The device includes a source extension 745A that is defined by the sidewall spacer 747, an artifact of the conventional LDD CMOS process. A mask-defined drain extension 745B having length $L_{D1}$ conducts current in the on-state. Unlike the devices of FIGS. 14A and 14B, no N− drift region is present between drain 744B and trench 742. Other features of NMOS 740 are similar to those of NMOS 720, described above.

Figure 14D:
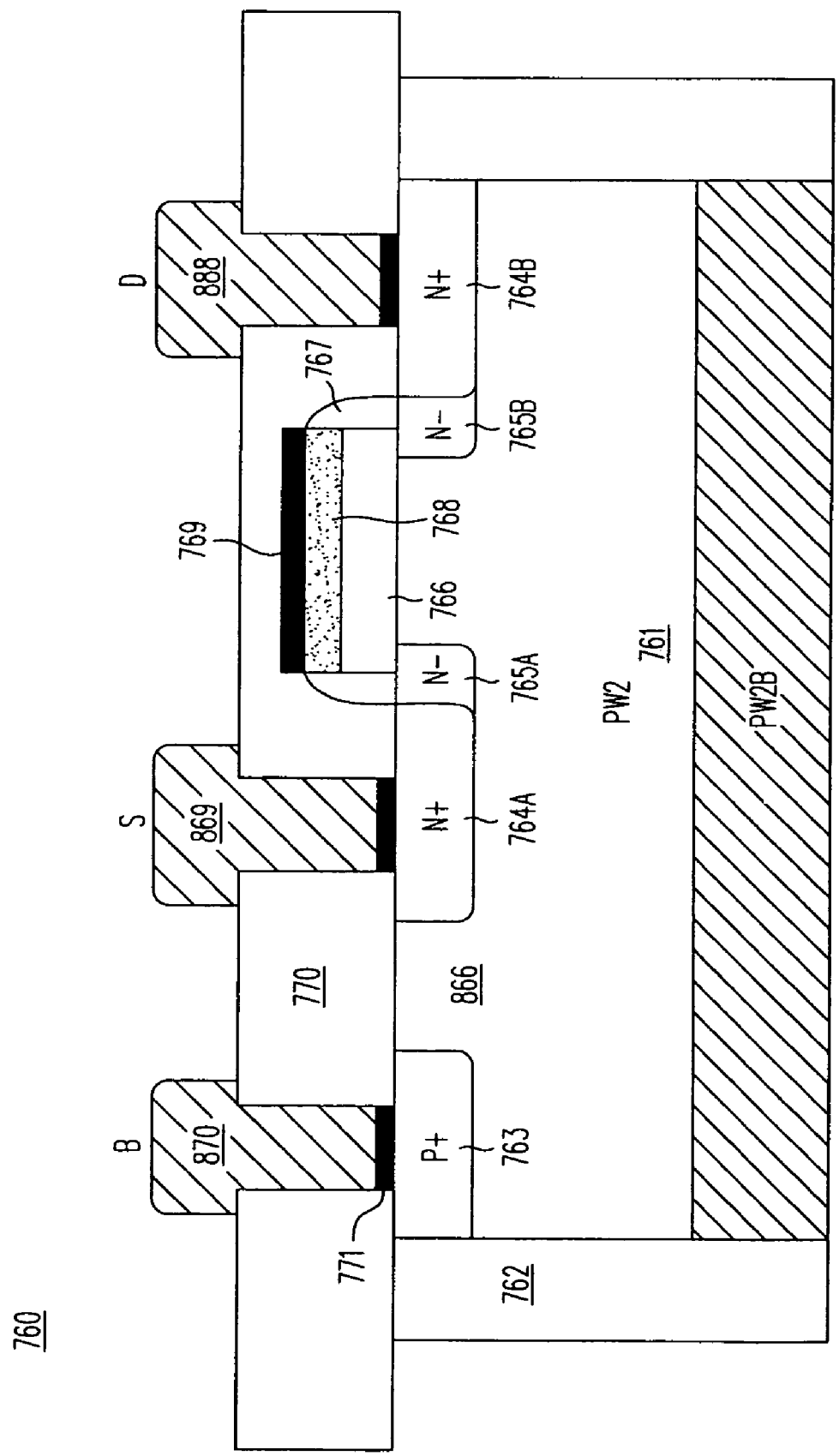
FIG. 14D is a cross-sectional view of an LDD N-channel MOSFET with drift regions formed by sidewall spacers.

FIG. 14D shows a cross-sectional view of a symmetric LDD NMOS 760, fully self-aligned with no mask defined drift lengths. Unlike NMOS 740, described above, the source and drain extensions 765A and 765B have lengths determined by the length of sidewall spacers 767. Other features of NMOS 760 are similar to those of NMOS 740, described above.

Figure 14E:
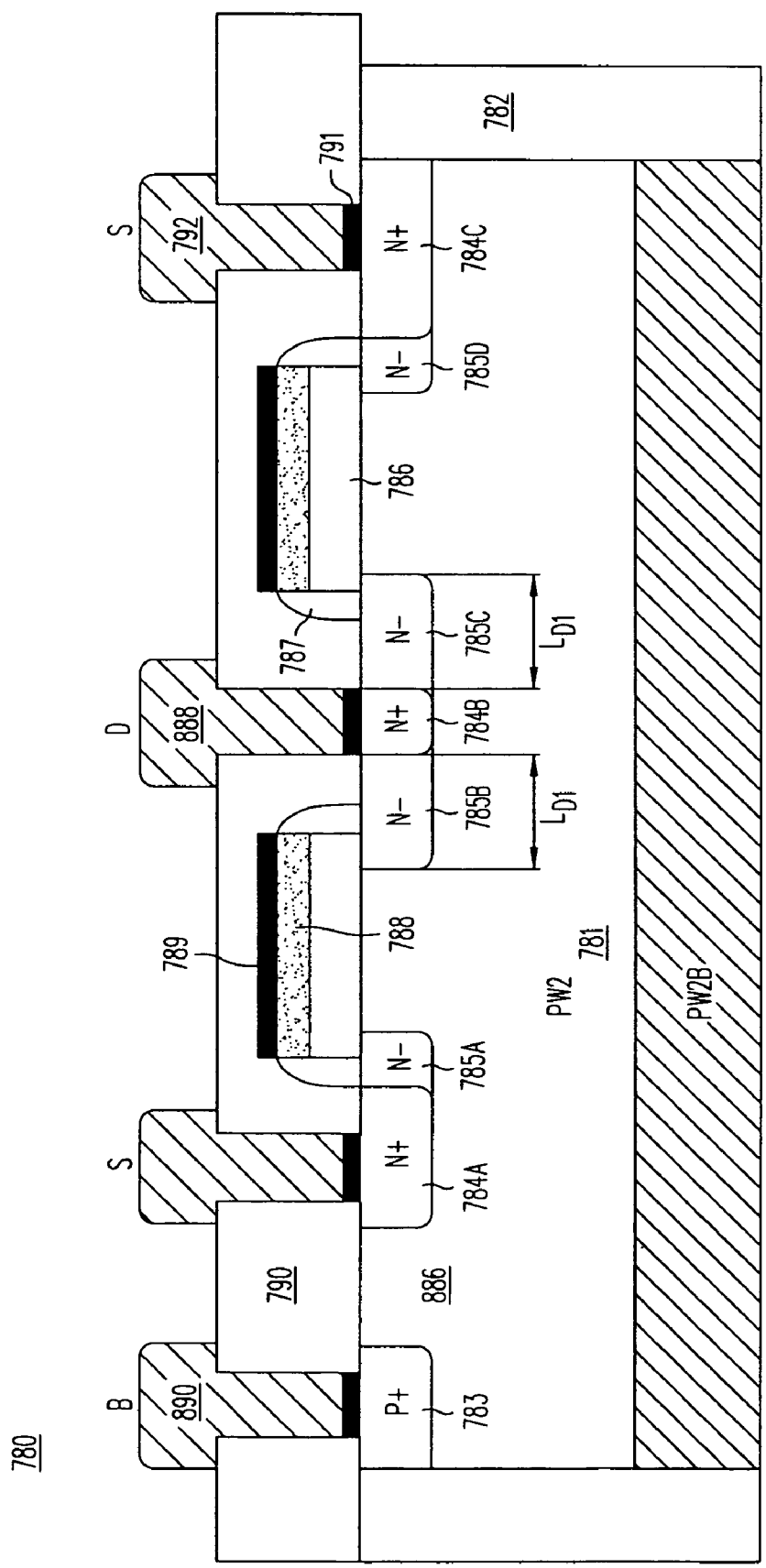
FIG. 14E is a cross-sectional view of an LDD N-channel MOSFET with an asymmetric drift and a central drain region.

FIG. 14E illustrates an asymmetrically drifted NMOS 780. Unlike NMOS 720, the drain region 784B of NMOS 780 is entirely concentrically surrounded by a gate 788 and source region 784A, 784C. NMOS 780 comprises a P-type well 781, a P+ contact region 783, a ring shaped N+ source region 784A, 784C, a central N+ drain region 784B, a gate oxide layer 786, a ring shaped polysilicon gate 788, a gate silicide 789 and sidewall spacers 787. NMOS 780 also includes a source extension 785A, 785D, defined by sidewall spacer 787, and a mask defined N− drain extension 785B, 785C of radial length $L_{D1}$. The N− drain extension 785B, 785C completely surrounds N+ drain region 784B on all sides in a ring shaped or annular geometry. In this embodiment, no lightly doped region is present between N+ source 784C and trench 782. Other features of NMOS 780 are similar to those of NMOS 720.

Figure 15A:
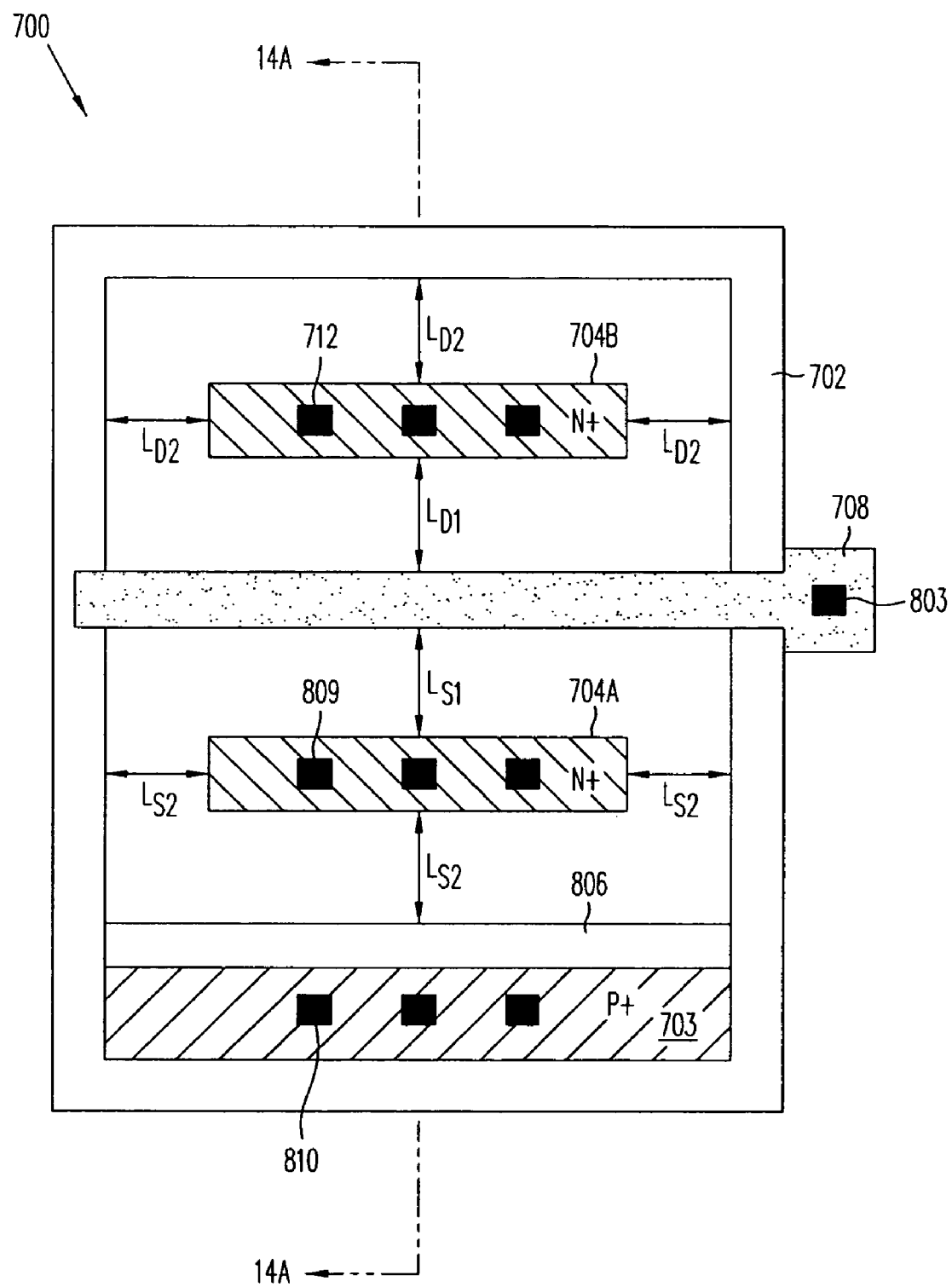
FIGS. 15A-15E are plan views of the MOSFETs shown in FIGS. 14A-14E, respectively.

FIGS. 15A-15E illustrate in plan view the non-isolated NMOS transistors shown in cross-section in FIGS. 14A-14E. FIG. 15A is a plan view of NMOS 700, shown in FIG. 14A, with trench 702 in the form of a ring enclosing P+ contact region 703 and a well contact 810, N+ source region 704A and a source contact 809, N+ drain region 704B and drain contact 712, polysilicon gate 708 with gate contact 803. As shown, N+ source region 704A is spaced from the gate by the mask defined distance $L_{S1}$, determined by the relative positioning of the N+ and polysilicon gate masks, and from the edge of trench 702 by the distance $L_{S2}$. The N+ source region 704A is also spaced apart from P+ contact region 703 by the distance $L_{S2}$ plus the width of a gap 806. N+ drain region 704B is spaced from the gate 708 by a mask defined distance $L_{D1}$, determined by the relative positioning of the N+ and polysilicon gate masks, and from trench 702 by a distance $L_{D2}$. FIG. 14A is taken at cross section 14A-14A, shown in FIG. 15A.

Figure 15B:
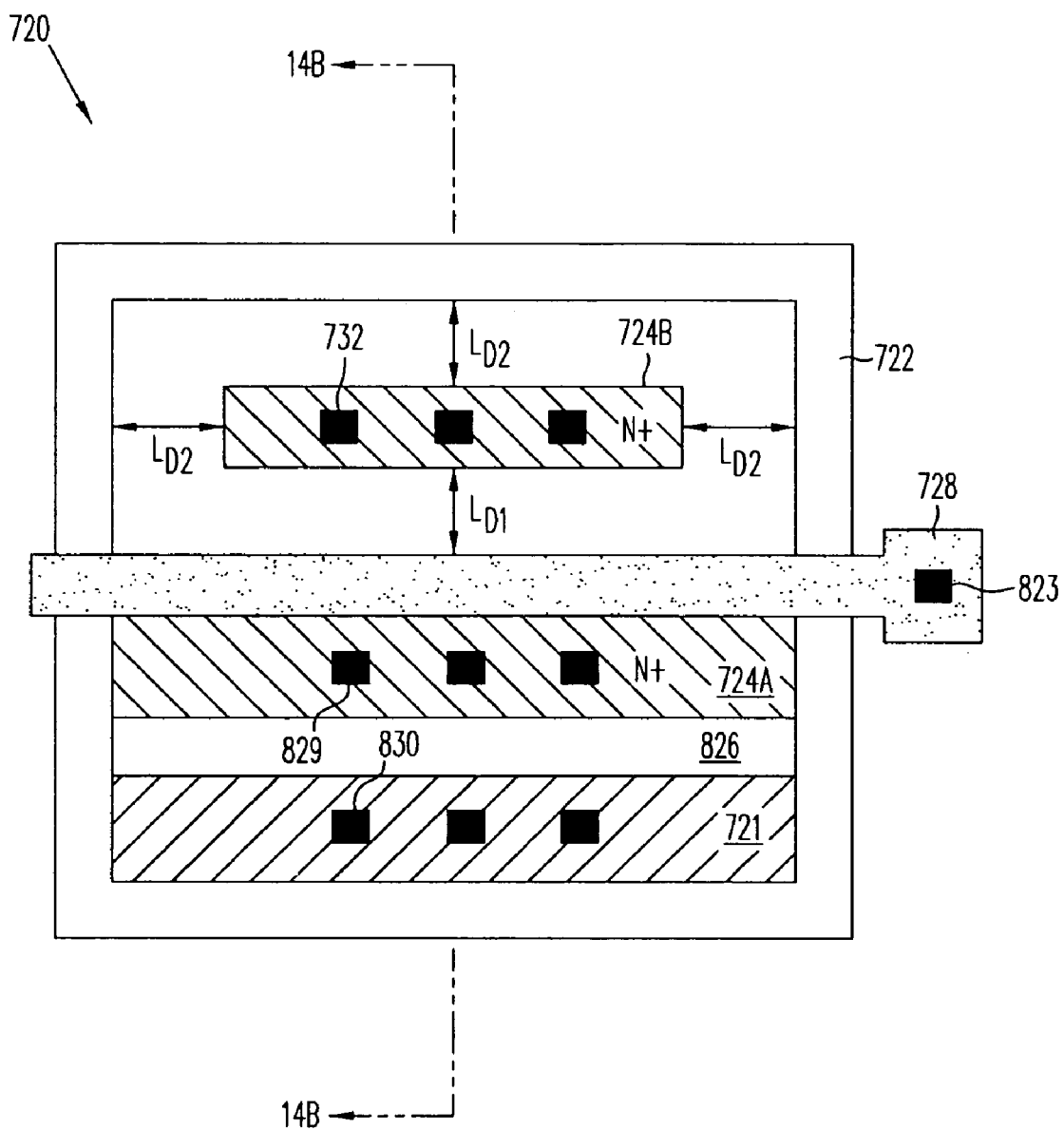

FIG. 15B is a plan view of NMOS 720, shown in FIG. 14B, with trench 722 in the form of a ring enclosing P+ contact region 721 and a well contact 830, N+ source region 724A and a source contact 829, N+ drain region 724B and a drain contact 732, polysilicon gate 728 with a gate contact 823. As shown, N+ source region 724A abuts gate 728. (The source extension 725A formed by the sidewall spacer 727 is not shown in FIG. 15B.) Source region 724A is spaced apart from P+ contact region 721 by a gap 826. N+ drain region 724B is spaced from gate 728 by a mask-defined distance $L_{D1}$, determined by the relative positioning of the N+ and polysilicon gate masks, and from trench 722 by a distance $L_{D2}$. FIG. 14B is taken at cross section 14B-14B, shown in FIG. 15B.

Figure 15C:
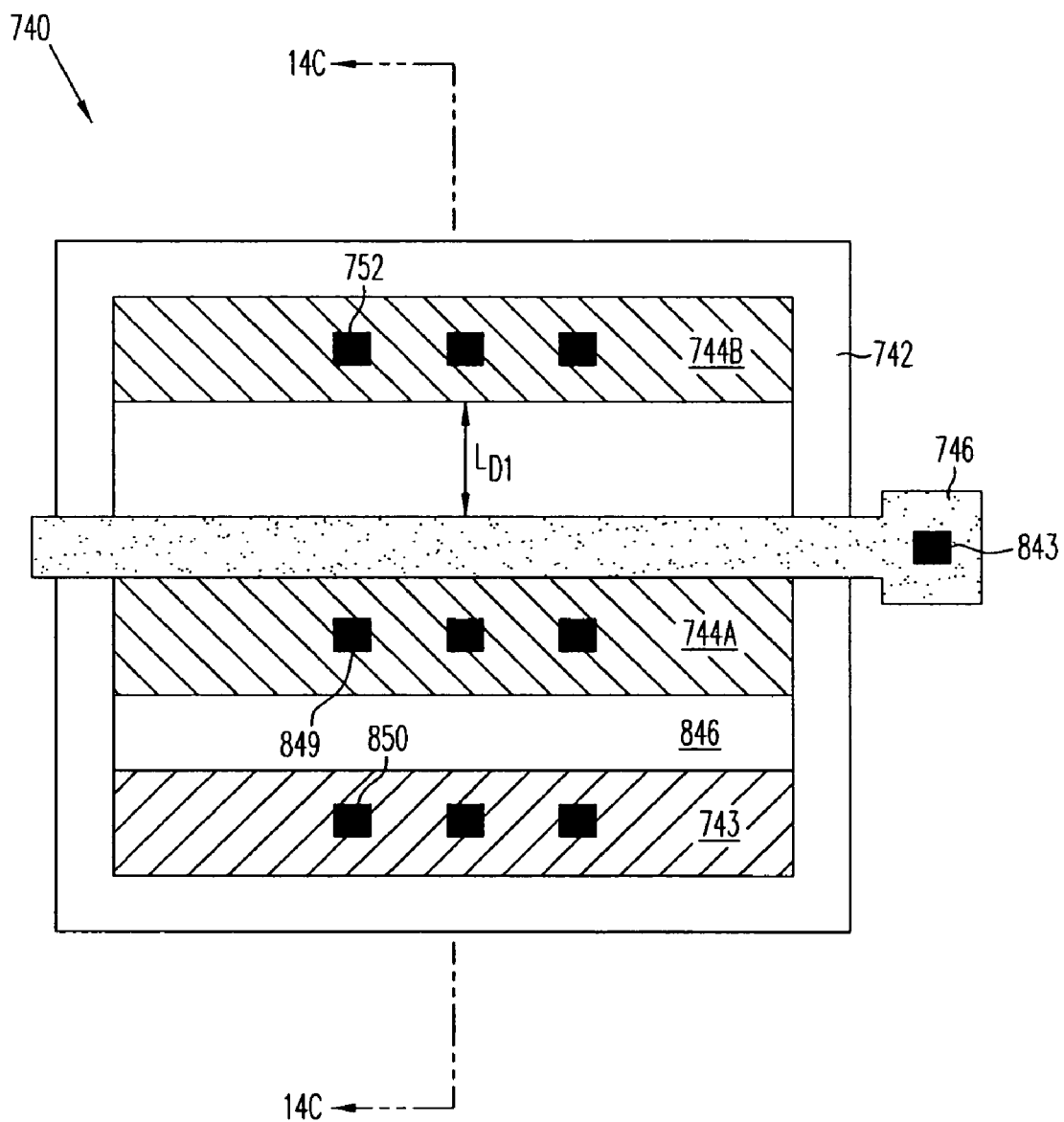

FIG. 15C is a plan view of NMOS 740, shown in FIG. 14C, with trench 742 in the form of a ring enclosing P+ contact region 743 and a well contact 850, N+ source region 744A and a source contact 849, N+ drain region 744B and a drain contact 752, polysilicon gate 746 with a gate contact 843. As shown, N+ source region 744A abuts gate 746. (The source extension 745A formed by the sidewall spacer 748 is not shown in FIG. 15C.) Source region 744A is spaced apart from P+ contact region 743 by the width of a gap 846. N+ drain region 744, is spaced from gate 746 by a mask-defined distance $L_{D1}$, determined by the relative positioning of the N+ and polysilicon gate masks, and abuts trench 742 on the remaining three sides. FIG. 14C is taken at cross section 14C-14C, shown in FIG. 15C.

Figure 15D:
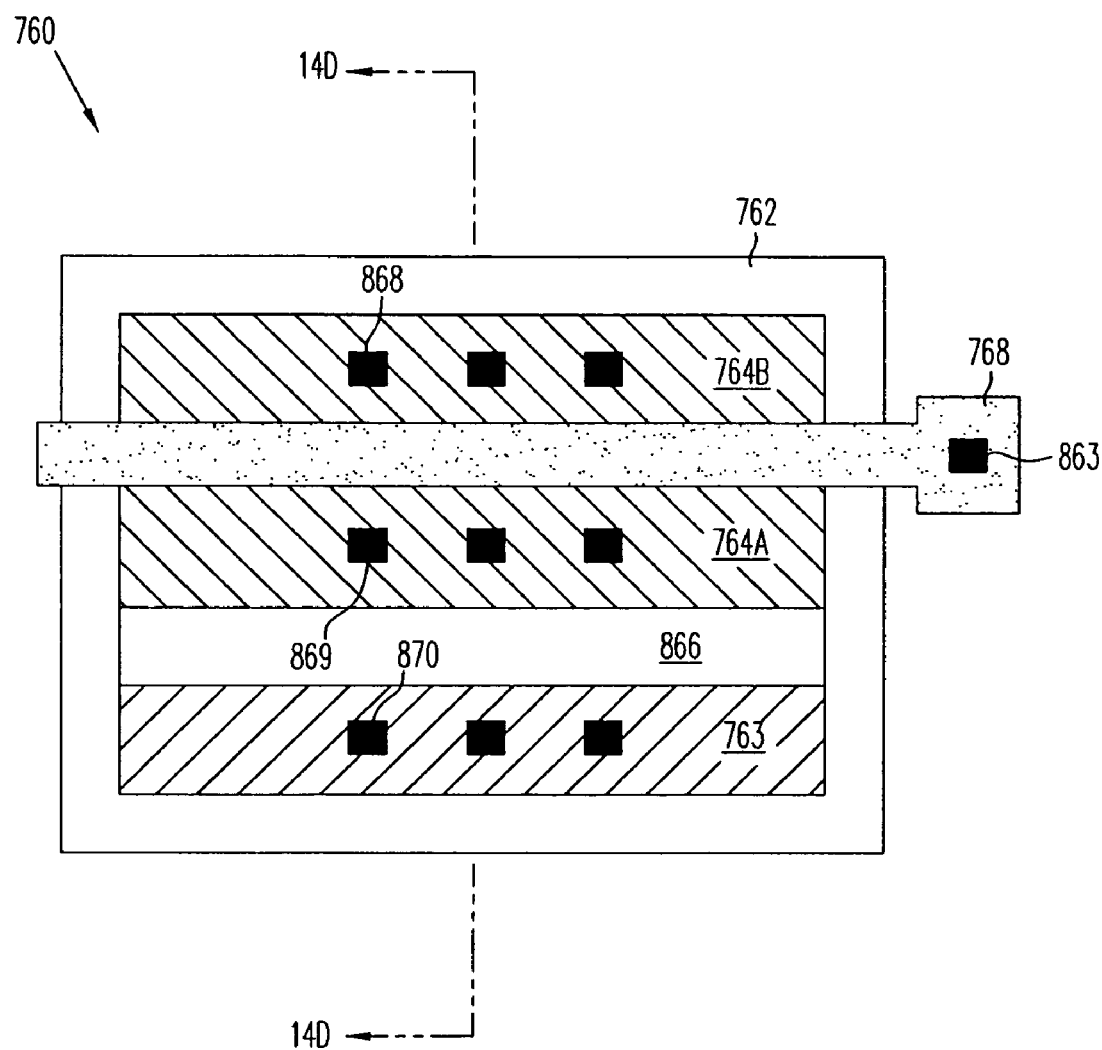

FIG. 15D is a plan view of NMOS 760, shown in FIG. 14D with trench 762 in the form of a ring enclosing P+ contact region 763 and a well contact 870, N+ source region 764A and a source contact 869, N+ drain region 764B and a drain contact 868, polysilicon gate 768 with a gate contact 863. As shown, N+ source region 764A abuts gate 768. (The source extension 765A formed by the sidewall spacer is not shown in FIG. 15D.) Source region 764A is spaced apart from P+ contact region 763 by a gap 866. N+drain region 764B abuts gate 768. (The drain extension 765B formed by the sidewall spacer 767 is not shown in FIG. 15D.) N+ drain region 764B also abuts trench 762 on its remaining three sides. FIG. 14D is taken at cross section 14D-14D, shown in FIG. 15D.

Figure 15E:
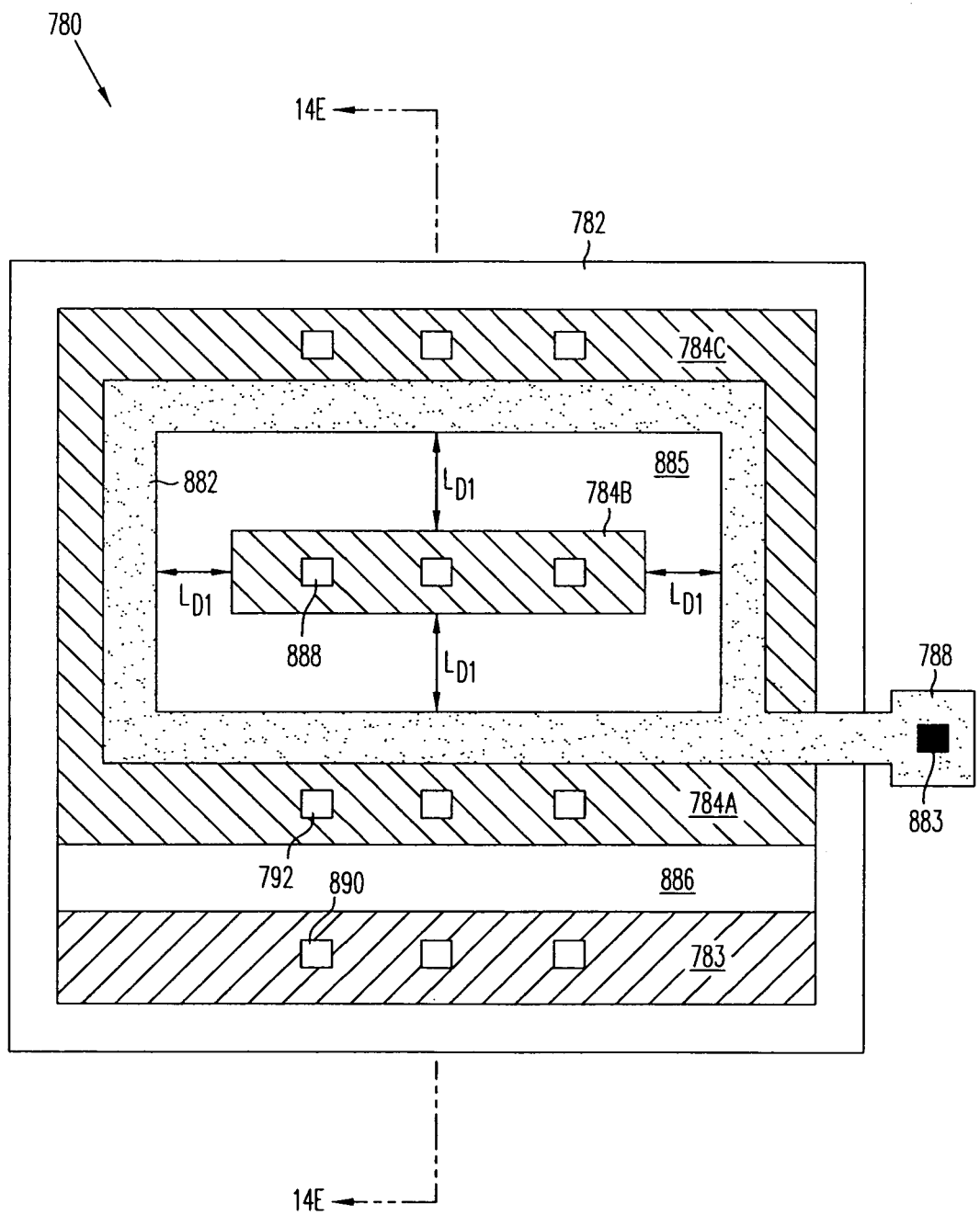

FIG. 15E is a plan view of NMOS 780, shown in FIG. 14E, with trench 782 in the form of a ring enclosing P+ contact region 783 and a well contact 890, a ring-shaped N+source region 784A,784C and source contacts 792, an enclosed N+ drain region 784B and a drain contact 888, polysilicon gate 788 in the form of a ring 882 with a polysilicon gate contact 883. As shown, N+ source region 784A,784C surrounds and abuts gate ring 882. (The source extensions 785A,785D formed by the sidewall spacers are not shown in FIG. 15E.) Source region 784A is spaced apart from P+ contact region 783 by a gap 886. N+ drain region 784B is surrounded by and spaced from gate 788 by a mask-defined distance $L_{D1}$, determined by the relative positioning of the N+ and polysilicon gate masks. FIG. 14E is taken at cross section 14E-14E, shown in FIG. 15E.

Type-V Isolated BCD Process

Another preferred embodiment of the present invention incorporates a deep trench with an insulating sidewall and a conductive center portion extending from the silicon surface to the bottom of the trench, where the conductive center electrically contacts the NI region beneath the bottom of the trench. The insulating sidewall may comprise silicon dioxide, silicon nitride, oxy-nitride film or sandwich, or any other non-conducting dielectric. The thickness of the sidewall may range from 100 Å to 3000 Å, depending on the trench width. The conductive material is preferably in-situ doped polysilicon, but may alternatively comprise other conductive materials such as a high-temperature or refractory metal.

Compared to the Type-II isolation, described above, the addition of a conductive material embedded in the isolation trenches of Type-V isolation offers several advantages. First, the vertical resistance from the top surface of the substrate to the NI and DN regions can be greatly reduced. Moreover, electrical contact from the top surface of the substrate to the NI and DN regions can be made via the isolation trench, obviating the need for an N-type well to connect the NI and DN layers to the substrate surface. This reduces the surface area required for the vertical DN contacts, which allows more contacts to be used without an unacceptable increase in the total chip area.

Figure 16A:
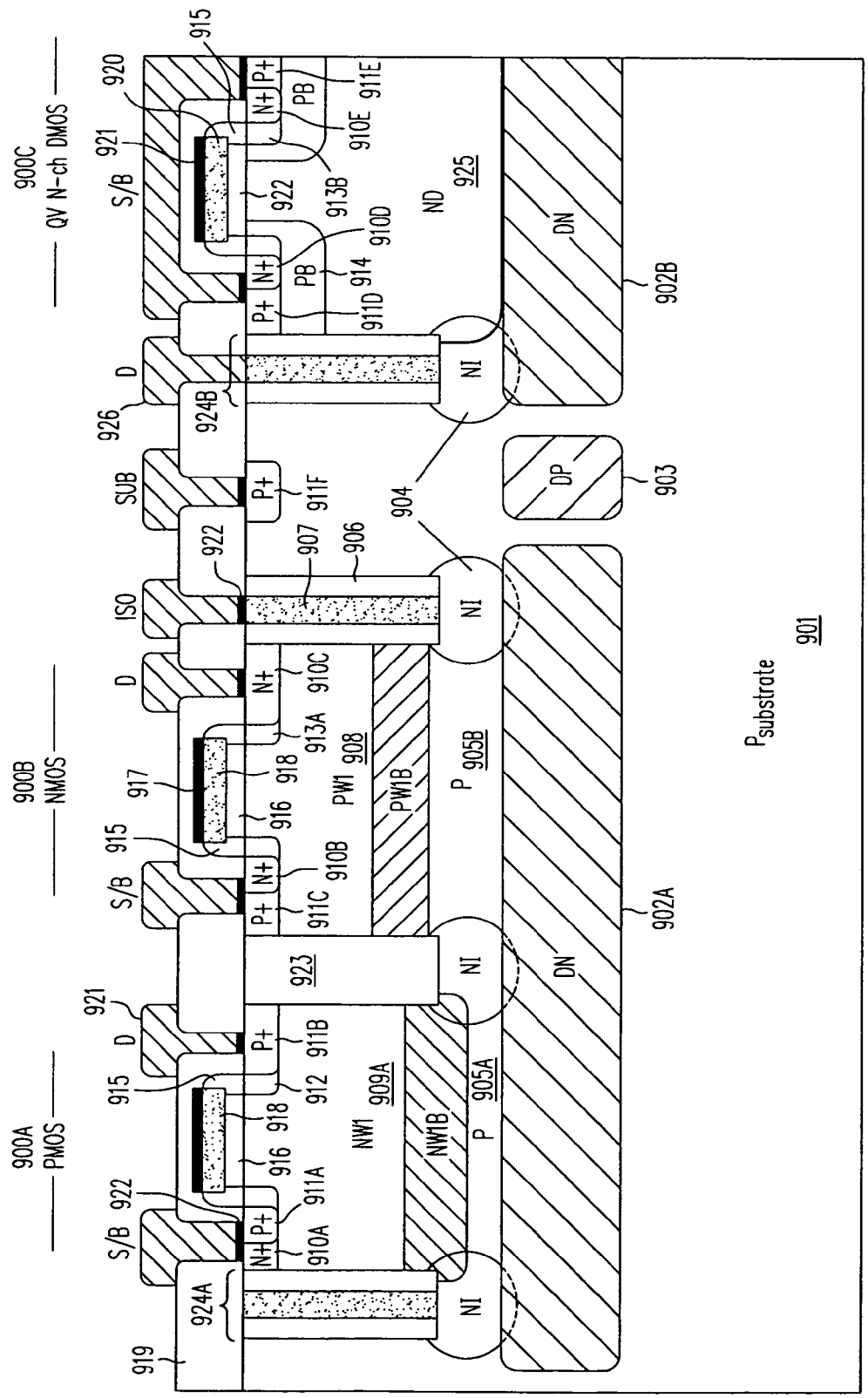
FIG. 16A is a cross-sectional view of a CMOS pair and a DMOS isolated using an alternative type of isolation according to the invention.

FIG. 16A illustrates a cross-sectional view of a floating CMOS 900A,900B and a quasi-vertical N-channel DMOS 900C isolated using Type V isolation, fabricated in a common P-type substrate 901. The PMOS 900A and NMOS 900B are enclosed by a Type V isolation structure comprising a deep implanted DN floor isolation region 902A, a trench 924A comprising a dielectric layer 906 and a trench conductive layer 907, and NI regions 904 located at the bottom of the trench 924A. Within this isolation structure, an N-type well 909A is used to form the body region of PMOS 900A. The N-type well 909A may also used to contact the DN floor isolation region 902A, either directly by overlapping the DN region 902A, or indirectly by contacting and overlapping the NI region 904. However, contact between N-well 909A and NI 904 is not required in Type-V isolation since the NI and DN layers are contacted through the trench conductive region 907. In a preferred embodiment, the doping profile of the N-type well 909A is non-monotonic, comprising at least a top portion NW1 and a deeper portion NW1B and preferably formed using a phosphorus chain implant of differing energies and doses. In the event that the bottom of N-type well 909A does not overlap onto DN region 902A, an intervening P-type layer 905A will result. P-type layer 905A is floating and has no substantial electrical effect on the operation of CMOS 900A,900B.

Also within the isolation region bounded by DN floor isolation 902A, a P-type well 908 is used to form the body region of NMOS 900B. In a preferred embodiment, the doping profile P-type well 908 is non-monotonic comprising at least a top portion PW1 and a deeper portion PW1B and preferably formed using a boron chain implant of differing energies and doses. Should P-type well 908 not overlap onto DN isolation floor layer 902A, an intervening P-type layer 905B will result. Since layer 905B is also P-type, it is electrically shorted to the potential of P-type well 908.

N-type well 909A and P-type well 908 may be placed adjacent each other with no intervening trench isolation. However, in a preferred embodiment, N-well 909A and P-well 908 are separated by a dielectric-filled trench 923, which greatly reduces the susceptibility to latch-up. By using only dielectric fill for trench 923, the spacing between PMOS 900A and NMOS 900B may be smaller than if a dielectric and conductive filled trench such as trench 924A was used. In another embodiment, the intervening trench between N-well 909A and P-well 908 may be formed with a conductive layer inside, similar to trench 924A, which requires more space but provides an additional contact to DN floor isolation region 902A.

Within N-type well 909A, PMOS 900A comprises a P+ source region 9111A and a drain region 911B, a sidewall spacer 915 and an underlying LDD 912, a polysilicon gate 918 with silicide 917 located atop first gate oxide layer 916, where the first gate oxide layer 916 has a thickness $x_{ox1}$. Within P-type well 908, NMOS 900B comprises an N+ source region 910A and an N+ drain region 910C, sidewall spacer 915 and underlying LDD 913A, a polysilicon gate 918 with silicide 917, where the gate 918 is also located atop first gate oxide layer 916. The thickness of gate oxide layer 916, $x_{ox1}$, may be optimized for the best overall performance and voltage capability for both PMOS 900A and NMOS 900B.

The polysilicon layer used to form gate 918 may comprise N-type doping for both NMOS 900B and PMOS 900A, or alternatively the PMOS 900A may comprise P-type doped polysilicon.

Electrical connection to the CMOS devices 900A,900B is facilitated through contact openings etched through an ILD layer 919 with a metal layer 921 and barrier metal layer 922. Contact to the DN floor region 902A is made by an ISO electrode, trench conductive layer 907, and NI region 904.

The quasi-vertical N-channel transistor 900C includes a Type V isolated pocket comprising a DN floor isolation region 902B, NI region 904, and a trench 924B containing a dielectric layer 906 and a conductor 907. An N-Drift (ND) region 925 extends from a P-type body region 914 is contacted through P+ contact regions 911D and 911E. N+ source regions 910D and 911E are preferably shorted to the P+ contact regions 911D and 911E, as shown. A gate 920 comprising polysilicon layer and optional silicide layer 921, sits atop a gate oxide layer 922. Source extension regions 913B, a consequence of oxide sidewall spacers 915, may be eliminated if the gate fabrication steps for transistor 900C are not shared with the gate fabrication steps for PMOS 900A and NMOS 900B. In the on-state, a channel region is formed across body regions 914 beneath gate oxide layer 922. N-Drift region 925 connects the channel region to DN floor isolation region 902B, which serves as a buried drain. The conductive layer in trench 924B provides electrical contact between a drain electrode 926 and NI region 904 and through NI region 904 to DN floor isolation region 902B.

The cross-sectional view of transistor 900C illustrates a single cell having two source regions 910D,910E and two body regions 914 sharing a common drain (DN floor isolation region 902B). An actual transistor may comprise many cells or stripes in a many cell or multi-stripe device.

Figure 16B:
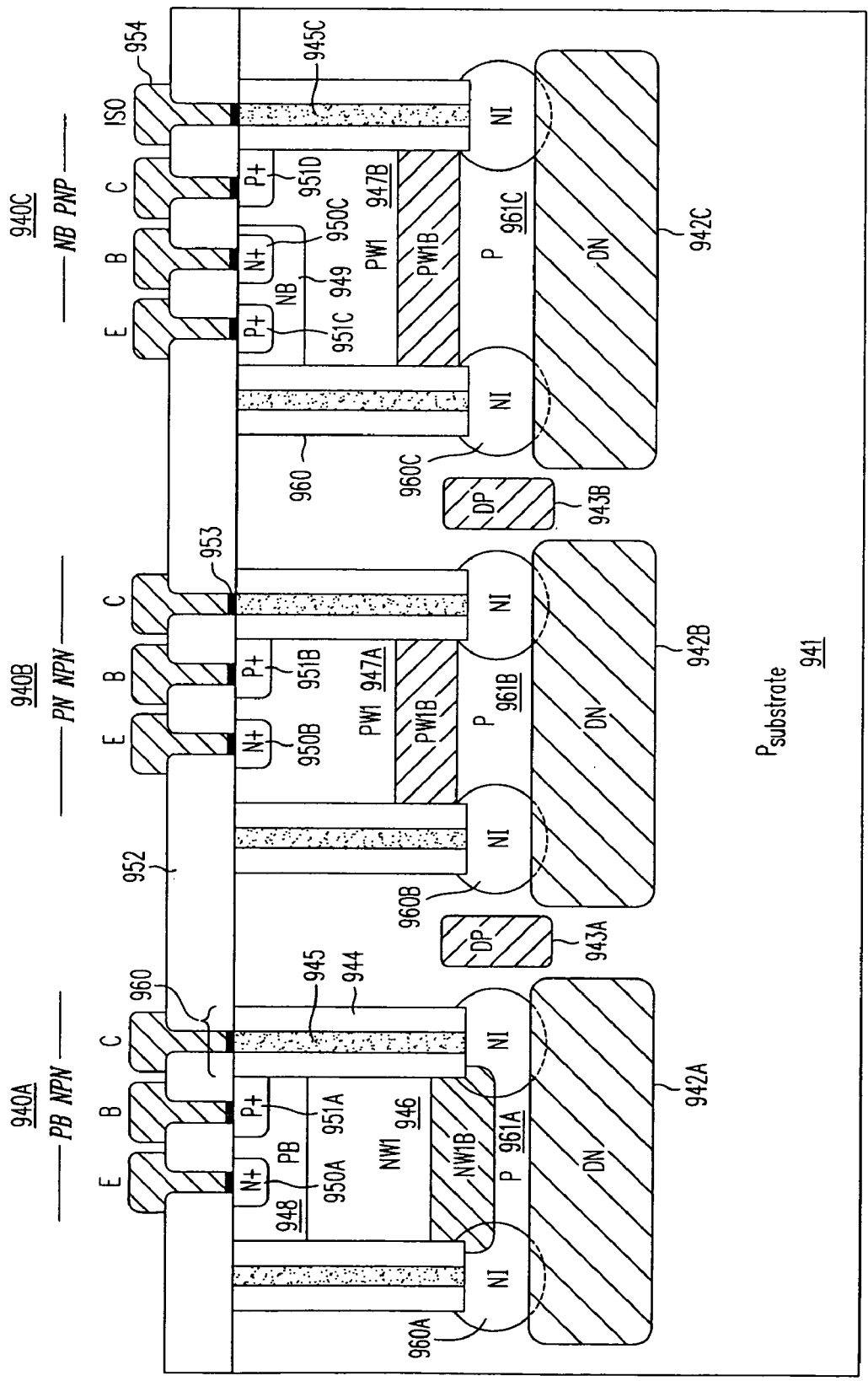
FIG. 16B is a cross-sectional view of two NPNs and a PNP isolated using the alternative type of isolation.

FIG. 16B shows a cross-sectional view of three bipolar transistors, fabricated in a P-type substrate 941 and isolated using Type V isolation. These bipolar devices, and their component Type V isolation structures, wells, implants, shallow implants and interconnections can be fabricated monolithically and simultaneously, in the same substrate.

An NPN 940A uses a dedicated PB base implant 948, while NPN 940B utilizes as its base a P-type well 947A, which is fabricated in the same process step as P-well 908 in NMOS 900A. In NPN 940A, a DN floor isolation region 942A, NI regions 960A and first N-type well 946 electrically form the collector, shorted to one another through the NI regions 960A and a conductor 945 within a trench 960. A trench dielectric layer 944 isolates conductor 945 from substrate 941.

FIG. 16B shows an intervening P-type floating layer 961A between N-type well 946 and DN floor isolation region 942A. P-type floating layer may preferably be eliminated by overlapping the bottom of N-type well 946 onto DN floor isolation region 942A. In a preferred embodiment, N-type well 946 contains a non-monotonic doping profile, having a surface portion NW1 having a lighter doping concentration than the deeper buried NW1B portion. The surface portion NW1 reduces depletion spreading in PB base 948, thereby increasing the Early voltage VA of NPN 940A, while the deeper portion NW1B of N-type well 946, in combination with the DN layer 942A, helps to reduce collector resistance. The collector resistance is higher if N-type well 946 does not overlap onto DN region 942A. In a preferred embodiment, the doping profile of the first N-type well 946 is formed using a phosphorus chain implant of differing energies and doses. Top-side collector contact is facilitated through the conductive portion 945 of trench 960; contact to the base is achieved through a shallow P+ contact region 951A; and an N+ region 950A forms the emitter. The Type V isolation structure—which includes trench 960 with dielectric layer 944, and conductor 945 contacting the underlying NI region 960A, and DN floor isolation region 942A—is also part of the collector (except for dielectric layer 944).

Contact to the emitter, base and collector of NP 940A is achieved through a metal layer 954 and a barrier metal layer 953 extending through contact windows formed in an ILD layer 952. A shallow trench isolation (not shown) may be used to separate N+ region 950A (the emitter) from P+ region 951A, provided that the shallow trench is not deeper than PB base implant 948. A polysilicon emitter (not shown) can be substituted for N+region 950A as the emitter.

NPN 940B is similar to NPN 940A, described above, except that a P-well 947A replaces PB base implant 948 as the base of the NPN, and there is no N-well comparable to N-type well 946 included between the base (P-well 947A) and DN floor isolation region 942B.

P-type well 947A may comprise the same doping profile as P-well optimized for integrating a submicron NMOS, e.g., P-type well 908 in NMOS 900B (FIG. 16A). Using this approach, the performance of NPN 940B may be compromised, as compared to NPN 940A, with the tradeoffs adversely impacting current gain, breakdown voltage, and frequency response. In contrast, with its own dedicated P-type base implant 948, the performance of NPN 940A can be independently optimized with minimal compromises necessary.

PNP 940C is also fabricated in P-type substrate 941, using a dedicated NB base 949. A P+ region 951C forms the emitter of PNP 940C. A P-type well 947B forms the collector and preferably has a non-monotonic dopant profile comprising at least a top portion PW1 and a deeper portion PW1B, preferably formed using a boron chain implant of differing energies and doses. An intervening P-type layer 961C between P-type well 947B and a DN floor isolation region 942C may advantageously provide a higher breakdown voltage between the collector and the Type-V isolation structure. However, P-type layer 961C may be very thin and may not even exist if the bottom of the deep portion PW1B of P-type well 947B overlaps onto DN floor isolation region 942C. In a preferred embodiment, the collector and isolation will be connected together by a metallization layer, such that they have the same electrical potential. The top portion PW1 of P-well 947B reduces depletion spreading in NB base 949, thereby increasing the Early voltage of PNP 940C, while the deep portion PW1B of P-type well 947B helps reduce collector resistance.

A polysilicon emitter (not shown) can be substituted for P+ region 95 IC as the emitter of PNP 940C.

Top-side contact to the collector is facilitated through a P+ contact region 951D, contact to the DN floor isolation region 942C is provided by a trench conductor 945C, and contact to the base is achieved through an N+ contact region 950C. P+ region 951C forms the emitter. The Type-V isolation structure includes a trench 960, including a conductor 945 and a dielectric layer 944, an underlying NI region 960C, and DN isolation region 942C, which together circumscribe and enclose the entire PNP 940C. Contact to the emitter, base and collector of PNP 940C is achieved through a metal layer 954 and a barrier metal layer 953 extending through contact windows formed in an ILD layer 952.

Deep implanted DP regions 943A and 943B may be present between DN floor isolation regions 942A, 942B, and 942C to suppress leakage and allow closer spacing.

Combined Inventive Matter

While specific embodiments of this invention have been described, it should be understood that these embodiments are illustrative only, and not limiting. Many additional or alternative embodiments in accordance with the broad principles of this invention will be apparent to those of skill in the art.

For example, N-type wells used in any device may be spaced apart from the isolation trench, abut the isolation trench on either side, or be surrounded by the trench on both sides. Any device employing Type II isolation shown may be adapted to Type V isolation. N-type and P-type wells may include an intervening trench or abut one another. Isolated and non-isolated devices may be mixed in the same integrated circuit. Devices may use a relatively deep trench to implement Type II or Type-V isolation, but may also incorporate shallow trench isolation, especially in high-density CMOS areas used for digital circuitry. Any CMOS transistor employing a sidewall-spacer-defined drift (LDD) region can be modified to include a mask-defined drift region.

We claim:

1. An isolated diode comprising:
   a semiconductor substrate of a first conductivity type, the substrate not comprising an epitaxial layer;
   a floor isolation region of a second conductivity type opposite to the first conductivity type submerged in the substrate;
   an annular filled trench extending downward from a surface of the substrate to a depth that is less than a top of the floor isolation region, the filled trench comprising a dielectric material;
   an annular sidewall region of the second conductivity type extending from a bottom of the dielectric-filled trench at least to the top of the floor isolation region, wherein the floor isolation region, filled trench and sidewall region together enclose an isolated pocket of the substrate;
   an anode region of the first conductivity type disposed in the isolated pocket, the anode region enclosing an anode contact region of the first conductivity type and an emitter region of the second conductivity type;
   an anode electrode overlying the surface of the substrate, and being in electrical contact with the anode contact region and the emitter region; and
   a cathode electrode overlying the surface of the substrate, and in electrical contact with the sidewall region and the floor isolation region.

2. The isolated diode of claim 1 comprising a cathode well of the second conductivity type extending downward from the surface of the substrate and overlapping the sidewall region, the cathode well providing electrical contact between the cathode electrode and the sidewall region.

3. The isolated diode of claim 1 wherein the filled trench further comprises a conductive material, the conductive material providing electrical contact between the cathode electrode and the sidewall region.

4. The isolated diode of claim 1 wherein anode well comprises at least an upper portion and a lower portion, the upper portion being located above the lower portion, the lower portion having a maximum doping concentration greater than a maximum doping concentration of the upper portion.

5. The isolated diode of claim 2 wherein the cathode well comprises at least an upper portion and a lower portion, the upper portion being located above the lower portion, the lower portion having a maximum doping concentration greater than a maximum doping concentration of the upper portion.

6. The isolated diode of claim 1 further comprising a drift region of the second conductivity type disposed between the anode well and the filled trench.

7. The isolated diode of claim 6 further comprising a second drift region adjacent the filled trench outside the isolated pocket.

8. The isolated diode of claim 1 comprising a substrate contact region of the first conductivity type located outside the isolated pocket, the substrate contact region having a doping concentration greater than a doping concentration of the substrate.

9. The isolated diode of claim 1 comprising a submerged layer of the first conductivity type outside the isolated pocket, the submerged layer having a doping concentration greater than a doping concentration of the substrate.

10. The isolated diode of claim 1 wherein the anode contact region and the anode well are P-type conductivity and are comprised in an anode of the diode and the floor isolation region and the annular sidewall region are N-type conductivity and are comprised in a cathode of the diode.

11. An isolated diode comprising:
    a semiconductor substrate of a first conductivity type, a series of filled trenches formed in the substrate, each of the filled trenches comprising dielectric material and extending downward from a surface of the substrate, the series of trenches comprising at least a first, a second and a third trench, a first mesa being formed between the first and second trenches, a second mesa being formed between the second and third trenches;
    a floor isolation region of a second conductivity type opposite to the first conductivity type submerged in the substrate;
    a first sidewall region of the second conductivity type extending from a bottom of the first trench at least to the floor isolation region;
    a second sidewall region of the second conductivity type extending from a bottom of the second trench at least to the floor isolation region;
    a third sidewall region of the second conductivity type extending from a bottom of the third trench at least to the floor isolation region;
    a first terminal region of the first conductivity type located in the first mesa, the first terminal region having a doping concentration greater than a doping concentration of the substrate;
    a second terminal region of the second conductivity type located in the second mesa;
    a first electrode overlying the surface of the substrate and being in electrical contact with the first terminal region; and
    a second electrode overlying the surface of the substrate and being electrical contact with the second terminal region.

12. The isolated diode of claim 11 wherein the first terminal region comprises at least an upper portion and a lower portion, the upper portion being located above the lower portion, the lower portion having a maximum doping concentration greater than a maximum doping concentration of the upper portion.

13. The isolated diode of claim 11 wherein the second terminal region comprises at least an upper portion and a lower portion, the upper portion being located above the lower portion, the lower portion having a maximum doping concentration greater than a maximum doping concentration of the upper portion.

14. The isolated diode of claim 11 wherein the second terminal region overlaps at least one of the second and third sidewall regions.

15. The isolated diode of claim 11 comprising an external drift region of the second conductivity type located adjacent the surface of the substrate and a side of the third trench opposite to the second mesa.

16. The isolated diode of claim 15 wherein the second electrode is in electrical contact with the external drift region.

17. The isolated diode of claim 16 comprising a substrate contact region of the first conductivity type, the substrate contact region being located outside of the series of filled trenches and having a doping concentration greater than a doping concentration of the substrate.

18. The isolated diode of claim 17, comprising a submerged layer of the first conductivity type disposed outside of the series of filled trenches and having, a doping concentration greater than the doping concentration of the substrate.

19. The isolated diode of claim 11 wherein the first terminal region is P-type conductivity and is comprised in an anode of the diode and the floor isolation region and the sidewall region are N-type conductivity and are comprised in a cathode of the diode.

20. The isolated diode of claim 11 wherein at least one of the filled trenches further comprises a conductive material.

21. The isolated diode of claim 20 wherein the conductive material in at least one of the filled trenches is in electrical contact with the sidewall region.

22. An isolated diode comprising:
a semiconductor substrate of a first conductivity type;
a floor isolation region of a second conductivity type opposite to the first conductivity type submerged in the substrate;
at least two filled trenches formed in the substrate, each of the filled trenches comprising a dielectric material and a conductive material and extending downward from a surface of the substrate to a depth less than a top of the floor isolation region;
a first sidewall region of the second conductivity type extending from a bottom of a first trench at least to the top of the floor isolation region;
a second sidewall region of the second conductivity type extending from a bottom of a second trench at least to the top of the floor isolation region; and
a cathode well region of the first conductivity type located in a first mesa formed between the first and second trenches.

23. The isolated diode of claim 22 comprising:
a first electrode overlying the surface of the substrate and being in electrical contact with the cathode well region; and
a second electrode overlying the surface of the substrate and being electrical contact with the conductive material, sidewall region, and floor isolation region.

* * * * *